United States Patent

Horita et al.

Patent Number: 5,932,912
Date of Patent: Aug. 3, 1999

[54] SEMICONDUCTOR DEVICE HAVING LDD STRUCTURE WITH A RECESS IN THE SOURCE/DRAIN REGION WHICH IS FORMED DURING THE REMOVAL OF A DAMAGED LAYER

[75] Inventors: Katsuyuki Horita; Takashi Kuroi; Yoshinori Okumura, all of Tokyo, Japan

[73] Assignee: Mitsubishi Denki Kabushiki Kaisha, Tokyo, Japan

[21] Appl. No.: 08/946,390

[22] Filed: Oct. 7, 1997

[30] Foreign Application Priority Data

Apr. 1, 1997 [JP] Japan .................................. P9-082828

[51] Int. Cl.⁶ ............................. H01L 29/76; H01L 29/06
[52] U.S. Cl. ......................... 257/336; 257/344; 257/408; 257/618
[58] Field of Search .................................... 257/336, 344, 257/408; 438/620, 666, 589, 231, 228, 232, 621

[56] References Cited

U.S. PATENT DOCUMENTS 5,319,231   6/1994   Yamazaki et al. ...................... 257/344
5,554,544   9/1996   Hsu ........................................ 257/344
5,585,303   12/1996  Hong et al. ............................ 438/397
5,640,035   6/1997   Sudo et al. ............................. 257/336

FOREIGN PATENT DOCUMENTS 358141570   8/1983   Japan ..................................... 438/363
358168277   10/1983  Japan ..................................... 257/621
402000312   1/1990   Japan ..................................... 438/363
402299271   12/1990  Japan ..................................... 257/344
408236760   2/1995   Japan ..................................... 257/336

Primary Examiner—Tom Thomas
Assistant Examiner—William Hughes
Attorney, Agent, or Firm—McDermott, Will & Emery

[57] ABSTRACT

To obtain a semiconductor device which prevents an increase in the resistance of a source/drain region; which operates fast and stably; and which provides a high manufacturing yield, and to obtain a method of manufacturing the semiconductor device. A recess 8 is formed on a first low impurity-concentration region 5 with the exception of the area immediately below side wall insulating material 6y, and a layer damaged as a result of formation of the side wall insulating material 6y is removed. Further, a second low impurity-concentration region 10 is formed below the recess 8.

20 Claims, 29 Drawing Sheets

1: SEMICONDUCTOR SUBSTRATE
3: INSULATING LAYER (OR THE FIRST INSULATING LAYER)
4y: GATE ELECTRODE
5: FIRST LOW IMPURITY-CONCENTRATION REGION
6y: SIDE WALL INSULATING MATERIAL
8: RECESS (OR THE SECOND RECESS)
10: SECOND LOW IMPURITY-CONCENTRATION REGION

1: SEMICONDUCTOR SUBSTRATE
3: INSULATING LAYER (OR THE FIRST INSULATING LAYER)
4y: GATE ELECTRODE
5: FIRST LOW IMPURITY-CONCENTRATION REGION
6y: SIDE WALL INSULATING MATERIAL
8: RECESS (OR THE SECOND RECESS)
10: SECOND LOW IMPURITY-CONCENTRATION REGION

6: SECOND INSULATING LAYER

7: DAMAGED LAYER

11: HIGH IMPURITY-CONCENTRATION REGION

20: THIRD INSULATING LAYER
21, 25: HOLE
90: CONDUCTOR ROUTING
26: ELECTRODE

41: HIGH IMPURITY-CONCENTRATION REGION

51: DAMAGED LAYER

62: FIRST RECESS
63: IMPURITY REGION

61: DAMAGED LAYER

FIG. 62 (A) PRIOR ART
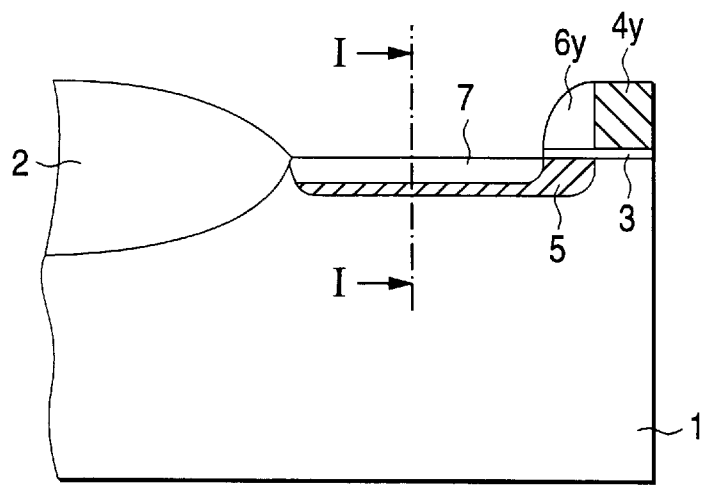
FIG. 62 (B) PRIOR ART
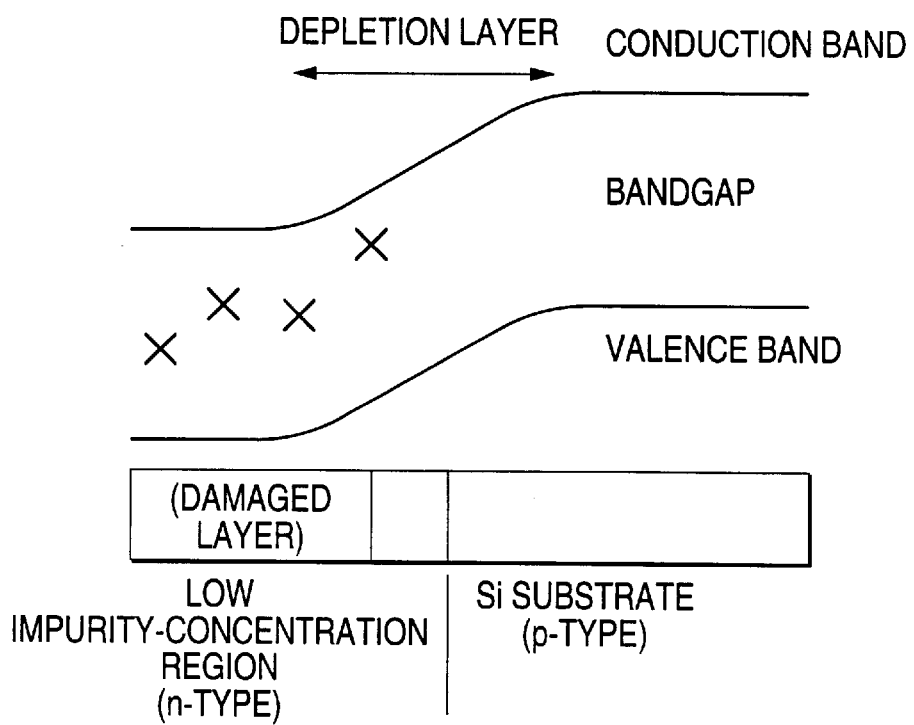

5,932,912

SEMICONDUCTOR DEVICE HAVING LDD STRUCTURE WITH A RECESS IN THE SOURCE/DRAIN REGION WHICH IS FORMED DURING THE REMOVAL OF A DAMAGED LAYER

BACKGROUND OF THE INVENTION

1. Field of the Invention

The present invention relates to a semiconductor device and a method of manufacturing it and, more particularly, a transistor from which a damaged layer formed in a source/drain region during the course of processing has been removed.

2. Description of the prior art

A source/drain region of a transistor to be incorporated into DRAM (Dynamic Random Access Memory) and SRAM (Static Random Access Memory) is formed at a very shallow depth as a semiconductor device is integrated higher.

FIG. 61 is a cross-sectional view showing an existing transistor whose source/drain region is formed from a region contains impurities in small concentrations (hereinafter referred to as a low impurity-concentration region). In the drawing, reference numeral 1 designates a silicon substrate; 2 designates an isolation field oxide formed on the surface of the silicon substrate; 3 designates a gate oxide film formed on the principal surface of the silicon substrate; 4y designates a gate electrode formed on the gate oxide film 3; and 5 designates a source/drain region which is a low impurity-concentration region formed on the surface of the silicon substrate 1 while a channel region (not shown) is sandwiched between the surface of the substrate and the gate electrode 4y to be used as a mask by ion implantation. Side wall insulating material 6y is formed on each side of the gate electrode by RIE (Reactive Ion Etching). As a result, a damaged layer 7 is formed on the source/drain region 5 (which will be hereinafter often referred to as a low impurity-concentration region) by RIE with the exception of the area immediately below the side wall insulating material 6.

With the foregoing construction of the existing semiconductor device, when the transistor is turned on by application of an electric potential to the gate electrode, an electric current flows to the source/drain region. In contrast, the transistor is turned off in the absence of the electrical potential applied to the gate electrode, so that an electric current does not flow to the source/drain region.

To ensure high-speed and stable operation of the transistor incorporated into DRAM or SRAM, a region which is formed from n-type or p-type impurities on the surface of the silicon substrate is generally required to have superior conductivity, and superior junction characteristics must be accomplished between the impurity region and the silicon substrate having the conductivity opposite to that of the impurity region. However, the damaged layer that contains crystal imperfections or a deteriorated layer caused by RIE impairs the characteristics of the junction between the impurity region and the silicon substrate which serves as an insulator when reverse bias is applied.

FIGS. 62A and 62B are schematic representations showing a mechanism of how the damaged layer 7 causes a leakage current in the junction. In FIGS. 62A and 62B, the elements assigned the same reference numerals as those used in FIG. 61 denote the corresponding elements which are assigned the same reference numerals in FIG. 61. FIG. 62A is a cross-sectional view showing the left half of the existing transistor in FIG. 61 whose the source/drain region is formed from a low impurity-concentration region. In this drawing, the silicon substrate is of a p-type, and the source/drain region is of an n-type. FIG. 62B is a schematic diagram of an energy band taken across line I—I in FIG. 61A. In this drawing, x denotes crystal imperfections or deteriorated areas. As can be seen from this drawing, a depletion layer in which electrons or positive holes are not present exists between the p-type silicon substrate and the n-type source/drain region having a low concentration of impurities. By virtue of this depletion layer, in a normal state, electric conduction does not occur in the junction between the source/drain region and the silicon substrate, thereby preventing leakage current from arising in the junction. However, when the transistor is in operation or the capacitor of the DRAM memory cell stores electric charges, the depletion layer is increased so as to include crystal imperfections or deteriorated areas designated by x. As a result, the crystal imperfections or deteriorated areas cause leakage current in the junction between the source/drain region 5 and the silicon substrate 1.

As described above, the damaged layer 7 impairs the characteristics of the junction between the silicon substrate 1 and the source/drain region 5 which acts as an insulator when reverse bias is applied. In a MOS (Metal Oxide Semiconductor) device, the leakage current occurred in the junction increases, which in turn increases power consumption. Particularly, in a DRAM memory cell, the electric charges stored in the capacitor are discharged to the outside, thereby impairing the refreshing characteristics of the DRAM memory cell. In short, the damaged layer 7 causes an increase in the power consumption of the semiconductor device or instable operations of the same.

There is one method of solving the previously-described problems; namely, a method of removing the damaged layer 7 after the side wall insulating material 6y has been formed. FIG. 63 is a cross-sectional view similar to FIG. 61, but a recess 8 is formed by etching away the damaged layer 7 formed on the source/drain region 5 with the exception of the area immediately below the side wall insulating material 6y. In FIG. 63, the elements assigned the same reference numerals as those used in FIG. 61 denote the corresponding elements which are assigned the same reference numerals in FIG. 61. As a result of removal of the damaged layer 7 from the source/drain region 5, the superior characteristics of the junction between the silicon substrate 1 and the source/drain region 5 are obtained.

Explanations will be given of a LDD (Lightly Doped Drain transistor which bears at first glance a resemblance to but is completely different from the transistor in FIG. 61 whose source/drain region is formed from a low impurity-concentration region; and a difference between this LDD transistor and a transistor, in accordance with the present invention, whose source/drain region is formed from a low impurity-concentration region.

FIG. 64 is a cross-sectional view of an existing LDD transistor. In FIG. 64, the elements assigned the same reference numerals as those used in FIG. 61 denote the corresponding elements which are assigned the same reference numerals in FIG. 61. In addition to the elements shown in FIG. 61, a region 9 (which contains a high concentration of impurities and is the same in conductivity type as the low impurity-concentration region 5) is formed on the surface of the substrate 1 with the exception of the area immediately below the side wall insulating material 6y by ion implantation. The low impurity-concentration region 5 constitutes the source/drain region together with the region 9 containing a high concentration of impurities (which will be hereinafter referred to as a high impurity-concentration region). (1) Since this LDD transistor has the high impurity-concentration region 9, the depletion layer is hard to extend in the direction of the principal plane including the damaged layer. (2) The LDD transistor is used in circuitry which has a comparatively large tolerance on the leakage current. For these reason(1) (2), eventually, the presence of the damaged layer does not result in a serious problem. As described above, the LDD transistor is used as a logic device or a high-performance transistor for use as a peripheral circuit of DRAM. In contrast, the transistor, in accordance with the invention, whose source/drain region is formed from a low impurity-concentration region is primarily used as a low junction-leakage transistor to be incorporated into a DRAM memory cell. The summary of the relationship between the existing LDD transistor and the transistor in accordance with the present invention is presented in Table 1.

TABLE 1

|  | LDD Transistor (conventional) | Transistor of the present invention |
|---|---|---|
| Low impurity-concentration region | Present | Present |
| Formation of a side wall | Formed | Formed |
| Damages due to RIE | Occurred | Occurred |
| High impurity-concentration region | Present | None |
| Applications | High-performance transistors(e.g., a logic device, or a peripheral circuit of DRAM) | Low junction-leakage transistors (e.g., a DRAM memory cell) |

As described above, the LDD transistor and the transistor of the invention completely differ from each other in terms of applications and characteristics.

In a semiconductor device having the previously-described existing transistor whose source/drain region is formed from a low impurity-concentration region, the source/drain region 5 is usually formed at a depth as shallow as 1500 Å or less. If the damaged layer 7 is removed in the manner as shown in FIG. 63, the source/drain region becomes of high resistance as a result of the removal of the impurity region. Further, variations in the etch rate required for removal of the damaged layer 7 result in variations in the characteristics of the junction between the source/drain region 5 and the silicon substrate 1 or in the electrical resistance of the source/drain region 5. This, in turn, leads to a drop in the yield of the semiconductor device.

SUMMARY OF THE INVENTION

The present invention has been contrived to solve the drawbacks in the background art, and the first object of the present invention is to provide a semiconductor device which prevents an increase in the resistance of a source/drain region; which ensures high-speed and stable operations; and which provides a high manufacturing yield. Another object of the present invention is to provide a method of manufacturing the previously-described semiconductor device.

In accordance with a first aspect of the present invention, there is provided a semiconductor device comprising a gate electrode which is formed on the principal surface of a semiconductor substrate having a semiconductor region of a first conductivity type on which an insulating layer is formed; side wall insulating material formed on the side of the gate electrode; first low impurity-concentration regions of a second conductivity type which are formed on the principal surface of the semiconductor substrate while a channel region is formed between them; a recess which is formed on at least one of the first low impurity-concentration regions with the exception of the area immediately below the side wall insulating material in order to remove a damaged layer formed at the time of formation of the side wall insulating material; and a second low impurity-concentration region of the second conductivity type which is formed below the recess.

In accordance with a second aspect of the present invention, there is provided the semiconductor device, wherein the second low impurity-concentration region of the second conductivity type is formed in such a way that the inner edge of the second low impurity-concentration region substantially agrees with the outer edge of the side wall insulating material.

In accordance with a third aspect of the present invention, there is provided, the semiconductor device as defined in the first aspect, wherein the second low impurity-concentration region of the second conductivity type is formed so as to extend over the whole surface of the recess.

In accordance with a forth aspect of the present invention, there is provided, the semiconductor device as defined in the third aspect, wherein the second low impurity-concentration region of the second conductivity type is formed in such a way that the peak of concentration is formed at a position slightly deeper than the surface of the recess.

In accordance with a fifth aspect of the present invention, there is provided, the semiconductor device as defined in the first aspect, wherein the second low impurity-concentration region of the second conductivity type is formed deeper than the first low impurity-concentration region.

In accordance with a sixth aspect of the present invention, there is provided, the semiconductor device as defined in the first aspect, wherein the depth of the recess formed on the surface of at least one of the first low impurity-concentration regions is equal to or greater than the depth of the damaged layer formed at the time of formation of the side wall insulating material.

In accordance with a seventh aspect of the present invention, there is provided, the semiconductor device as defined in the first aspect, wherein the depth of the recess from the principal surface of the semiconductor substrate should be in the range from 0.03 $\mu$m to 0.1 $\mu$m.

In accordance with a eighth aspect of the present invention, there is provided, the semiconductor device as defined in the first aspect, further comprising a high impurity-concentration region of the second conductivity type having a higher concentration of impurities than that of the first low impurity-concentration regions each of which is formed at a shallow position closer to the principal surface of the semiconductor substrate in comparison with the second low impurity-concentration region.

In accordance with a ninth aspect of the present invention, there is provided, the semiconductor device as defined in the eighth aspect, wherein the high impurity-concentration region should be formed in such a way that the peak of concentration is formed at a position slightly deeper than the surface of the recess.

In accordance with a tenth aspect of the present invention, there is provided, the semiconductor device as defined in the first aspect, wherein the semiconductor device is formed in a well of the first conductivity type which is formed such that at least two peaks of impurity concentrations are formed in the depthwise direction, and the bottom of the second low impurity-concentration region is positioned at the valley between the adjacent two peaks.

In accordance with an eleventh aspect of the present invention, there is provided, a semiconductor device comprising:

a gate electrode which is formed on a part of the principal surface of a semiconductor substrate having a semiconductor region of a first conductivity type on which a first insulating layer is formed;

side wall insulating material which is formed from a second insulating layer on the side of the gate electrode;

a first low impurity-concentration region of a second conductivity type which is formed on the principal surface of the semiconductor substrate while a channel region is sandwiched between them;

a third insulating layer which is formed on each of the first low impurity-concentration regions and has a contact hole formed to such an extent as to reach the first low impurity-concentration region;

an electrode or conductor routing which is formed along the inside of the contact hole formed in the third insulating layer and is electrically connected to the first low impurity-concentration region;

wherein the first low impurity-concentration region comprises a first recess for removing a damaged layer formed at the time of formation of the contact hole, which is formed in the area where each of the first low impurity-concentration regions is connected to the electrode or conductor routing; and an impurity region of the second conductivity type which is formed below the first recess.

In accordance with a twelfth aspect of the present invention, there is provided, the semiconductor device as defined in the eleventh aspect, further comprising:

a second recess which is formed on the low impurity-concentration region of the first conductivity type with the exception of the area immediately below the side wall insulating material in order to remove a damaged layer formed at the time of formation of the side wall insulating material; and a second low impurity-concentration region of the second conductivity type formed below the second recess.

In accordance with a thirteenth aspect of the present invention, there is provided, a method of manufacturing a semiconductor device comprising the steps of:

forming a gate electrode on the principal surface of a semiconductor substrate having a semiconductor region of a first conductivity type on which a first insulating layer is formed;

forming first low impurity-concentration regions of a second conductivity type on the principal surface of the semiconductor substrate while a channel region is sandwiched between them;

forming a second insulating layer on the principal surface of the semiconductor substrate and the gate electrode;

forming side wall insulating material on the side of the gate electrode by reducing the thickness of the second insulating layer from top;

removing a damaged layer formed on the surface of at least one of the first low impurity-concentration regions at the time of formation of the side wall by creating a recess with the exception of the area immediately below the side wall insulating material; and forming a second low impurity-concentration region of the second conductivity type below the recess.

In accordance with a fourteenth aspect of the present invention, there is provided, the method of manufacturing a semiconductor device as defined in the eleventh aspect, wherein a high impurity-concentration region of the second conductivity type having a higher concentration of impurities than that of the first low impurity-concentration region is formed at a shallow depth closer to the principal surface of the semiconductor substrate in comparison with the second low impurity-concentration region.

In accordance with a fifteenth aspect of the present invention, there is provided, the method of manufacturing a semiconductor device as defined in the fourteenth aspect, wherein the semiconductor region of the first conductivity type forms a well of the first conductivity type in which at least two peaks of impurity concentrations are formed in the depthwise direction, and wherein the step of forming the second low impurity-concentration region is a step of implanting ions in such a way that the bottom of the second low impurity-concentration region is positioned in the valley between the adjacent two peaks.

In accordance with a sixteenth aspect of the present invention, there is provided, the method of manufacturing a semiconductor device as defined in fifteenth aspect, further comprising the step of: forming a high impurity-concentration region of the second conductivity type having a higher concentration of impurities than that of the first low impurity-concentration region at a shallow depth closer to the principal surface of the semiconductor substrate in comparison with the second low impurity-concentration region.

In accordance with a seventeenth aspect of the present invention, there is provided, the method of manufacturing a semiconductor device as defined in the thirteenth aspect, further comprising the steps following the step of forming the second low impurity-concentration region of the second conductivity type; namely, a step of forming a third insulating layer on the principal surface of the semiconductor substrate, the gate electrode, and the side wall insulating material after the second low impurity-concentration region of the second conductivity type has been formed;

a step of forming a contact hole formed in the third insulating layer to such an extent as to reach the first low impurity-concentration region;

a step of forming an impurity region of the second conductivity type below the first recess; and a step of forming an electrode or conductor routing along the inside of the contact hole such that the electrode or conductor routing is electrically connected to the first low impurity-concentration region.

In accordance with a eighteenth aspect of the present invention, there is provided, the method of manufacturing a semiconductor device as defined in the seventeenth aspect, wherein the step of forming an electrode or conductor routing is a step of forming a polycrystalline silicon thin film.

In accordance with a nineteenth aspect of the present invention, there is provided, the method of manufacturing a semiconductor device as defined in seventeenth aspect, wherein the step of forming an electrode or conductor routing is a step of forming a thin metal film.

BRIEF DESCRIPTION OF THE DRAWINGS

FIGS. 62A and 62B are schematic representations showing a mechanism to cause a leakage current in the existing semiconductor device;

DESCRIPTION OF THE PREFERRED EMBODIMENT

Figure 60:
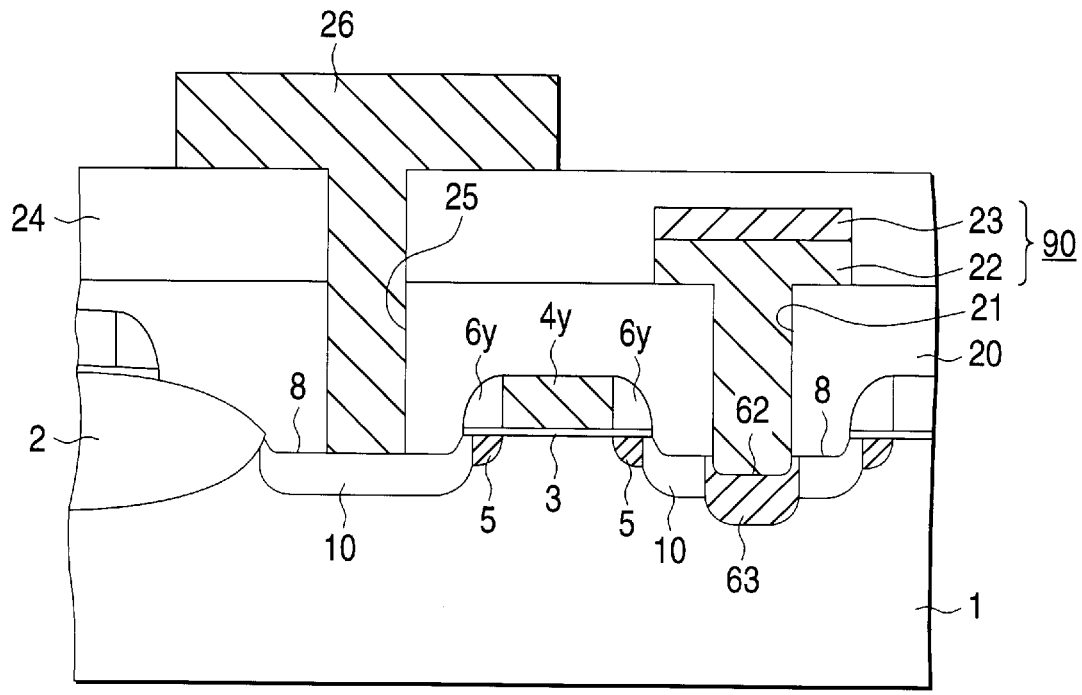
FIG. 60 is a cross-sectional view showing the ninth step of the process for manufacturing the semiconductor device in accordance with the eleventh embodiment.
Figure 61:
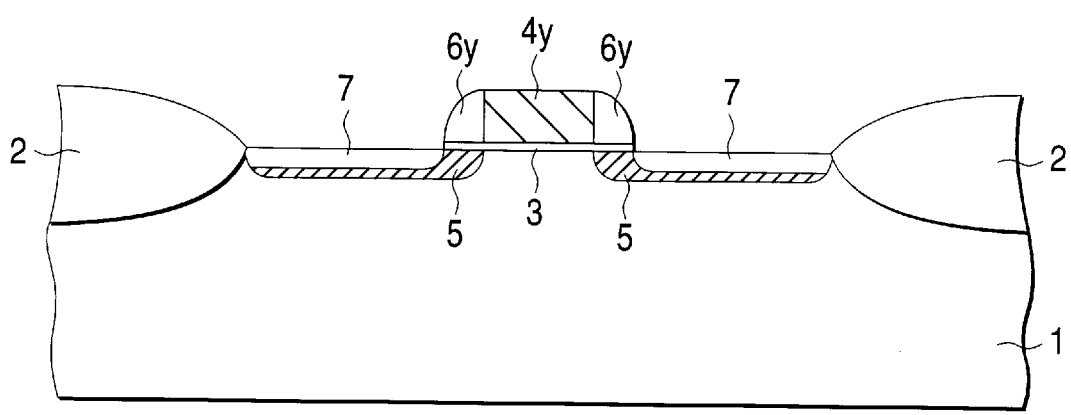
FIG. 61 is a cross-sectional view showing an existing semiconductor device.
Figure 63:
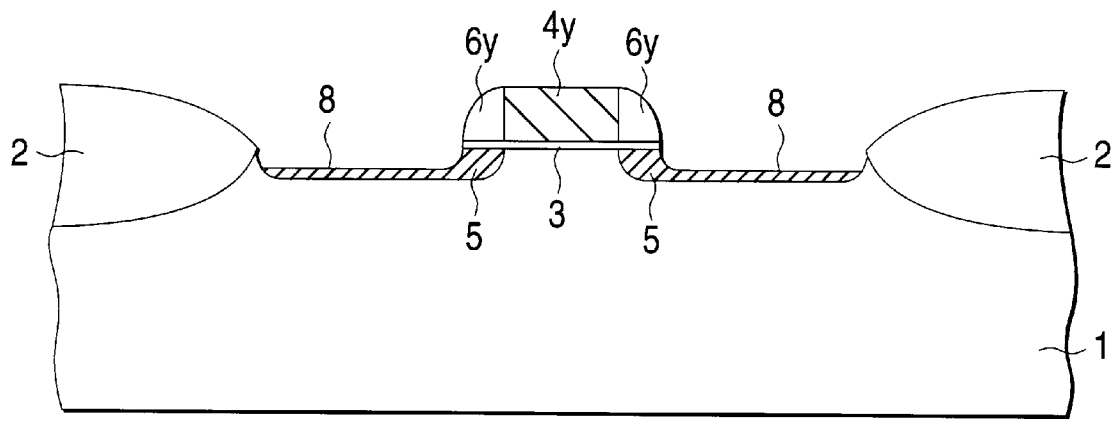
FIG. 63 is a cross-sectional view showing the existing semiconductor device.
Figure 64:
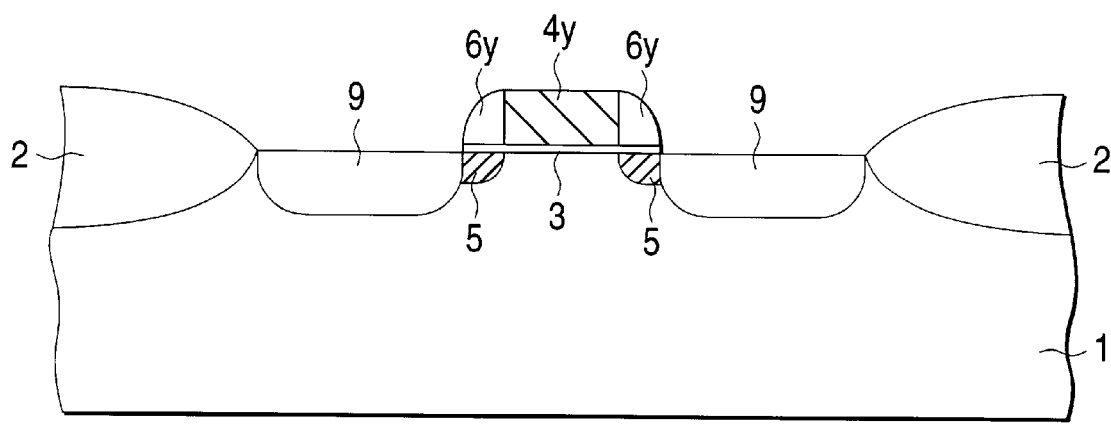
FIG. 64 is a cross-sectional view showing another example of the existing semiconductor device.

In reference to FIGS. 1 through 60, preferred embodiments of the present invention will be described.

First Embodiment

To being with, in reference to FIGS. 1 through 8, a first embodiment of the present invention will be described.

Figure 1:
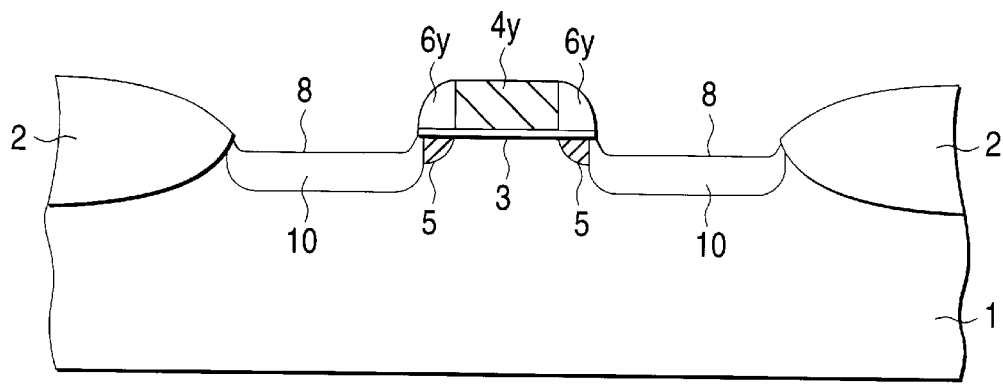
FIG. 1 is a cross-sectional view showing a semiconductor device in accordance with a first embodiment of the present invention.

FIG. 1 is a cross-sectional view showing a semiconductor device in accordance with a first embodiment of the invention. With reference to FIG. 1, reference numeral 1 designates a silicon substrate which is a semiconductor substrate and has a p-type well (not shown) of the first conductivity type; 2 designates an isolation field oxide film formed on the surface of the silicon substrate 1; 3 designates a gate oxide film which is a first insulating layer and is formed on the principal surface of the silicon substrate 1; and 4y designates a gate electrode formed on the gate oxide film 3. Reference numeral 5 designates a source/drain region which is formed on the surface of the silicon substrate 1 while a channel region (not shown) sandwiched between them, and which is a first low impurity-concentration region of the second conductivity type (i.e., an n-type). Side wall insulating material 6y is formed on each side of the gate electrode 4y. A recess 8 is formed on the first low impurity-concentration region 5 with the exception of the area immediately below the side wall insulating material 6y. A second low impurity-concentration region 10 of the n-type is formed below the recess 8. The first low impurity-concentration region 5 constitutes the source/drain region together with the second low impurity-concentration region 10.

With reference to FIGS. 2 through 8, a method of manufacturing the aforementioned semiconductor device will be described.

FIGS. 2 through 8 are cross-sectional views showing the first through seventh steps in the process for manufacturing the semiconductor device in FIG. 1.

Figure 2:
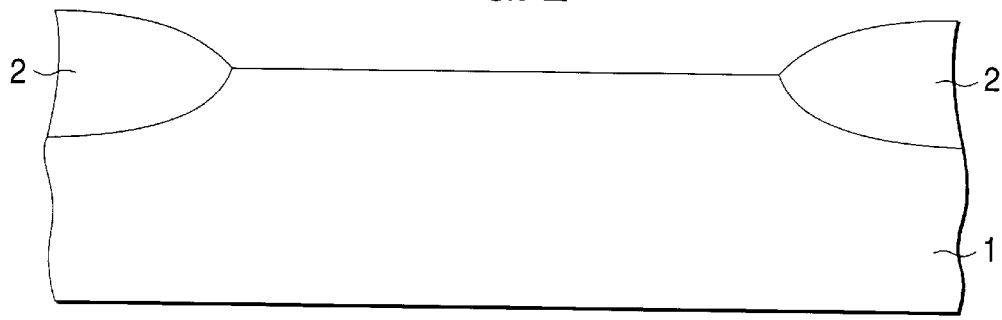
FIG. 2 is a cross-sectional view showing the first step of the process for manufacturing the semiconductor device in accordance with the first embodiment.
Figure 3:
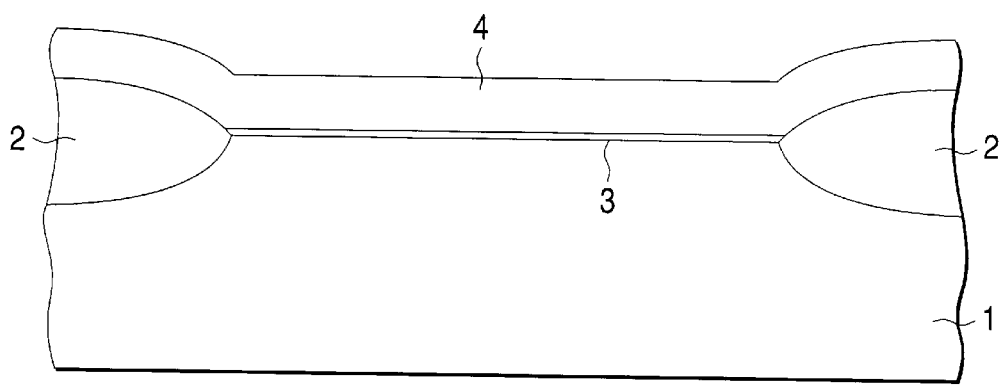
FIG. 3 is a cross-sectional view showing the second step of the process for manufacturing the semiconductor device in accordance with the first embodiment.
Figure 4:
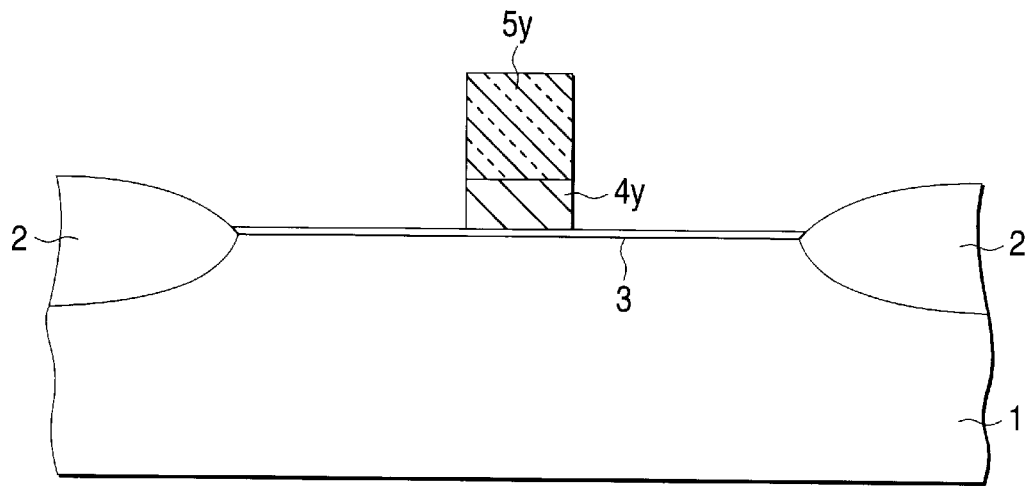
FIG. 4 is a cross-sectional view showing the third step of the process for manufacturing the semiconductor device in accordance with the first embodiment.

With reference to FIG. 2, the isolation field oxide film 2 is formed on the surface of the silicon substrate 1 which is made of a semiconductor substrate by LOCOS (Local Oxidation of Silicon), and a p-type well (not shown) is formed. As shown in FIG. 3, the gate oxide film 3 is formed on to a thickness of about 100 Å by thermal oxidation. The polysilicon film 4 is formed on the isolation field oxide film 2 and the gate oxide film 3 to a thickness of about 1000 Å by CVD (Chemical Vapor Deposition). With reference to FIG. 4, a resist is applied to the polysilicon film 4, so that a resist pattern film 5y is formed through photolithography. The polysilicon film 4 is patterned by anisotropic etching using the resist pattern 5y as a mask. As a result, the gate electrode 4y is formed on the gate oxide film 3.

Figure 5:
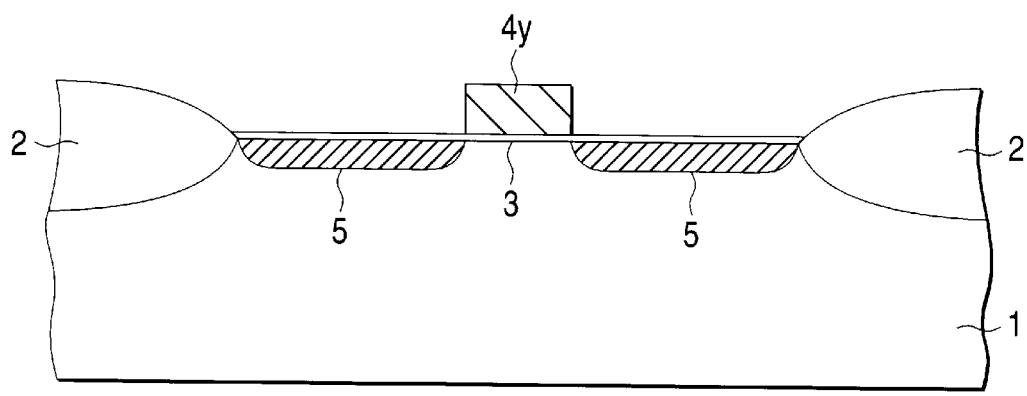
FIG. 5 is a cross-sectional view showing the fourth step of the process for manufacturing the semiconductor device in accordance with the first embodiment.
Figure 6:
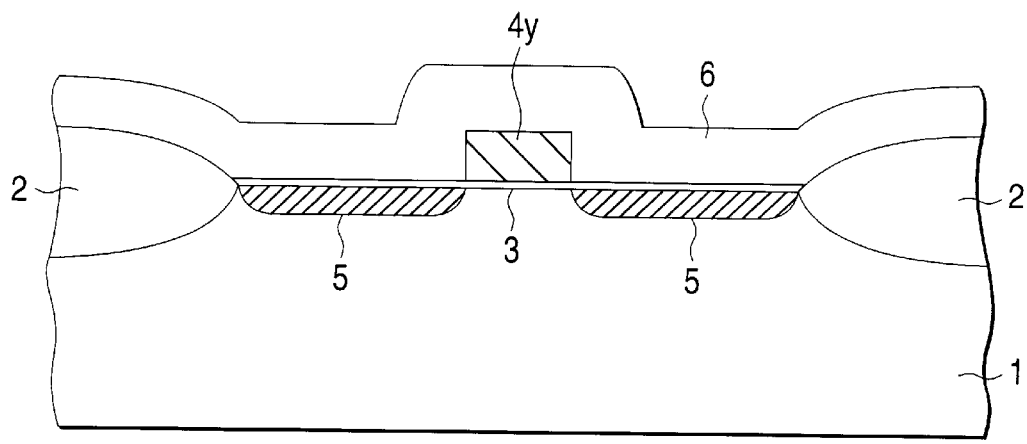
FIG. 6 is a cross-sectional view showing the fifth step of the process for manufacturing the semiconductor device in accordance with the first embodiment.
Figure 7:
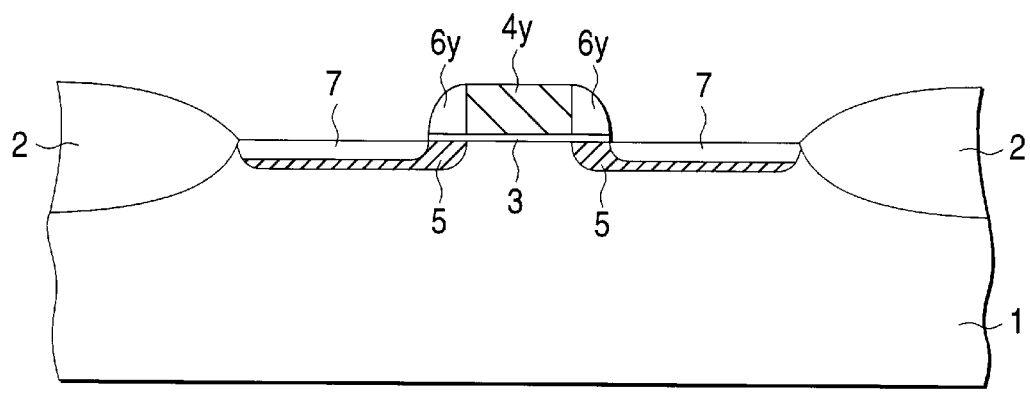
FIG. 7 is a cross-sectional view showing the sixth step of the process for manufacturing the semiconductor device in accordance with the first embodiment.

After the resist pattern 5y has been removed, arsenic (As) ions are implanted into the surface of the silicon substrate 1 at 50 keV with a dose of $5 \times 10^{13}/cm^2$ using the gate electrode as a mask as shown in FIG. 5, so that the n-type first low impurity-concentration region 5 having the concentration ranging from $5 \times 10^{16}/cm^3$ to $5 \times 10^{18}/cm^3$ is formed. With reference to FIG. 6, the silicon oxide film 6 that is the second insulating layer is formed over the entire silicon substrate 1 to a thickness of about 1000 Å by CVD. Then, as shown in FIG. 7, the overall silicon oxide film 6y is etched back by RIE, whereby the side wall insulating material 6y is formed on each side of the gate electrode 4y. As a result of the surface of the silicon substrate 1 being exposed to an etching gas during the course of formation of the side wall insulating material 6y, the damaged layer 7 is formed on the first low impurity-concentration region 5 with the exception of the area immediately below the side wall insulating material 6y.

Figure 8:
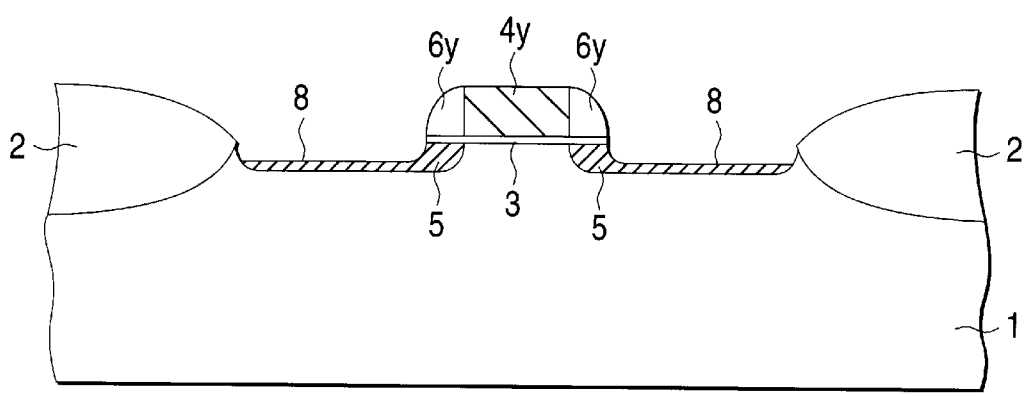
FIG. 8 is a cross-sectional view showing the seventh step of the process for manufacturing the semiconductor device in accordance with the first embodiment.

As shown in FIG. 8, the damaged layer 7 is removed by CDE (Chemical Dry Etching), so that the recess 8 is formed on each first low impurity-concentration region 5 to a thickness of about 500 A with the exception of the area immediately below the side wall insulating material 6y. Arsenic (As) ions are implanted into the recesses 8 at 50 keV with a dose of $5\times10^{13}/cm^2$ using, as a mask, the gate electrode 4y and the side wall insulating material 6y. As a result, the second low impurity-concentration region 10 of the n-type is formed below the recess 8 so as to have the concentration ranging from $5\times10^{16}/cm^3$ to $5\times10^{18}/cm^3$, so that the semiconductor device shown in FIG. 1 is formed. It goes without saying that there are further required steps to create inter-layer insulating films, contact holes, and conductor routing in order to fabricate the thus-formed semiconductor device into an LSI (Large Scale Integration) element. In FIG. 1, the area of the first low impurity-concentration region immediately below the side wall insulating material 6y has the function of mitigating the concentration of an electric field in the vicinity of the drain so as to reduce hot carriers developing in the vicinity of the drain, thereby resulting in an increase in the longevity of the transistor as well as the continued high-performance of the same.

As has been described above, in the semiconductor device and its manufacturing method in accordance with the first embodiment, the recess 8 is formed on the first low impurity-concentration region 5 with the exception of the area immediately below the side wall insulating material 6 to thereby remove the damaged layer 7 formed on the surface of the first low impurity-concentration region 5 at the time of formation of the side wall insulating material 6y. As a result, the leakage current developing in the junction between the silicon substrate 1 and the source/drain region is reduced, so that the superior characteristics of the junction are obtained. Accordingly, the characteristics of the junction between the silicon substrate 1 and the source/drain region which acts as an insulator when reverse bias is applied are improved. For a MOS device, the leakage current developing in the junction is reduced, and hence the power consumption is reduced. Particularly, for a DRAM memory cell, the electric charges stored in the capacitor are not discharged to the outside, the refreshing characteristics of the DRAM memory cells are improved. Further, the second low impurity-concentration region 10 that is the same in conductivity type as the first low impurity-concentration region 5 is formed below the recess 8, so that an increase in the resistance of the source/drain region which would otherwise be caused by the removal of the damaged layer 7 can be prevented. Therefore, a semiconductor device which operates fast and stable can be achieved.

The characteristics of the junction between the silicon substrate 1 and the source/drain region and the electrical resistance of the source/drain region are determined by the second low impurity-concentration region 10. Consequently, there are prevented variations in the etch rate required for removal of the damaged layer 7 which would otherwise cause variations in the characteristics of the junction between the source/drain region and the silicon substrate 1 or in the electrical resistance of the source/drain region, so a reduction in the manufacturing yield of the semiconductor device can be prevented to a much greater extent.

Although the explanation provided in the first embodiment has been given of the case where the recess 8 is formed at a depth of about 500 A on the source/drain region with the exception of the area immediately below the side wall insulating material 6y, the depth ranging from 0.03 μm to 0.1 μm is sufficient for the recess 8. If this is the case, there are ensured the same driving capability and punch-through withstand voltage as those of the semiconductor device without a recess, and therefore the same effect as that obtained in the first embodiment will be ensured. Although the thickness of the damaged layer 7 differs according to the etching conditions used for formation of the side wall, it may be as small as about 100 A in the case where the damaged layer 7 is formed by a common method such as RIE. The damaged layer 7 can be substantially completely removed by eliminating the surface layer to a depth of about 300 A. If the depth of the resultant recess 8 is increased, the overlapping portion between the first and second low impurity-concentration regions becomes smaller, thereby resulting in an increase in the resistance of the source/drain region. If the depth of the recess 8 is increased to more than 1000 A, there will arise the risk of bringing the semiconductor device out of conduction. For this reason, the first low impurity-concentration region is usually formed at a depth of about 1500 A or below.

In the first embodiment, the explanation has been given of the formation of the second n-type low impurity-concentration region below the recess 8 in the case where the p-type well and the n-type first low impurity-concentration region are formed on the silicon substrate. However, in the case where an n-type well and the first low impurity-concentration region of a p-type are formed on the silicon substrate, the second low impurity-concentration region of the p-type may be formed below the recess 8, so that the same effect as that yielded in the embodiment is obtained.

Second Embodiment

Figure 9:
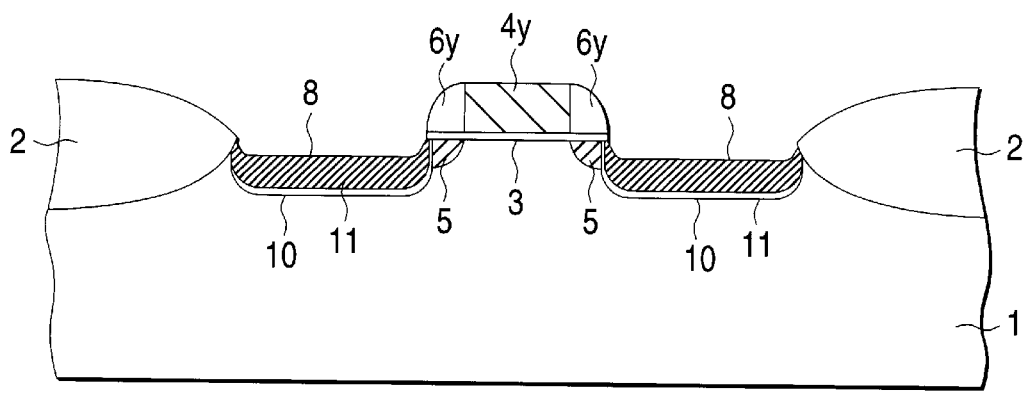
FIG. 9 is a cross-sectional view showing a semiconductor device in accordance with a second embodiment of the present invention.
Figure 10:
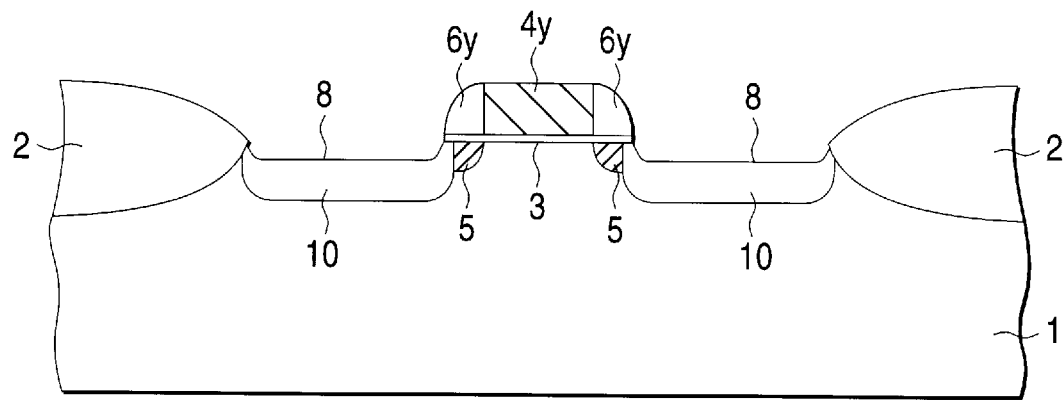
FIG. 10 is a cross-sectional view showing the first step of the process for manufacturing the semiconductor device in accordance with the second embodiment.

With reference to FIGS. 9 and 10, a second embodiment of the present invention will be described.

FIG. 9 is a cross-sectional view showing a semiconductor device in accordance with the second embodiment of the present invention. In FIG. 9, reference numeral 11 designates a high impurity-concentration region of the second conductivity type (i.e., the n-type) formed at a shallow depth closer to the principal surface of the silicon substrate rather than in comparison with the low impurity-concentration region 10. The source/drain region is formed from the first low impurity-concentration region 5, the second low impurity-concentration region 10, and the high impurity-concentration region 11. In other respects, the semiconductor device of the present embodiment is the same in construction as that of the first embodiment shown in FIG. 1.

With reference to FIG. 10, a method of manufacturing the semiconductor device mentioned above will be described. FIG. 10 is a cross-sectional view showing a first step of the semiconductor device manufacturing method shown in FIG. 9.

First, with reference to FIG. 10, the isolation field oxide film 2, an unillustrated well of the p-type (or the first conductivity type), the gate oxide film 3 which serves as the first insulating layer 1, the gate electrode 4y, the first impurity region 5 of the n-type (or the second conductivity type), and the side wall insulating material 6y are formed on the surface of the silicon substrate 1 (which is a semiconductor substrate) through the same steps as those employed in the first embodiment. The recess 8 is formed on the first low impurity-concentration region 5 with the exception of the area immediately below the side wall insulating material 6y, and the second n-type low impurity-concentration region 10 is formed below the recess 8.

The n-type high impurity-concentration region 11 having the concentration ranging from $5\times10^{18}/cm^3$ to $5\times10^{20}/cm^3$ is formed below the recess 8 at a shallow depth closer to the principal surface of the silicon substrate 1 in comparison with the second low impurity-concentration region 10 by implanting arsenic (As) ions into the recesses 8 at 30 keV with a dose of $4\times10^{15}/cm^2$ using, as a mask, the gate electrode 4y and the side wall insulating material 6y. As a result, the semiconductor device as shown in FIG. 9 is formed. It goes without saying that there are further required steps to create inter-layer insulating films, contact holes, and conductor routing in order to fabricate the thus-formed semiconductor device into an LSI element.

As described above, the semiconductor device and the method of manufacturing it in accordance with the second embodiment yield the following effects in addition to the effects obtained in the first embodiment. More specifically, the high impurity-concentration region 11 of the second conductivity type that has a higher concentration of impurities than that of the first low impurity-concentration region, is formed at a shallow depth closer to the principal surface of the silicon substrate 1 in comparison with the second low impurity-concentration region 10, whereby the high impurity-concentration region 11 prevents, to a much greater extent, the depletion layer from extending to the area from which the damaged layer 7 has been removed. The leakage current caused by the damaged layer in the junction can be also reduced to a much greater extent. Further, the presence of the high impurity-concentration region 11 and the second low impurity-concentration region 10 makes it possible to prevent, to a much greater extent, an increase in the resistance of the source/drain region which would otherwise be caused by the removal of the damaged layer 7. Therefore, a semiconductor device which operates faster and more stable can be achieved.

The high impurity-concentration region 11 of the second conductivity type that has a higher concentration of impurities than that of the first low impurity-concentration region, is formed at a shallow depth closer to the principal surface of the silicon substrate 1 in comparison with the second low impurity-concentration region 10, whereby the concentration of impurities gradually decreases from the principal surface of the silicon substrate 1 toward the p-type well formed in the silicon substrate 1. As a result, the electric field in the junction between the silicon substrate 1 and the source/drain region is mitigated, whereby the leakage current developing in the junction between the silicon substrate 1 and the source/drain region can be reduced further.

The characteristics of the junction between the silicon substrate 1 and the source/drain region and the electrical resistance of the source/drain region are determined by the second low impurity-concentration region 10 and the high impurity-concentration region 11. Accordingly, there are prevented variations in the etch rate required for removal of the damaged layer 7 which would otherwise cause variations in the characteristics of the junction between the source/drain region and the silicon substrate 1 or in the electrical resistance of the source/drain region, so a reduction in the manufacturing yield of the semiconductor device can be prevented to a much greater extent.

Although the explanation provided in the second embodiment has been given of the case where the recess 8 is formed at a depth of about 500 A on the source/drain region with the exception of the area immediately below the side wall insulating material 6y, the depth ranging from 0.03 μm to 0.1 μm is sufficient for the recess 8. If this is the case, there are ensured the same driving capability and punch-through withstand voltage as those of the semiconductor device without a recess, and therefore the same effects as those obtained in the previous embodiments will be ensured.

Although the explanation provided in the second embodiment has been given of the case where the p-type well and the first n-type low impurity-concentration region are formed on the silicon substrate, and where the second n-type low impurity-concentration region and the n-type high impurity-concentration region are formed below the recess 8, the second low impurity-concentration region of the p-type and the high impurity-concentration region of the p-type may be formed below the recess 8 on the silicon substrate having an n-type well and the first low impurity-concentration region of the p-type. Even in this case, the same effect as that obtained in the first embodiment will be ensured.

Third Embodiment

With reference to FIGS. 11 through 18, a third embodiment of the present invention will be described.

Figure 11:
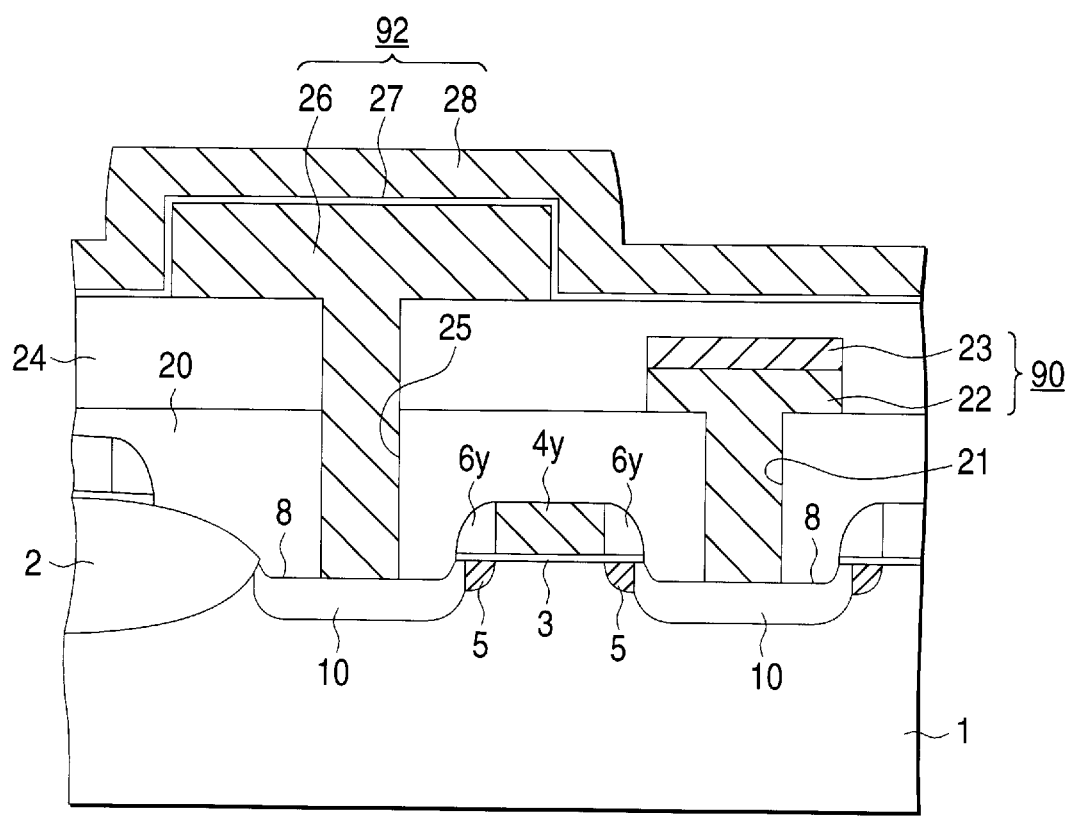
FIG. 11 is a cross-sectional view showing a semiconductor device in accordance with a third embodiment of the present invention.

FIG. 11 is a cross-sectional view showing a semiconductor device in accordance with the third embodiment of the invention. In reference to FIG. 11, reference numeral 20 designates a silicon dioxide film which is formed on the silicon substrate 1 and serves as a third insulating layer; and 21 designates a contact hole formed in the silicon dioxide film 20 to such an extent as to reach the second low impurity-concentration region 10. A bit line 90 which is a conductor routing and consists of two conductive layers 22 and 23 is formed along the inside of the contact hole 21. Reference numeral 24 designates a silicon dioxide layer which is an insulating layer formed on the third insulating layer 20; and 25 designates a contact hole formed in the insulating layer 24 and the third insulating layer 20 to such an extent as to reach the second low impurity-concentration region 10. A storage node 26 which is a lower electrode of a capacitor is formed in the contact hole 25. A dielectric film 27 of the capacitor is formed on the storage node 26, and a cell plate 28 which is an upper electrode of the capacitor is further formed on the dielectric film 27. A capacitor 92 is formed from the lower electrode 26, the dielectric film 27, and the upper electrode 28. In other respects, the semiconductor device of the present embodiment is the same in construction as that of the first embodiment shown in FIG. 1.

With reference to FIGS. 12 to 18, a method of manufacturing the semiconductor device mentioned above will be described.

FIGS. 12 through 18 are cross-sectional views showing the first through seventh steps in the process for manufacturing the semiconductor device in FIG. 11.

Figure 12:
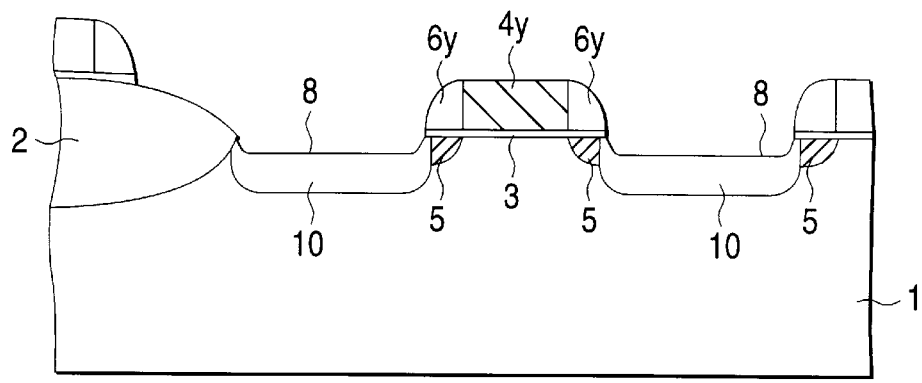
FIG. 12 is a cross-sectional view showing the first step of the process for manufacturing the semiconductor device in accordance with the third embodiment.

First, with reference to FIG. 12, the isolation field oxide film 2, an unillustrated well of the p-type (or the first conductivity type), the gate oxide film 3 which serves as the first insulating layer 1, the gate electrode 4y, the first impurity region 5 of the n-type (or the second conductivity type), and the side wall insulating material 6y are formed on the surface of the silicon substrate 1 (which is a semiconductor substrate) through the same steps as those employed in the first embodiment. The recess 8 is formed on the first low impurity-concentration region 5 with the exception of the area immediately below the side wall insulating material 6y, and the second n-type low impurity-concentration region 10 is formed below the recess 8. The first low impurity-concentration region 5 and the second low impurity-concentration region 10 constitute a source/drain region.

Figure 13:
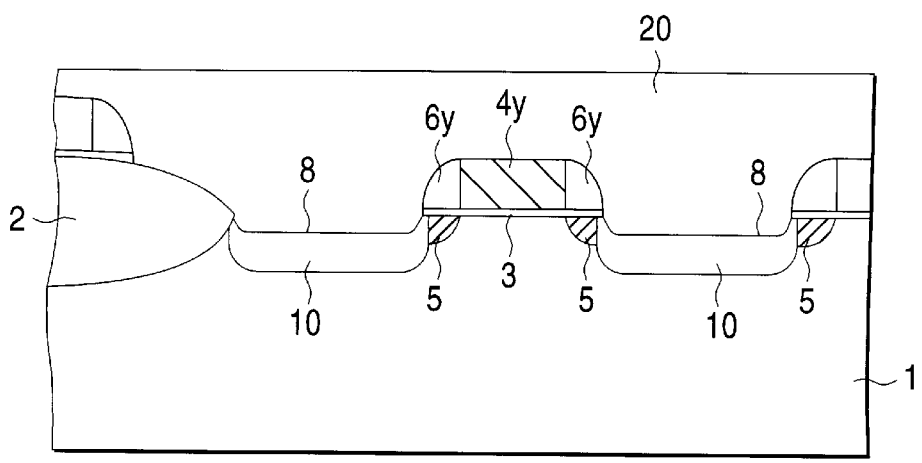
FIG. 13 is a cross-sectional view showing the second step of the process for manufacturing the semiconductor device in accordance with the third embodiment.
Figure 14:
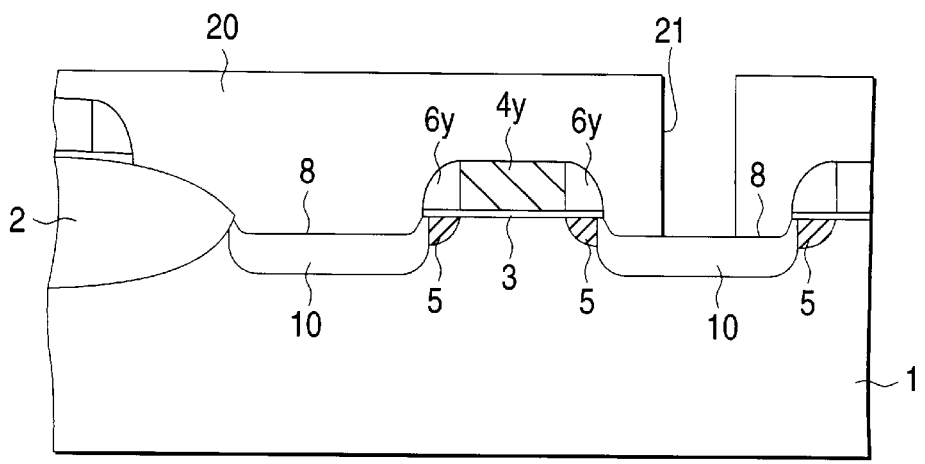
FIG. 14 is a cross-sectional view showing the third step of the process for manufacturing the semiconductor device in accordance with the third embodiment.
Figure 15:
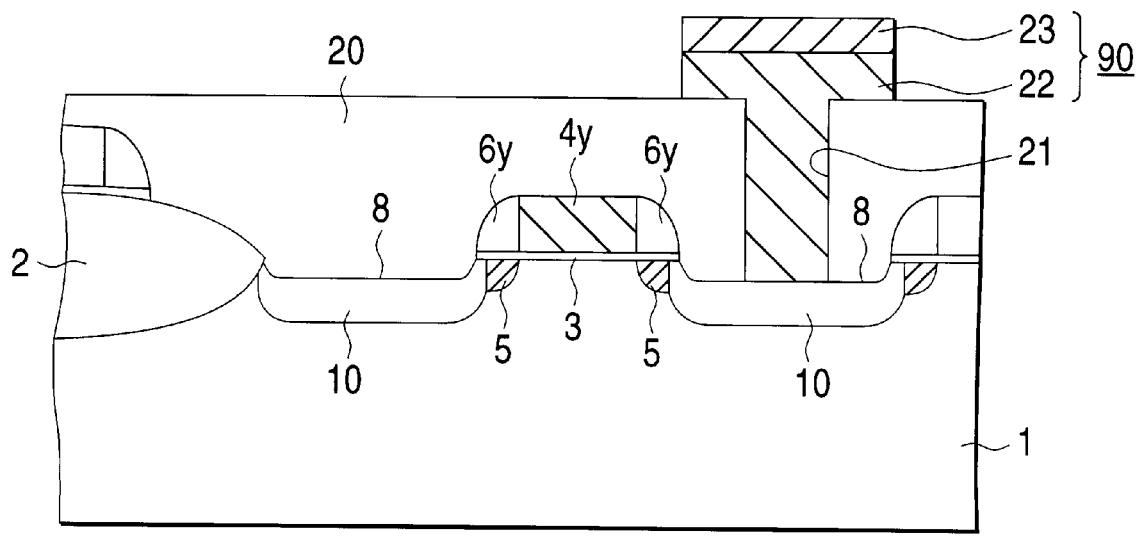
FIG. 15 is a cross-sectional view showing the fourth step of the process for manufacturing the semiconductor device in accordance with the third embodiment.

As shown in FIG. 13, the silicon dioxide film 20 is formed over the entire surface of the silicon substrate 1 to a thickness of about 7000 A by CVD. As shown in FIG. 14, the contact hole 21 is then formed in this silicon dioxide film 20 to such an extent as to reach the second low impurity-concentration region 10. Impurity-containing polysilicon is deposited on the silicon dioxide film 20 to a thickness of about 800 A by CVD, and tungsten silicide (WSi) is deposited on the polysilicon to a thickness of about 700 A by CVD. This substrate is then subjected to photolithography and etching through use of a resist. As a result, as shown in FIG. 15, the bit line 90 consisting of the impurity-containing polysilicon layer pattern 22 and the tungsten silicide layer pattern 23 is formed in the contact hole 21 so as to be electrically connected to the second low impurity-concentration region 10.

Figure 16:
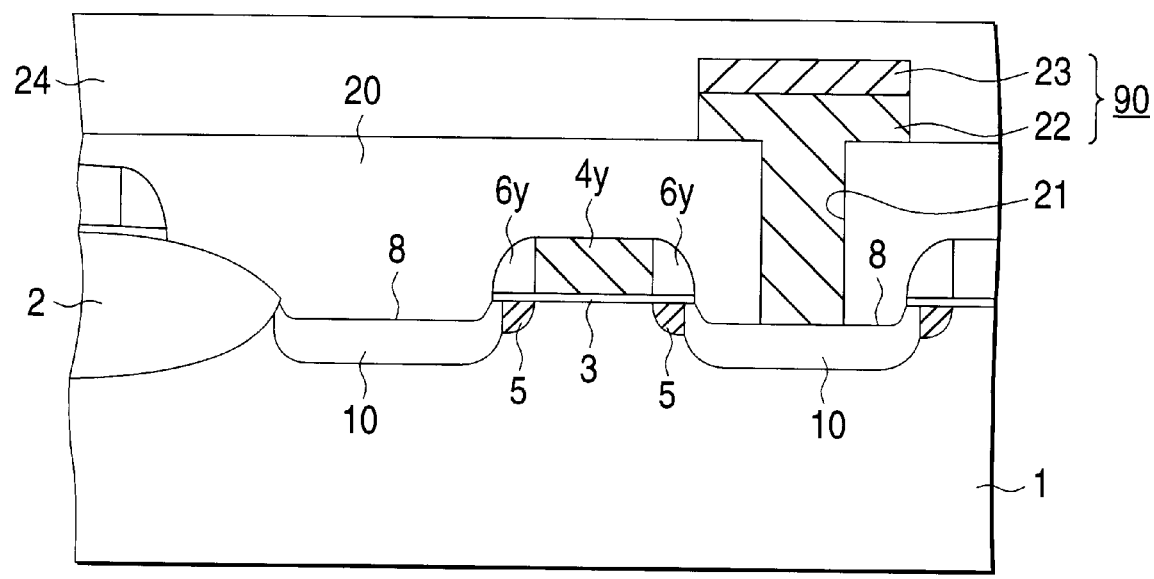
FIG. 16 is a cross-sectional view showing the fifth step of the process for manufacturing the semiconductor device in accordance with the third embodiment.
Figure 17:
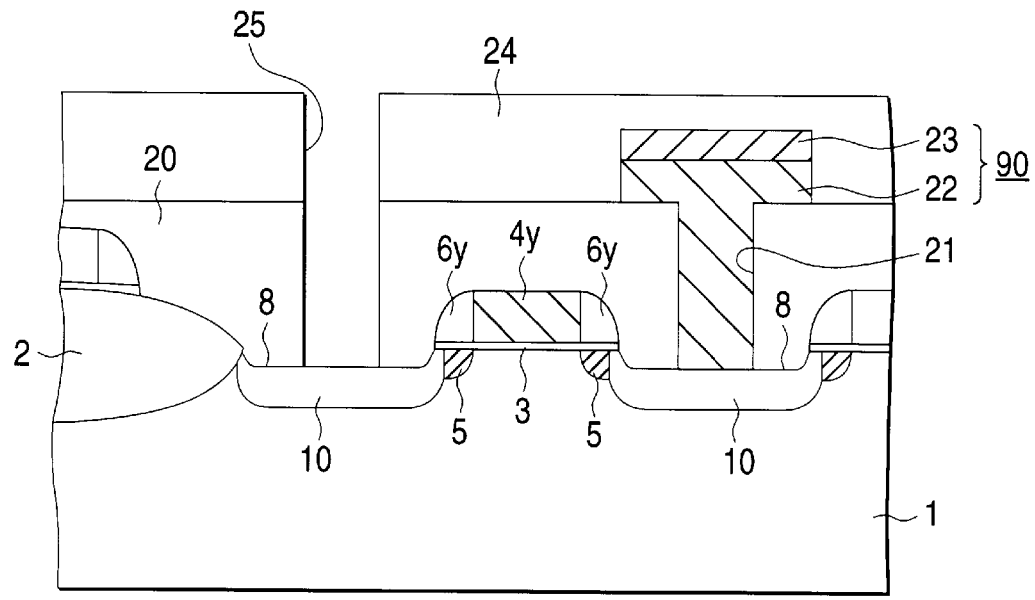
FIG. 17 is a cross-sectional view showing the sixth step of the process for manufacturing the semiconductor device in accordance with the third embodiment.
Figure 18:
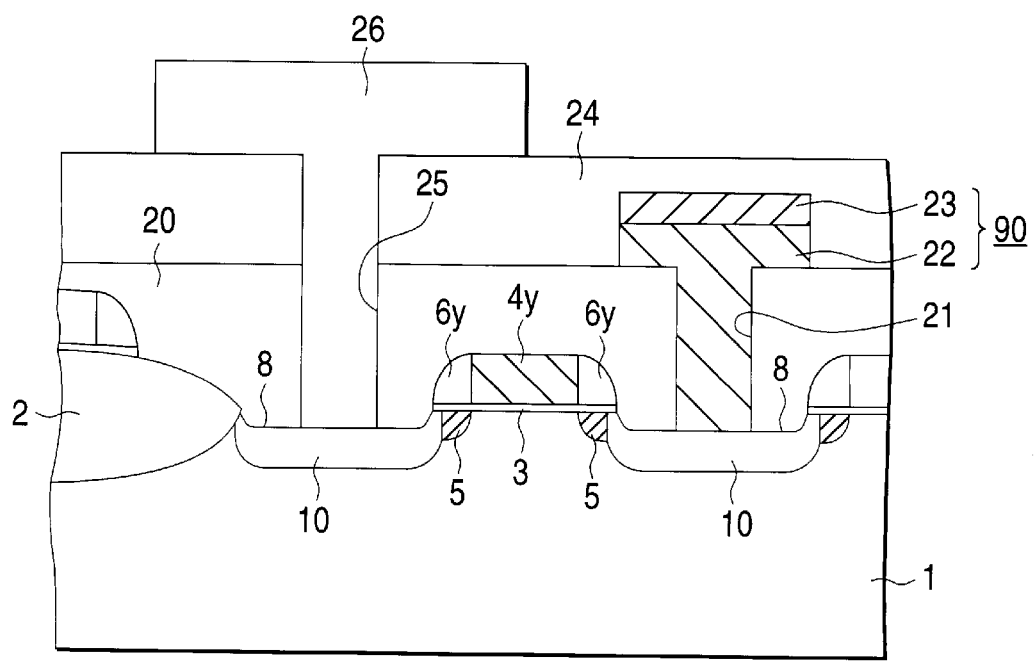
FIG. 18 is a cross-sectional view showing the seventh step of the process for manufacturing the semiconductor device in accordance with the third embodiment.

With reference to FIG. 16, the silicon dioxide film 24 is formed to a thickness of about 7000 A on the silicon dioxide film 20 and the bit line 90 by CVD. As shown in FIG. 17, the contact hole 25 is formed in the silicon dioxide films 24 and 20 to such an extent as to reach the second low impurity-concentration region 10. Subsequently, impurity-containing polysilicon is deposited on the silicon dioxide film 24 to a thickness of about 8000 A. This substrate is then subjected to photolithography and etching through use of a resist. As shown in FIG. 18, the storage node 26 which is electrically connected to the second low impurity-concentration region 10 is formed in the contact hole 25. The silicon oxynitride (SiON) layer 27 which is a dielectric film of the capacitor is formed to a thickness of about 70 A on the storage node 26 by CVD, and the impurity-containing polysilicon layer 28 which is a cell plate is further formed to a thickness of about 500 A on the silicon oxynitride layer 27. In the end, the semiconductor device shown in 11 is fabricated. It goes without saying that there are further required steps to create inter-layer insulating films, contact holes, and conductor routing in order to fabricate the thus-formed semiconductor device into an LSI element.

As described above, the semiconductor device and the method of manufacturing it in accordance with the third embodiment yield the following effects in addition to the effects obtained in the first embodiment. More specifically, the recess 8 is formed on the first low impurity-concentration region 5 with the exception of the area immediately below the side wall insulating material 6y to thereby remove the damaged layer 7 formed on the surface of the first low impurity-concentration region 5 as a result of formation of the side wall insulating material 6y. As a result, the leakage current developing in the junction between the silicon substrate 1 and the source/drain region is reduced, so that the superior characteristics of the junction are obtained. The electric charges stored in the capacitor are not discharged to the outside, and hence the refreshing characteristics of the semiconductor device are improved. Further, the characteristics of the junction between the silicon substrate 1 and the source/drain region which acts as an insulator when reverse bias is applied are improved. In addition, the second low impurity-concentration region 10 that is the same in conductivity type as the first low impurity-concentration region 5 is formed below the recess 8, so that an increase in the resistance of the source/drain region which would otherwise be caused by the removal of the damaged layer 7 can be prevented. Therefore, DRAM which operates fast and stable can be achieved.

Although the explanation provided in the third embodiment has been given of the case where the recess 8 is formed at a depth of about 500 A on the source/drain region with the exception of the area immediately below the side wall insulating material 6y, the depth ranging from 0.03 μm to 0.1 μm is sufficient for the recess 8. If this is the case, there are ensured the same driving capability and punch-through withstand voltage as those of the semiconductor device without a recess, effects as those e same effects as those obtained in the previous embodiments will be ensured.

Although the explanation provided in the third embodiment has been given of the case where the p-type well and the first n-type low impurity-concentration region are formed on the silicon substrate, and where the second n-type low impurity-concentration region is formed below the recess 8, the second low impurity-concentration region of the p-type may be formed below the recess 8 on the silicon substrate having an n-type well and the first low impurity-concentration region of the p-type. Even in this case, the same effects as those obtained in the previous embodiments will be ensured.

Fourth Embodiment

With reference to FIGS. 19 to 22, a fourth embodiment of the present invention will be described.

Figure 19:
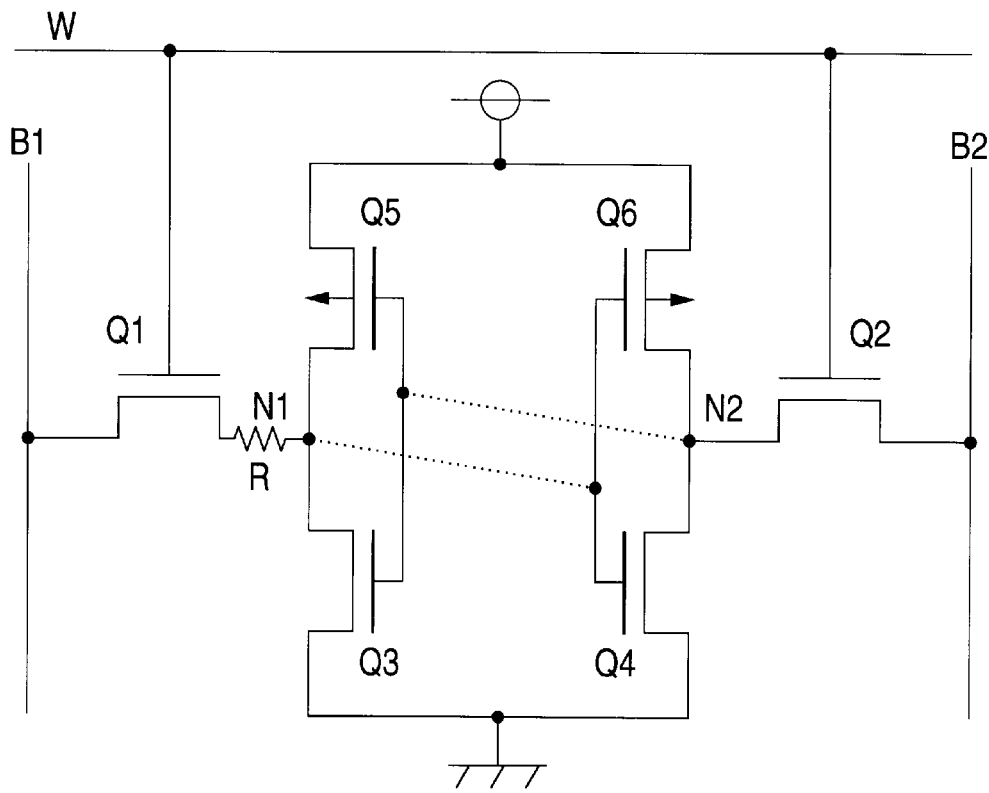
FIG. 19 is an equivalent circuit diagram of SRAM in accordance with a fourth embodiment of the present invention.

FIG. 19 is an equivalent circuit diagram of SRAM in accordance with the fourth embodiment. With reference to FIG. 19, Q1 and Q2 designate access transistors; Q3 and Q4 designate driver transistors; and Q5 and Q6 designate load transistors. A flip-flop circuit is constituted by the driver transistors Q3 and Q4 and the load transistors Q5 and Q6. The access transistors Q1 and Q2 are connected to the flip-flop circuit through storage nodes N1 and N2. In the drawing, B1 and B2 designate bit lines, and W designate a word line.

As the integration of the SRAM is increased, the access transistors Q1 and Q2 are formed in an asymmetrical pattern, and hence such SRAM is particularly called asymmetrical SRAM. In this asymmetrical SRAM, since the access transistors Q1 and Q2 are arranged asymmetrically, their characteristics differ from each other. For this reason, as shown in FIG. 19, the impurity concentration of one impurity diffusion layer of Q1 is reduced so as to become smaller than that of the other impurity diffusion layer, whereby a resistor R is equivalently connected to Q1. Accordingly, the characteristics of the two access transistors Q1 and Q2 are brought into agreement with each other. Consequently, the dynamic characteristics of the memory cell in a logical 1 and a logical 0 are averaged.

Figure 20:
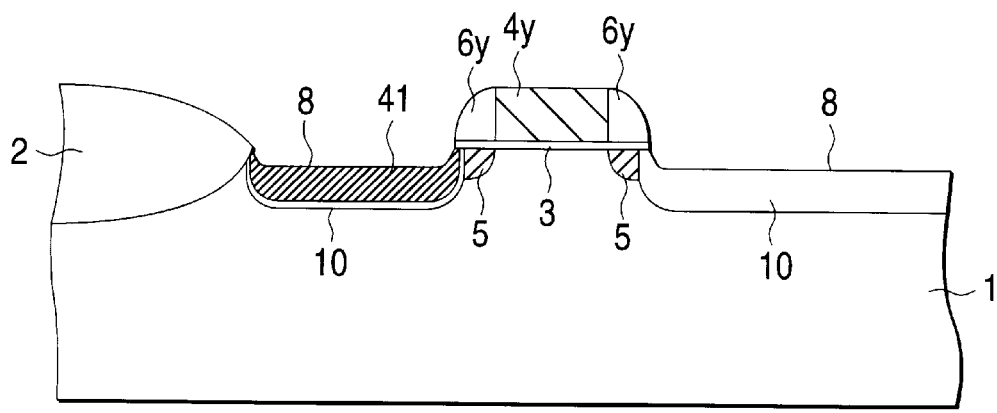
FIG. 20 is a cross-sectional view showing a semiconductor device in accordance with the fourth embodiment of the present invention.

FIG. 20 is a cross-sectional view showing a semiconductor device in accordance with the fourth embodiment.

In reference to FIG. 20, reference numeral 41 designates a high impurity-concentration region of the n-type (or the second conductivity type) which is formed at a shallow depth closer to the principal surface of the silicon substrate in comparison with the second low impurity-concentration region 10. In other respects, the semiconductor device of the present embodiment is the same in construction as that of the first embodiment shown in FIG. 1.

Figure 21:
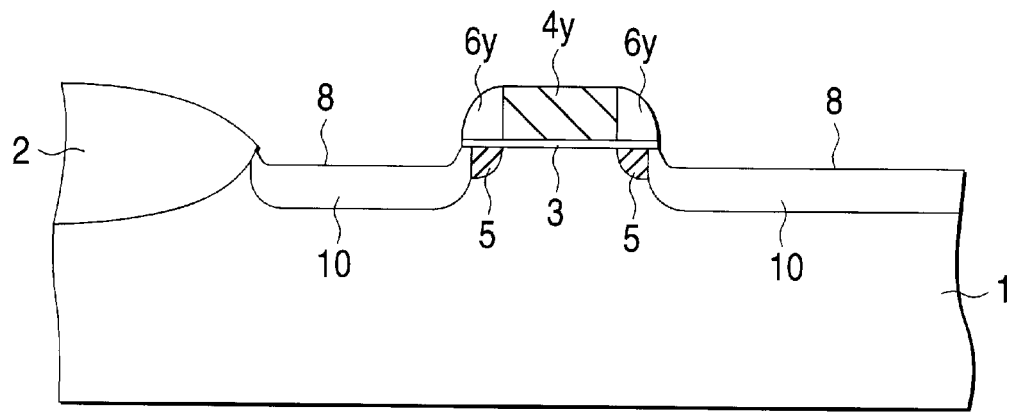
FIG. 21 is a cross-sectional view showing the first step of the process for manufacturing the semiconductor device in accordance with the fourth embodiment.
Figure 22:
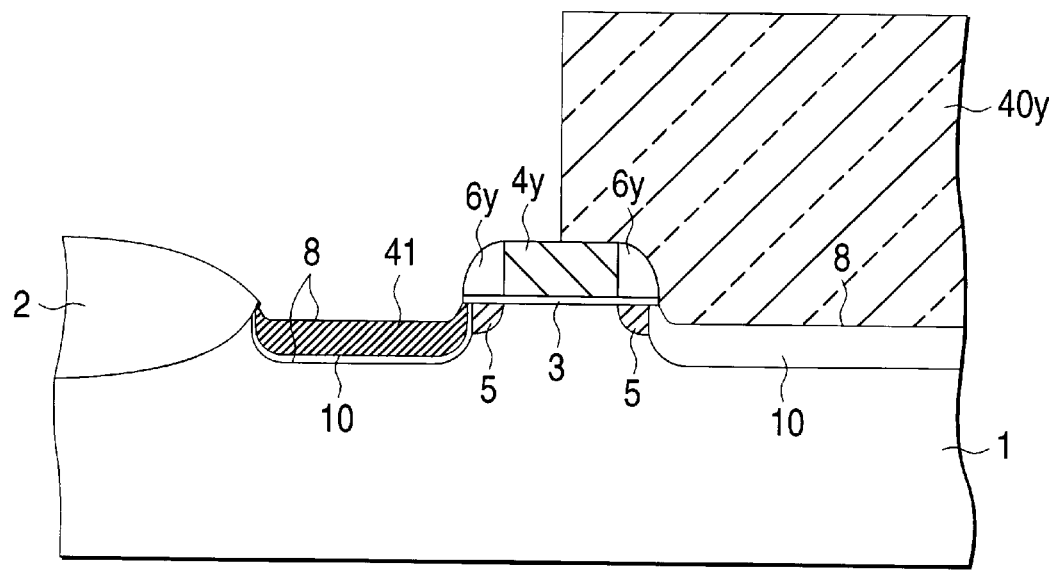
FIG. 22 is a cross-sectional view showing the second step of the process for manufacturing the semiconductor device in accordance with the fourth embodiment.

With reference to FIGS. 21 and 22, a method of manufacturing the semiconductor device mentioned above will be described.

FIGS. 21 and 22 are cross-sectional views showing the first and second steps in the process for manufacturing the semiconductor device in FIG. 11.

First, with reference to FIG. 21, the isolation field oxide film 2, an unillustrated well of the p-type (or the first conductivity type), the gate oxide film 3 which serves as the first insulating layer 1, the gate electrode 4y, the first impurity region 5 of the n-type (or the second conductivity type), and the side wall insulating material 6y are formed on the surface of the silicon substrate 1 (which is a semiconductor substrate) through the same steps as those employed in the first embodiment. The recess 8 is formed on the first low impurity-concentration region 5 with the exception of the area immediately below the side wall insulating material 6y, and the second n-type low impurity-concentration region 10 is formed below the recess 8.

As shown in FIG. 22, after the resist has been applied to the substrate, the substrate is subjected to photolithography, whereby a resist pattern 40y is formed so as to cover one of the second low impurity-concentration regions 10. Arsenic (As) ions are implanted into the recesses 8 at 30 keV with a dose of $4\times10^{15}/cm^2$ using, as a mask, the resist pattern 40y, the gate electrode 4y, and the side wall insulating material 6y. As a result, a high impurity-concentration region 41 of the n-type having the concentration ranging from $5\times10^{18}/cm^3$ to $5\times10^{20}/cm^3$ is formed below the recess 8 at a shallow depth closer to the principal surface of the silicon substrate 1 in comparison with the second low impurity-concentration region 10. The first low impurity-concentration region 5, the second low impurity-concentration region 10, and the high impurity-concentration region 41 constitute the source/drain region. The semiconductor device in FIG. 20 is formed by removing the resist pattern 40y. It goes without saying that there are further required steps to create inter-layer insulating films, contact holes, and conductor routing in order to fabricate the thus-formed semiconductor device into an LSI element.

As described above, the semiconductor device and the method of manufacturing it in accordance with the fourth embodiment yield the following effects in addition to the effects obtained in the first embodiment. More specifically, the high impurity-concentration region 41 of the second conductivity type whose impurity concentration is higher than that of the first low impurity-concentration region is formed below the recess 8 at a shallow depth closer to the principal surface of the silicon substrate 1 in comparison with the second low impurity-concentration region 10. The thus-formed high impurity-concentration region 41 prevents, to a much greater extent, the depletion layer from extending to the area from which the damaged layer has been removed. As a result, the leakage current caused by the damaged layer in the junction can be also reduced to a much greater extent, so that the power consumption of the SRAM is reduced. In addition, the presence of the high impurity-concentration region 41 and the second low impurity-concentration region 10 allows prevention of an increase in the resistance of the source/drain region which would otherwise be caused by the removal of the damaged layer 7. Therefore, SDRAM which operates fast and stable can be achieved.

The high impurity-concentration region 41 of the second conductivity type whose impurity concentration is higher than that of the first low impurity-concentration region is formed below the recess 8 at a shallow depth closer to the principal surface of the silicon substrate 1 in comparison with the second low impurity-concentration region 10. As a result, the concentration of impurities gradually decreases from the principal surface of the silicon substrate 1 toward the p-type well formed in the silicon substrate 1. As a result, the electric field in the junction between the silicon substrate 1 and the source/drain region is mitigated, whereby the leakage current developing in the junction between the silicon substrate 1 and the source/drain region can be reduced further.

The characteristics of the junction between the silicon substrate 1 and the source/drain region and the electrical resistance of the source/drain region are determined by the second low impurity-concentration region 10 in the source/drain region that does not contain the high impurity-concentration region 41 or by the second low impurity-concentration region 10 and the high impurity-concentration region 41 in the source/drain region that contains the high impurity-concentration region 41. The control of the electrical resistance of the second low impurity-concentration region 10 in the vicinity of the storage node N1 which is indispensable to asymmetrical SRAM can be effected with a high degree of accuracy. Accordingly, there are prevented variations in the etch rate required for removal of the damaged layer 7 which would otherwise cause variations in the characteristics of the junction between the source/drain region and the silicon substrate 1 or in the electrical resistance of the source/drain region, so a reduction in the manufacturing yield of the semiconductor device can be prevented to a much greater extent.

Although the explanation provided in the fourth embodiment has been given of the case where the recess 8 is formed at a depth of about 500 A on the source/drain region with the exception of the area immediately below the side wall insulating material 6y, the depth ranging from 0.03 μm to 0.1 μm is sufficient for the recess 8. If this is the case, there are ensured the same driving capability and punch-through withstand voltage as those of the semiconductor device without a recess, and therefore the same effects as those obtained in the previous embodiments will be ensured.

Although the explanation provided in the fourth embodiment has been given of the case where the p-type well and the first n-type low impurity-concentration region are formed on the silicon substrate, and where the second n-type low impurity-concentration region and the n-type high impurity-concentration region are formed below the recess 8, the second low impurity-concentration region of the p-type and the high impurity-concentration region of the p-type may be formed below the recess 8 on the silicon substrate having an n-type well and the first low impurity-concentration region of the p-type. Even in this case, the same effects as those obtained in the previous embodiments will be ensured.

Further, it goes without saying that the present invention can be also applied to a case where transistors are directly formed on the surface of a semiconductor substrate without forming a well.

Fifth Embodiment

With reference to FIGS. 23 through 34, a fifth embodiment of the present invention will be described.

Figure 23:
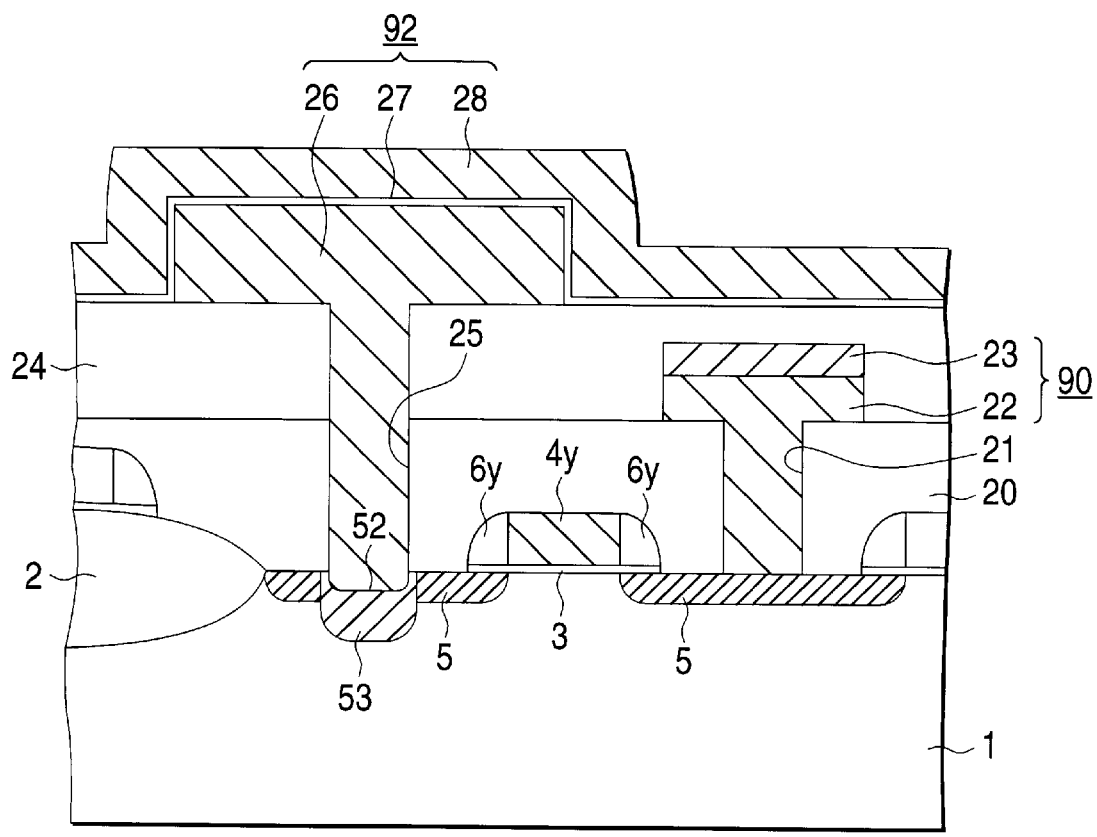
FIG. 23 is a cross-sectional view showing a semiconductor device in accordance with a fifth embodiment of the present invention.

FIG. 23 is a cross-sectional view showing a semiconductor device in accordance with the fifth embodiment of the present invention.

With reference to FIG. 23, reference numeral 1 designates a silicon substrate which is a semiconductor substrate and has a p-tape well (not shown) of the first conductivity type; 2 designates an isolation field oxide film formed on the surface of the silicon substrate 1; 3 designates a gate oxide film which is a first insulating layer and is formed on the principal surface of the silicon substrate 1; and 4y designates a gate electrode formed on the gate oxide film 3. Reference numeral 5 designates a source/drain region which is formed on the surface of the silicon substrate 1 while a channel region (not shown) sandwiched between them, and which is a first low impurity-concentration region of the second conductivity type (i.e., an n-type). Side wall insulating material 6y consisting of a second insulating layer is formed on each side of the gate electrode 4y.

Reference numeral 20 designates a silicon dioxide film which is formed on the silicon substrate 1 and serves as a third insulating layer; and 21 designates a contact hole formed in the silicon dioxide film 20 to such an extent as to reach the source/drain region 5. A bit line 90 which is a conductor routing and consists of two conductive layers 22 and 23 is formed along the inside of the contact hole 21. Reference numeral 24 designates a silicon dioxide layer which is an insulating layer formed on the third insulating layer 20; and 25 designates a contact hole formed in the insulating layer 24 and the third insulating layer 20 to such an extent as to reach the source/drain region 5. A first recess 52 is formed in the area of the source/drain region 5 to which the contact hole 25 is formed. Further, an impurity region 53 of the second conductivity type (i.e., then-type) is formed below the first recess 52. A storage node 26 which is a lower electrode of a capacitor is formed within the contact hole 25 and the first recess 52. A dielectric film 27 of the capacitor is formed on the storage node 26, and a cell plate 28 which is an upper electrode of the capacitor is further formed on the dielectric film 27. A capacitor 92 is formed from the lower electrode 26, the dielectric film 27, and the upper electrode 28.

With reference to FIGS. 24 to 32, a method of manufacturing the semiconductor device mentioned above will be described.

FIGS. 24 through 32 are cross-sectional views showing the first through ninth steps in the process for manufacturing the semiconductor device in FIG. 23.

Figure 24:
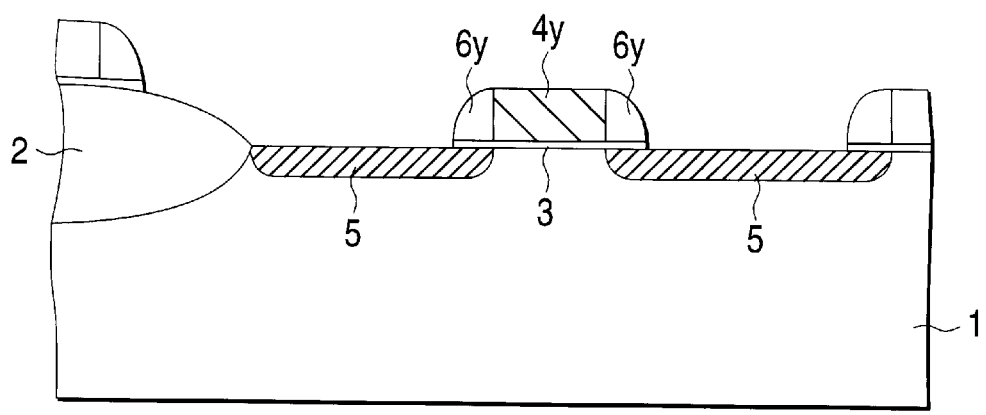
FIG. 24 is a cross-sectional view showing the first step of the process for manufacturing the semiconductor device in accordance with the fifth embodiment.

After the isolation field oxide film 2 has been formed on the surface of the silicon substrate 1 which is a semiconductor substrate, a well (not shown) of the first conductivity type (or the p-type) is formed. Subsequently, as shown in FIG. 24, the gate oxide film 3 which serves as the first insulating layer 1, the gate electrode 4y, the first impurity region 5 of the n-type (or the second conductivity type), and the side wall insulating material 6y are formed on the surface of the silicon substrate 1 by way of the process from the step shown in FIG. 3 to the step shown in FIG. 7 which has been described in the first embodiment.

Figure 25:
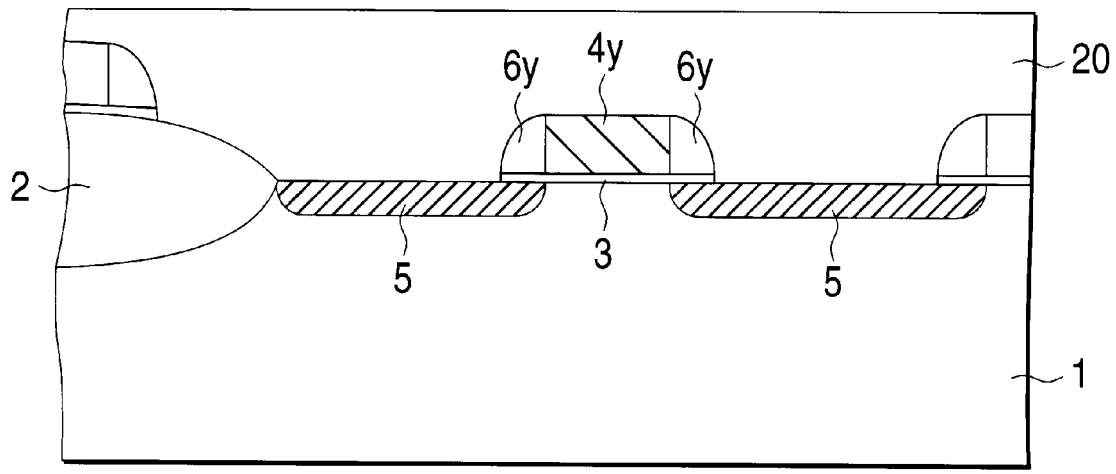
FIG. 25 is a cross-sectional view showing the second step of the process for manufacturing the semiconductor device in accordance with the fifth embodiment.
Figure 26:
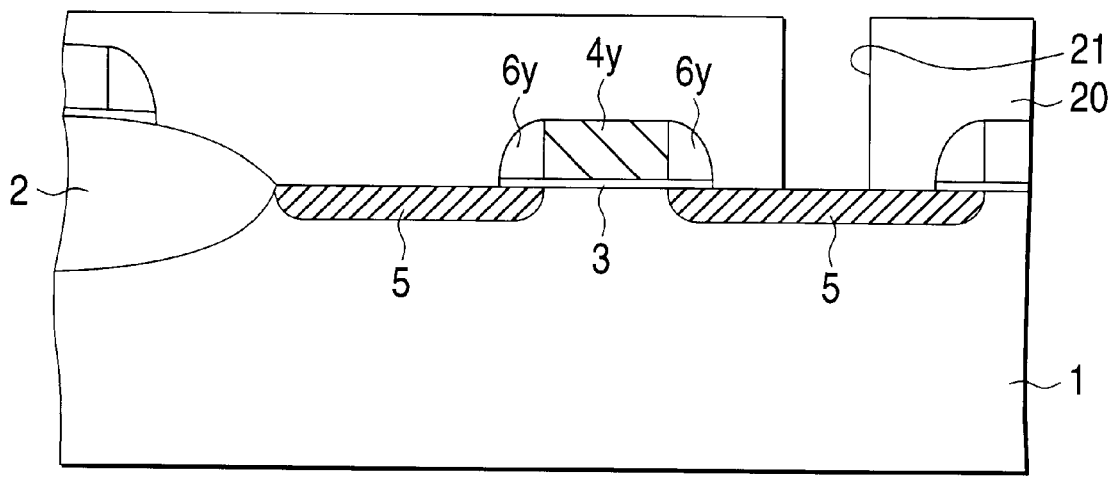
FIG. 26 is a cross-sectional view showing the third step of the process for manufacturing the semiconductor device in accordance with the fifth embodiment.
Figure 27:
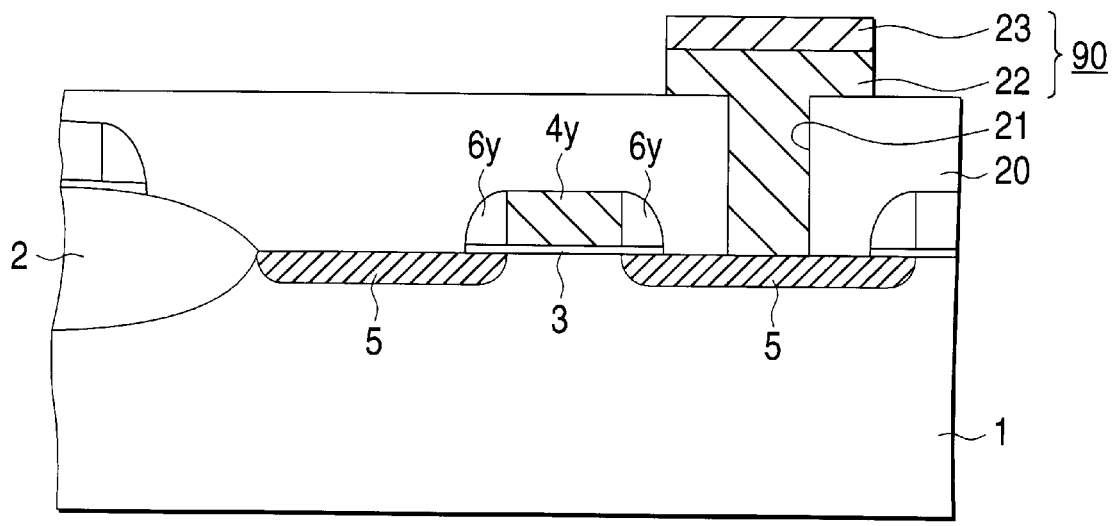
FIG. 27 is a cross-sectional view showing the fourth step of the process for manufacturing the semiconductor device in accordance with the fifth embodiment.

In reference to FIG. 25, the silicon dioxide film 20 is formed over the entire surface of the silicon substrate 1 to a thickness of about 7000 A by CVD. As shown in FIG. 26, the contact hole 21 is then formed in this silicon dioxide film 20 to such an extent as to reach the source/drain region 5. Impurity-containing polysilicon is deposited on the silicon dioxide film 20 to a thickness of about 800 A by CVD, and tungsten silicide (WSi) is deposited on the polysilicon to a thickness of about 700 A by CVD. This substrate is then subjected to photolithography and etching through use of a resist. As a result, as shown in FIG. 27, the bit line 90 consisting of the impurity-containing polysilicon layer pattern 22 and the tungsten silicide layer pattern 23 is formed in the contact hole 21 so as to be electrically connected to the source/drain region 5.

Figure 28:
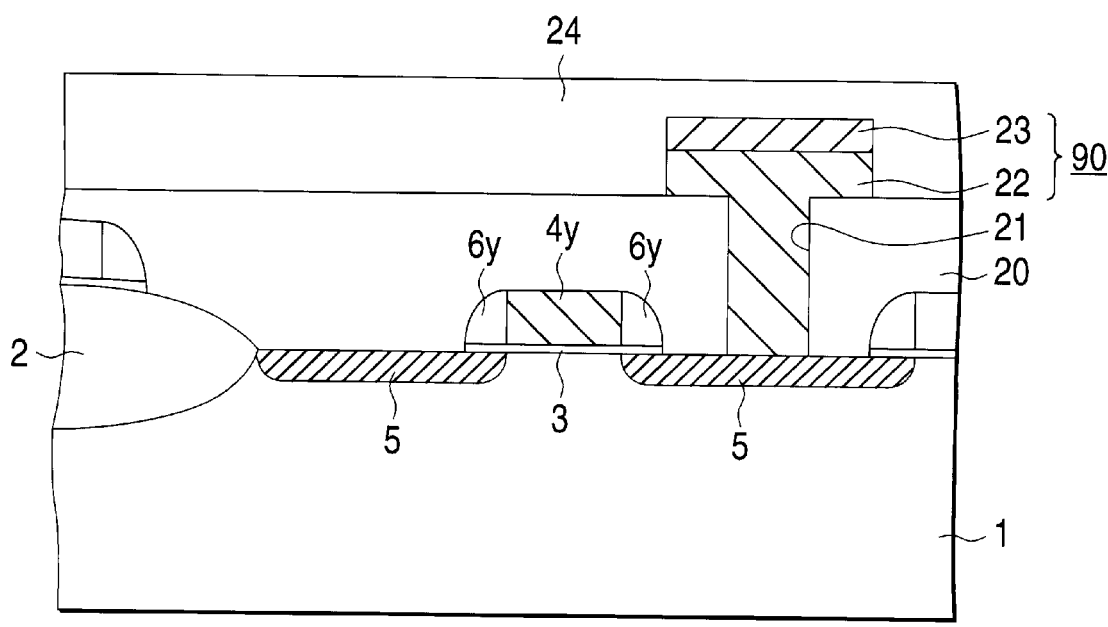
FIG. 28 is a cross-sectional view showing the fifth step of the process for manufacturing the semiconductor device in accordance with the fifth embodiment.
Figure 29:
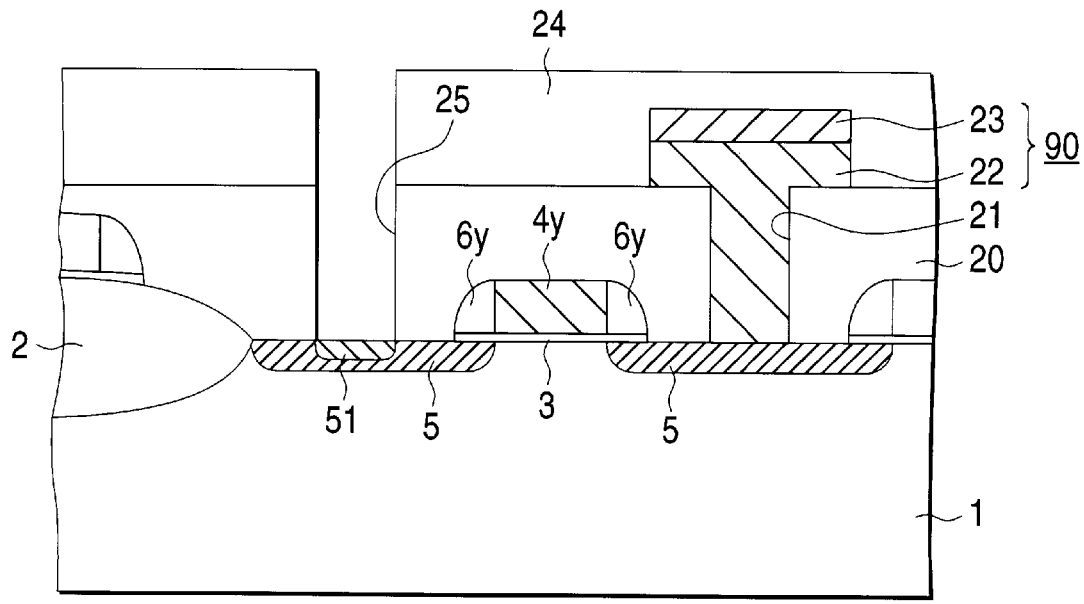
FIG. 29 is a cross-sectional view showing the sixth step of the process for manufacturing the semiconductor device in accordance with the fifth embodiment.
Figure 30:
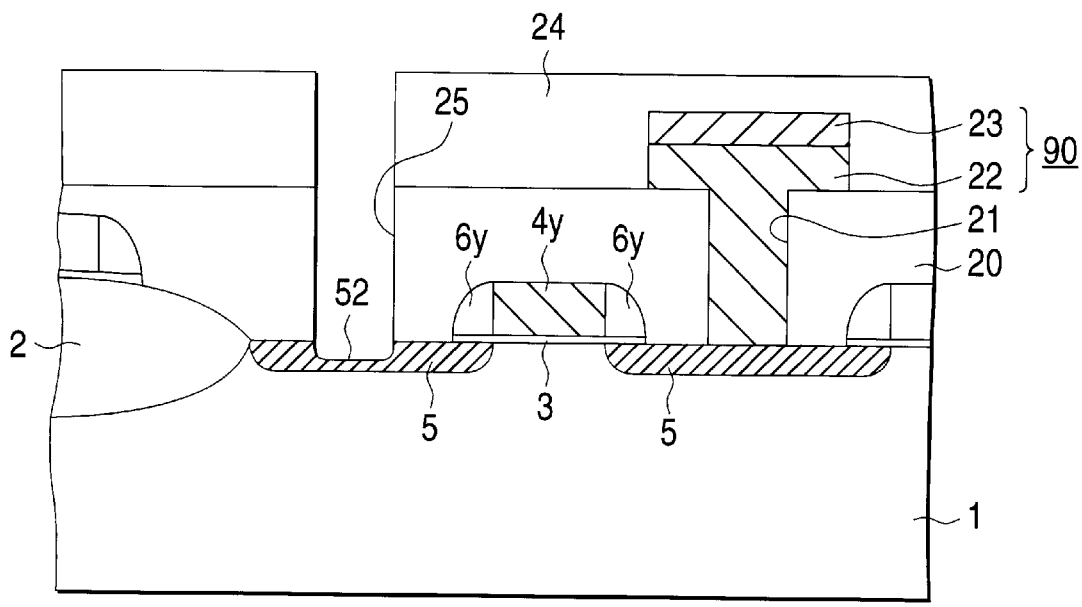
FIG. 30 is a cross-sectional view showing the seventh step of the process for manufacturing the semiconductor device in accordance with the fifth embodiment.
Figure 31:
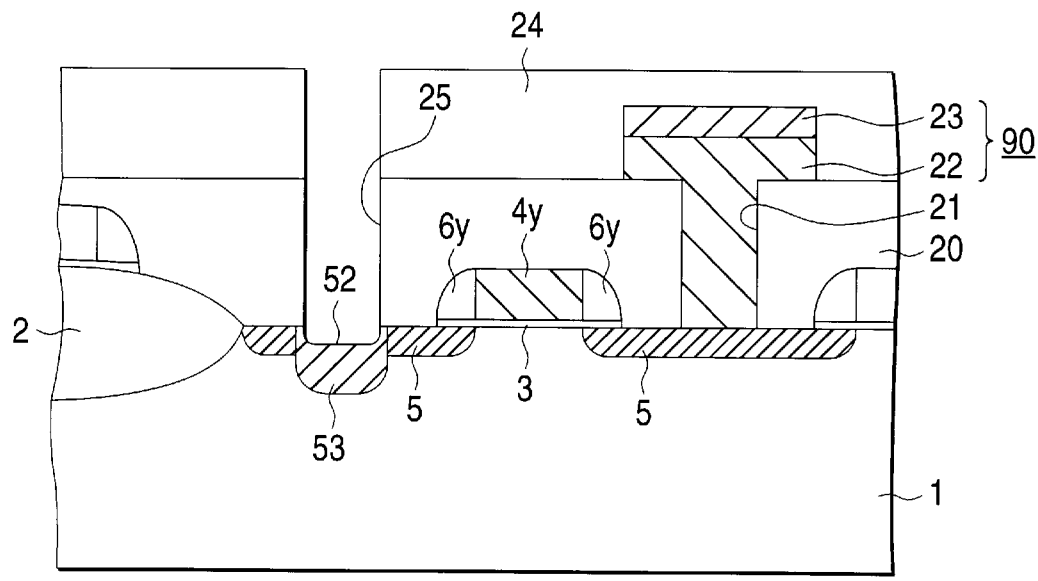
FIG. 31 is a cross-sectional view showing the eighth step of the process for manufacturing the semiconductor device in accordance with the fifth embodiment.

With reference to FIG. 28, the silicon dioxide film 24 is formed to a thickness of about 7000 A on the silicon dioxide film 20 and the bit line 90 by CVD. As shown in FIG. 29, the contact hole 25 is formed in the silicon dioxide films 24 and 20 to such an extent as to reach the source/drain region 5. If the surface of the silicon substrate 1 is exposed to the etching gas during the course of the formation of the contact hole 25, the damaged layer 51 is formed in the area of the source/drain-region 5 where the opening of the contact hole 25 is formed. With reference to FIG. 30, this damaged layer 51 is removed by CDE, so that a first recess 52 is formed to have a depth of about 500 A in the area of the source/drain region 5 where the opening of the contact hole 25 is formed. Subsequently, as shown in FIG. 31, phosphorous (P) ions are implanted into the first recess 52 at 150 keV with a dose of $5 \times 10^{13}/cm^2$ using the silicon dioxide film 24 as a mask, whereby an n-type impurity region 53 is formed below the first recess 52.

Figure 32:
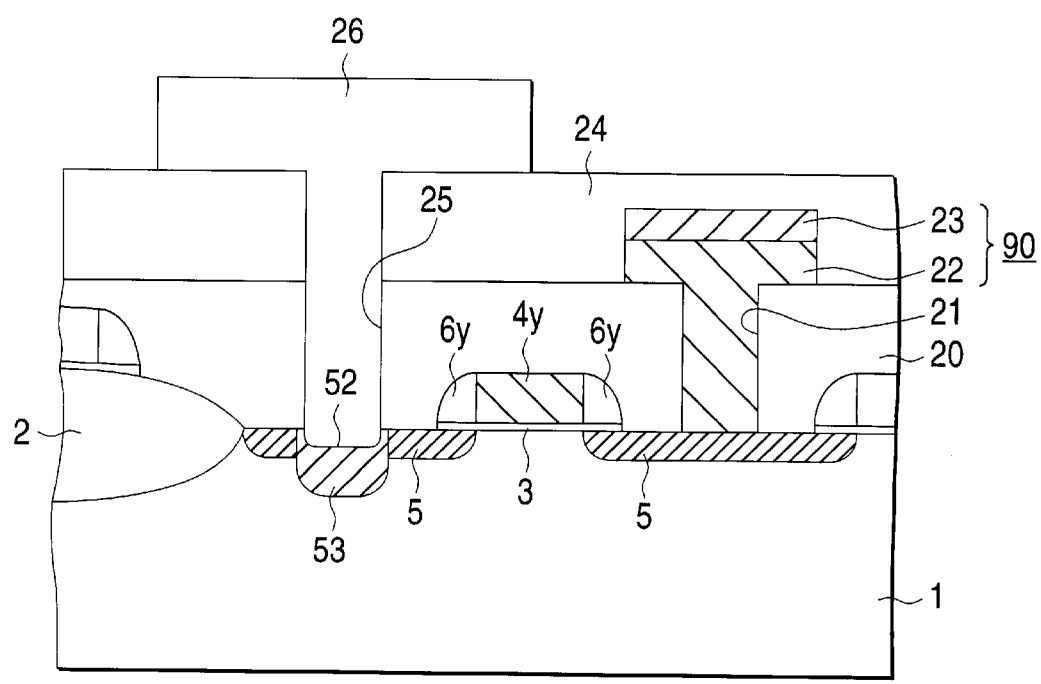
FIG. 32 is a cross-sectional view showing the ninth step of the process for manufacturing the semiconductor device in accordance with the fifth embodiment.

Impurity-containing polysilicon is then deposited on the silicon dioxide film 24 to a thickness of about 8000 A. This substrate is then subjected to photolithography and etching through use of a resist. As shown in FIG. 32, the storage node 26 which is electrically connected to the low impurity-concentration region 10 is formed in the contact hole 25 and the first recess 52. The silicon oxynitride (SiON) layer 27 which is a dielectric film of the capacitor is formed to a thickness of about 70 A on the storage node 26 by CVD, and the impurity-containing polysilicon layer 28 which is a cell plate is further formed to a thickness of about 500 A on the silicon oxynitride layer 27. In the end, the semiconductor device shown in 23 is fabricated. It goes without saying that there are further required steps to create inter-layer insulating films, contact holes, and conductor routing in order to fabricate the thus-formed semiconductor device into an LSI element.

As described above, in the semiconductor device and its manufacturing method in accordance with the fifth embodiment, the damaged layer 51 formed on the surface of the source/drain region 5 during the formation of the contact hole 25 is removed by forming the first recess 52 in the area of the source/drain region 5 where the opening of the contact hole 25 to be used for a storage node is formed. As a result, the leakage current developing in a lower part of the storage node in the vicinity of the junction between the silicon substrate 1 and the source/drain region 5 is reduced, so that the superior characteristics of the junction are obtained. The electric charges stored in the capacitor are not discharged to the outside, and hence the refreshing characteristics of the semiconductor device are improved. Further, the characteristics of the junction between the silicon substrate 1 and the source/drain region 5 which acts as an insulator when reverse bias is applied are improved. In addition, the impurity region 53 that is the same in conductivity type as the source/drain region 5 is formed below the first recess 52, so that an increase in the resistance of the source/drain region 5 which would otherwise be caused by the removal of the damaged layer 51 can be prevented. Therefore, DRAM which operates fast and stable can be achieved.

The characteristics of the junction between the source/drain region 5, the impurity region consisting of the impurity region 53, and the silicon substrate 1, and the electrical resistance of the impurity region are determined by the source/drain region 5 and the impurity region 53. Accordingly, there are prevented variations in the etch rate required for removal of the damaged layer 51 which would otherwise cause variations in the characteristics of the junction between the source/drain region and the silicon substrate 1 or in the electrical resistance of the source/drain region, so a reduction in the manufacturing yield of the semiconductor device can be prevented to a much greater extent.

Although the explanation provided in the fifth embodiment has been given of the case where the first recess 52 is formed at a depth of about 500 A in the area of the source/drain region 5 where the opening of the contact hole 25 is opened, the depth ranging from 0.03 μm to 0.1 μm is sufficient for the first recess 52. If this is the case, there are ensured the same driving capability and punch-through withstand voltage as those of the semiconductor device without a recess, and therefore the same effects as those obtained in the previous embodiments will be ensured.

Although the explanation provided in the fifth embodiment has been given of the case where the p-type well and the n-type source/drain region are formed on the silicon substrate, and where the n-type impurity region is formed below the first recess 52, an impurity region of the p-type may be formed below the first recess 52 on the silicon substrate having an n-type well and a p-type source/drain region. Even in this case, the same effects as those obtained in the previous embodiments will be ensured.

Further, it goes without saying that the present invention can be also applied to a case where transistors are directly formed on the surface of a semiconductor substrate without forming a well.

Sixth Embodiment

In a sixth embodiment of the present invention, the p-type well was formed as a retrograde type well in the silicon substrate 1 of the fifth embodiment by implanting boron (B) ions into the silicon substrate 1 under the three conditions; namely, at 700 keV with a dose of $1\times10^{13}/cm^2$, 100 keV with a dose of $3\times10^{12}/cm^2$, and 50 keV with a dose of $5\times10^{12}/cm^2$. In other respects, the sixth embodiment is the same in structure and manufacture as the fifth embodiment shown in FIGS. 23 to 34. The source/drain region 5 consisting of an n-type low impurity-concentration region is formed on the surface of the silicon substrate 1 by implanting arsenic (As) ions at 50 keV with a dose of $5\times10^{13}/cm^2$. Further, the n-type impurity region 53 is formed below the first recess 52 by implanting phosphorous (P) ions at 150 keV with a dose of $5\times10^{13}/cm^2$.

Figure 33:
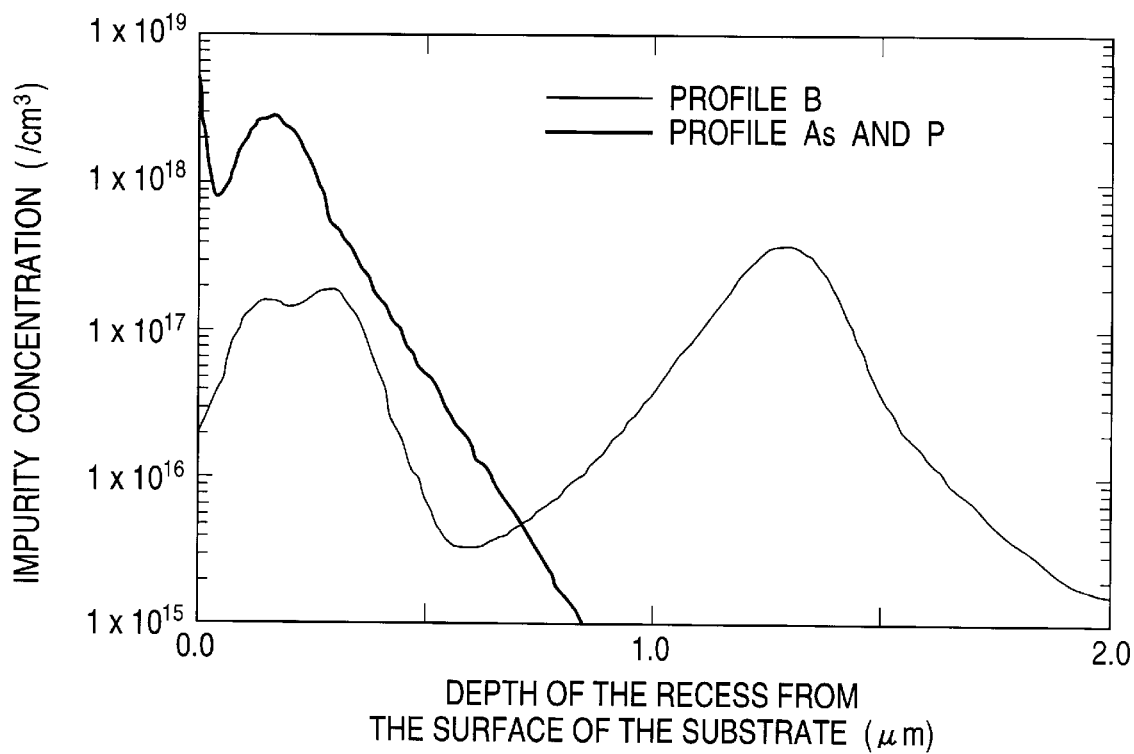
FIG. 33 is a plot showing the distribution of impurity concentrations in the depthwise direction in the first recess of a semiconductor device in accordance with a sixth embodiment of the present invention.
Figure 34:
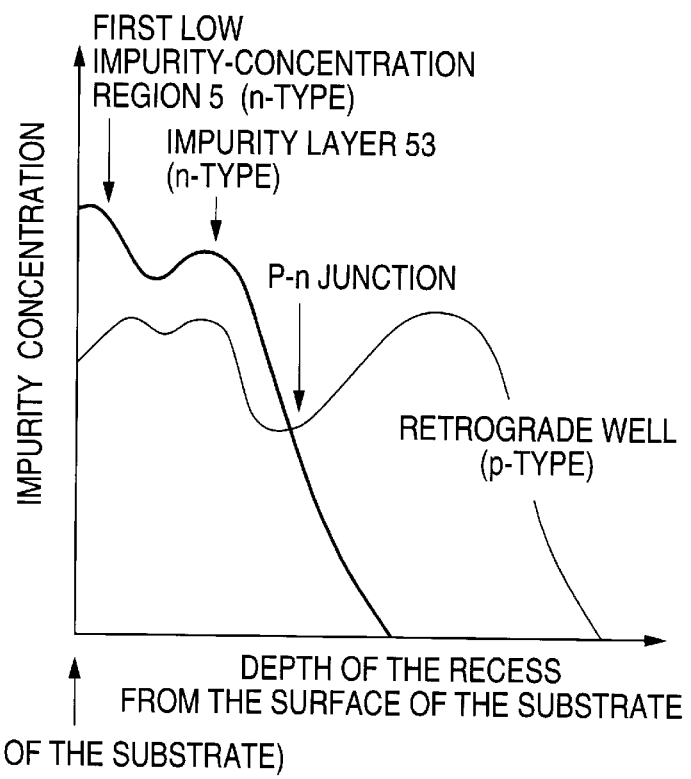
FIG. 34 is a schematic representation of the distribution of impurity concentrations in the depthwise direction in the first recess of the semiconductor device in accordance with the sixth embodiment.

FIG. 33 is a plot showing the distribution of impurity concentrations in the depthwise direction within the first recess 52 of the semiconductor device in accordance with the sixth embodiment. FIG. 34 is a schematic representation of the distribution of impurity concentrations in FIG. 33. As can be seen from FIG. 34, the position of the p-n junction between the impurity region 53 and the p-type well can be changed by changing the concentration of impurities in the impurity region 53 formed below the first recess 52. As shown in FIG. 34, if the p-n junction is located in the valley in the distribution of impurity concentrations of the p-type well, the impurity concentration of the p-n junction can be minimized. As can be seen from FIG. 33, such an optimum state is substantially achieved already in the semiconductor device in accordance with the fifth embodiment. As indicated by the well-known Poisson Equation, the intensity of an electric field in the p-n junction is proportional to the concentration of impurities in the p-n junction. In contrast, in the semiconductor device in accordance with the fifth embodiment, the concentration of impurities in the p-n junction can be substantially minimized as shown in FIG. 33. Therefore, the intensity of the electric field in the p-n junction between the impurity region 53 and p-type well can be also substantially minimized. As a result, the withstand voltage of the junction can be increased, and the leakage current developing in the junction can be reduced.

Needless to say, the semiconductor device and its manufacturing method in accordance with the sixth embodiment yield all the same effects as those produced by the previous fifth embodiment.

Although the explanation provided in the sixth embodiment has been given of the case where the first recess 52 is formed at a depth of about 500 A in the area of the source/drain region 5 where the opening of the contact hole 25 is opened, the depth ranging from 0.03 µm to 0.1 µm is sufficient for the first recess 52. If this is the case, there are ensured the same driving capability and punch-through withstand voltage as those of the semiconductor device without a recess, and therefore the same effects as those obtained in the previous embodiments will be ensured.

Although the explanation provided in the sixth embodiment has been given of the case where the p-type well and the n-type source/drain region are formed on the silicon substrate, and where the n-type impurity region is formed below the first recess 52, an impurity region of the p-type may be formed below the first recess 52 on the silicon substrate having an n-type well and a p-type source/drain region. Even in this case, the same effects as those obtained in the previous embodiments will be ensured.

Seventh Embodiment

With reference to FIGS. 35 through 44, a seventh embodiment of the present invention will be described.

Figure 35:
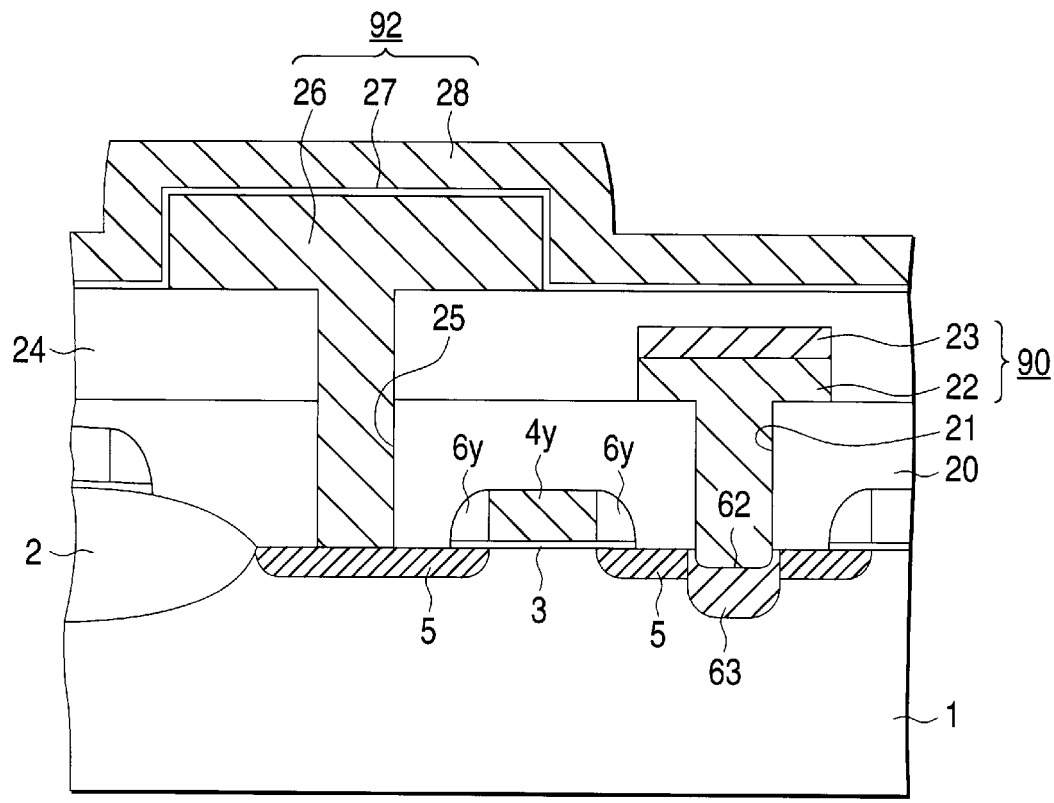
FIG. 35 is a cross-sectional view showing a semiconductor device in accordance with a seventh embodiment of the present invention.

FIG. 35 is a cross-sectional view showing a semiconductor device in accordance with the seventh embodiment of the present invention.

With reference to FIG. 35, reference numeral 1 designates a silicon substrate which is a semiconductor substrate and has a p-type well (not shown) of the first conductivity type; 2 designates an isolation field oxide film formed on the surface of the silicon substrate 1; 3 designates a gate oxide film which is a first insulating layer and is formed on the principal surface of the silicon substrate 1; and 4y designates a gate electrode formed on the gate oxide film 3. Reference numeral 5 designates a source/drain region which is formed on the surface of the silicon substrate 1 while a channel region (not shown) sandwiched between them, and which is a low impurity-concentration region of the second conductivity type (i.e., ann-type). Side wall insulating material 6y consisting of a second insulating layer is formed on each side of the gate electrode 4y.

Reference numeral 20 designates a silicon dioxide film which is formed on the silicon substrate 1 and serves as a third insulating layer; and 21 designates a contact hole formed in the silicon dioxide film 20 to such an extent as to reach the source/drain region 5. A first recess 62 is formed in the area of the source/drain region 5 where the opening of the contact hole 21 is formed, and an impurity region 63 of the second conductivity type (i.e., the n-type) is formed below the first recess 62. A bit line 90 which is a conductor routing and consists of two conductive layers 22 and 23 is formed along the inside of the contact hole 21 and the first recess 62. Reference numeral 24 designates a silicon dioxide layer which is an insulating layer formed on the third insulating layer 20; and 25 designates a contact hole formed in the insulating layer 24 and the third insulating layer 20 to such an extent as to reach the source/drain region 5. A storage node 26 which is a lower electrode of a capacitor is formed within the contact hole 25. A dielectric film 27 of the capacitor is formed on the storage node 26, and a cell plate 28 which is an upper electrode of the capacitor is further formed on the dielectric film 27. A capacitor 92 is formed from the lower electrode 26, the dielectric film 27, and the upper electrode 28.

With reference to FIGS. 36 to 44, a method of manufacturing the semiconductor device mentioned above will be described.

FIGS. 36 through 44 are cross-sectional views showing the first through ninth steps in the process for manufacturing the semiconductor device in FIG. 35.

Figure 36:
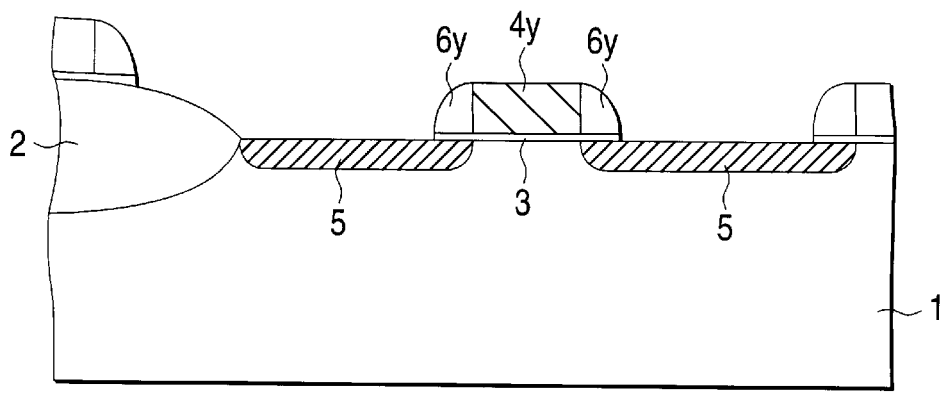
FIG. 36 is a cross-sectional view showing the first step of the process for manufacturing the semiconductor device in accordance with the seventh embodiment.

After the isolation field oxide film 2 has been formed on the surface of the silicon substrate 1 which is a semiconductor substrate, a well (not shown) of the first conductivity type (or the p-type) is formed. Subsequently, as shown in FIG. 36, the gate oxide film 3 which serves as the first insulating layer 1, the gate electrode 4y, the first impurity region 5 of the n-type (or the second conductivity type), and the side wall insulating material 6y are formed on the surface of the silicon substrate 1 by way of the process from the step shown in FIG. 3 to the step shown in FIG. 7 which has been described in the first embodiment.

Figure 37:
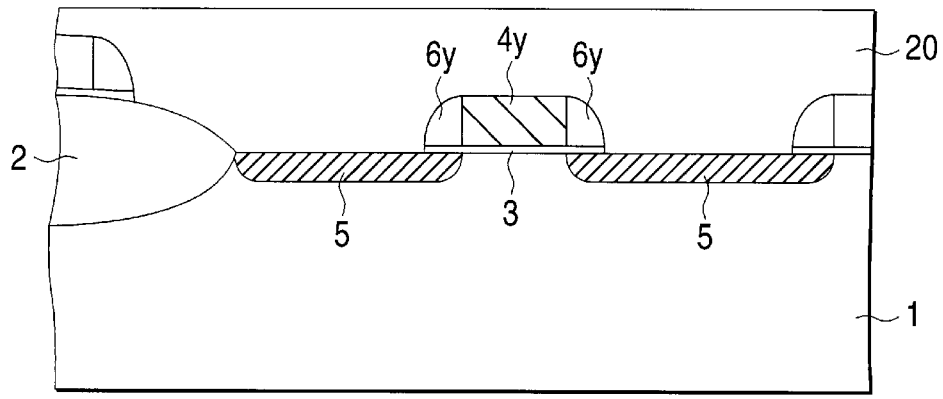
FIG. 37 is a cross-sectional view showing the second step of the process for manufacturing the semiconductor device in accordance with the seventh embodiment.
Figure 38:
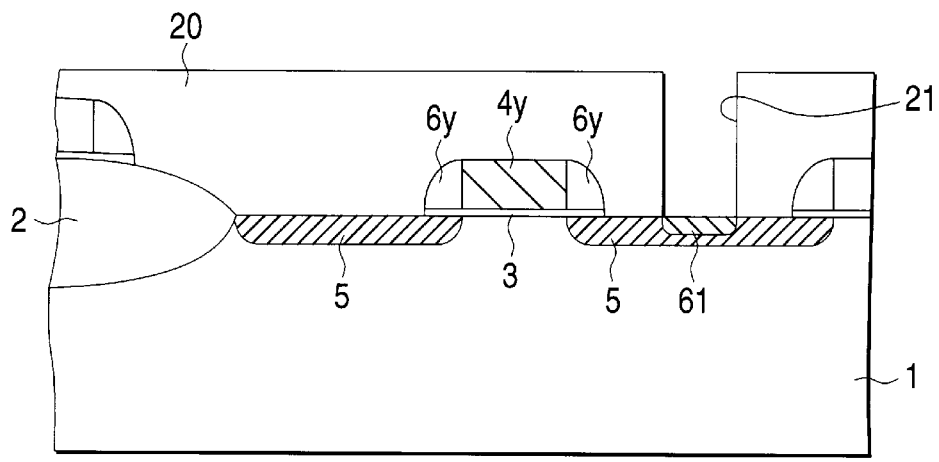
FIG. 38 is a cross-sectional view showing the third step of the process for manufacturing the semiconductor device in accordance with the seventh embodiment.
Figure 39:
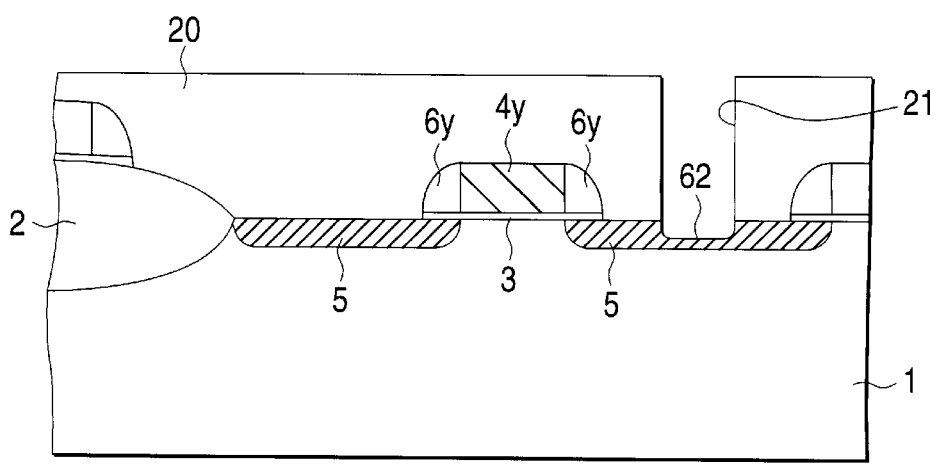
FIG. 39 is a cross-sectional view showing the fourth step of the process for manufacturing the semiconductor device in accordance with the seventh embodiment.
Figure 40:
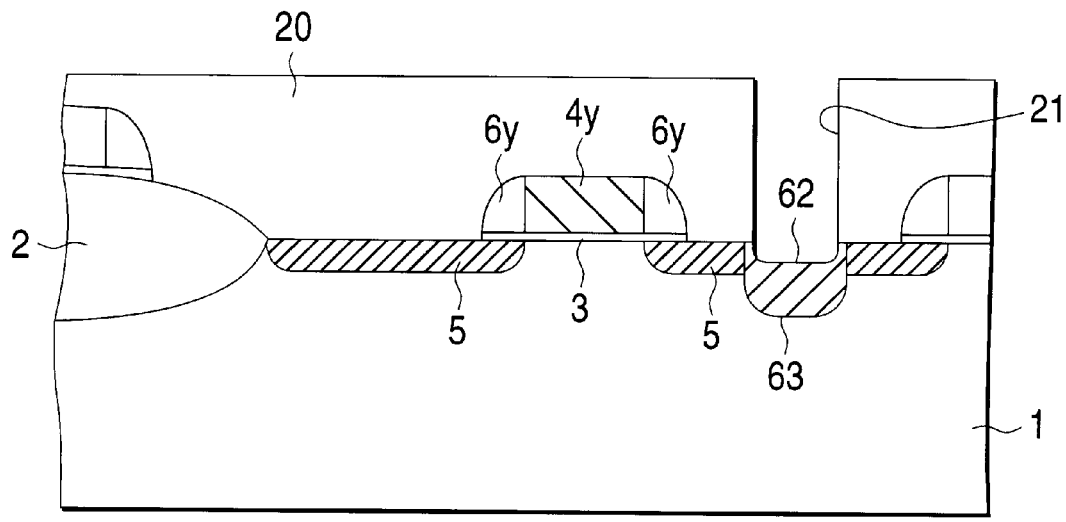
FIG. 40 is a cross-sectional view showing the fifth step of the process for manufacturing the semiconductor device in accordance with the seventh embodiment.

In reference to FIG. 37, the silicon dioxide film 20 is formed over the entire surface of the silicon substrate 1 to a thickness of about 7000 A by CVD. As shown in FIG. 38, the contact hole 21 is then formed in this silicon dioxide film 20 to such an extent as to reach the source/drain region 5. If the surface of the silicon substrate 1 is exposed to the etching gas during the course of the formation of the contact hole 21, a damaged layer 61 is formed in the area of the source/drain region 5 where the opening of the contact hole 21 is formed. With reference to FIG. 39, this damaged layer 61 is removed by CDE, so that a first recess 62 is formed to have a depth of about 500 A in the area of the source/drain region 5 where the opening of the contact hole 21 is formed. Subsequently, as shown in FIG. 40, phosphorous (P) ions are implanted into the first recess 62 at 150 keV with a dose of $5 \times 10^{13}/cm^2$ using the silicon dioxide film 21 as a mask, whereby an n-type impurity region 63 is formed below the first recess 62.

Figure 41:
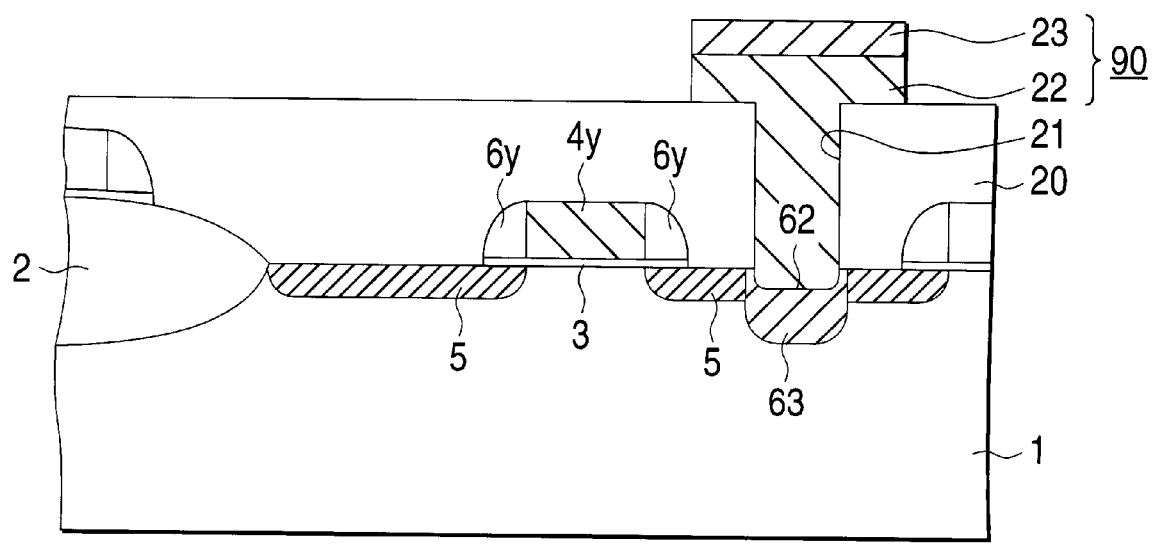
FIG. 41 is a cross-sectional view showing the sixth step of the process for manufacturing the semiconductor device in accordance with the seventh embodiment.

Impurity-containing polysilicon is deposited on the silicon dioxide film 20 to a thickness of about 800 A by CVD, and tungsten silicide (WSi) is deposited on the polysilicon to a thickness of about 700 A by CVD. This substrate is then subjected to photolithography and etching through use of a resist. As a result, as shown in FIG. 41, the bit line 90 consisting of the impurity-containing polysilicon layer pattern 22 and the tungsten silicide layer pattern 23 is formed in the contact hole 21 so as to be electrically connected to the source/drain region 5.

Figure 42:
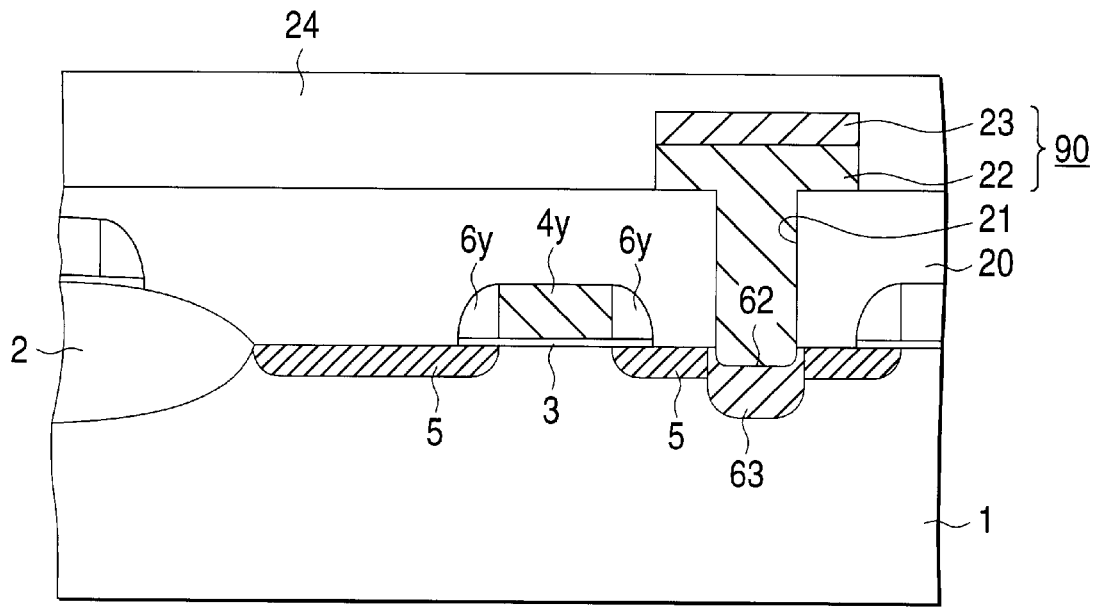
FIG. 42 is a cross-sectional view showing the seventh step of the process for manufacturing the semiconductor device in accordance with the seventh embodiment.
Figure 43:
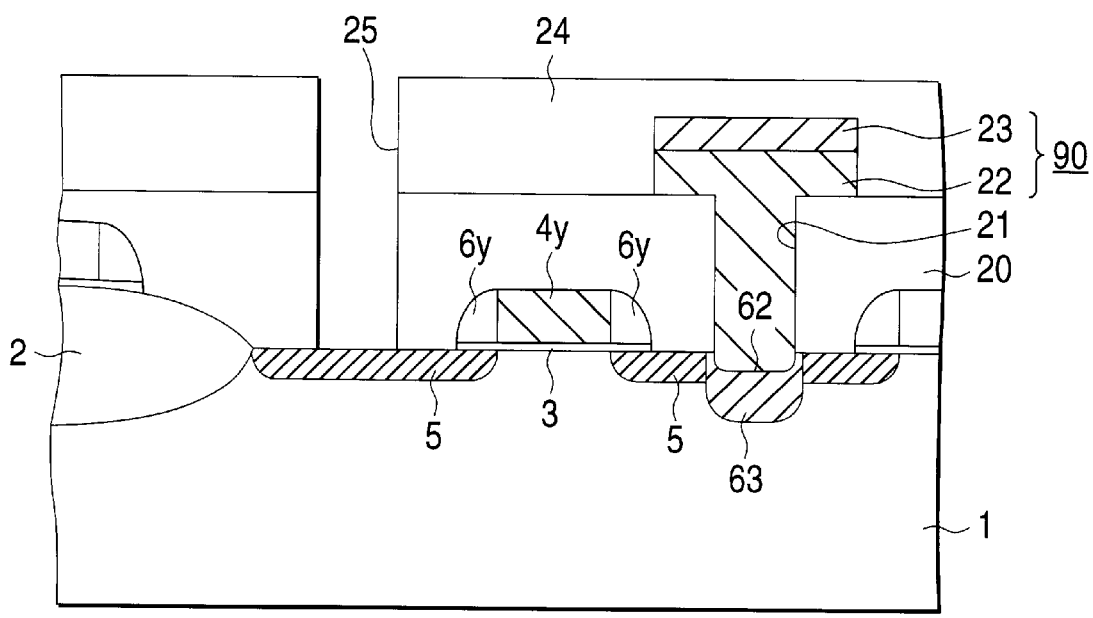
FIG. 43 is a cross-sectional view showing the eighth step of the process for manufacturing the semiconductor device in accordance with the seventh embodiment.
Figure 44:
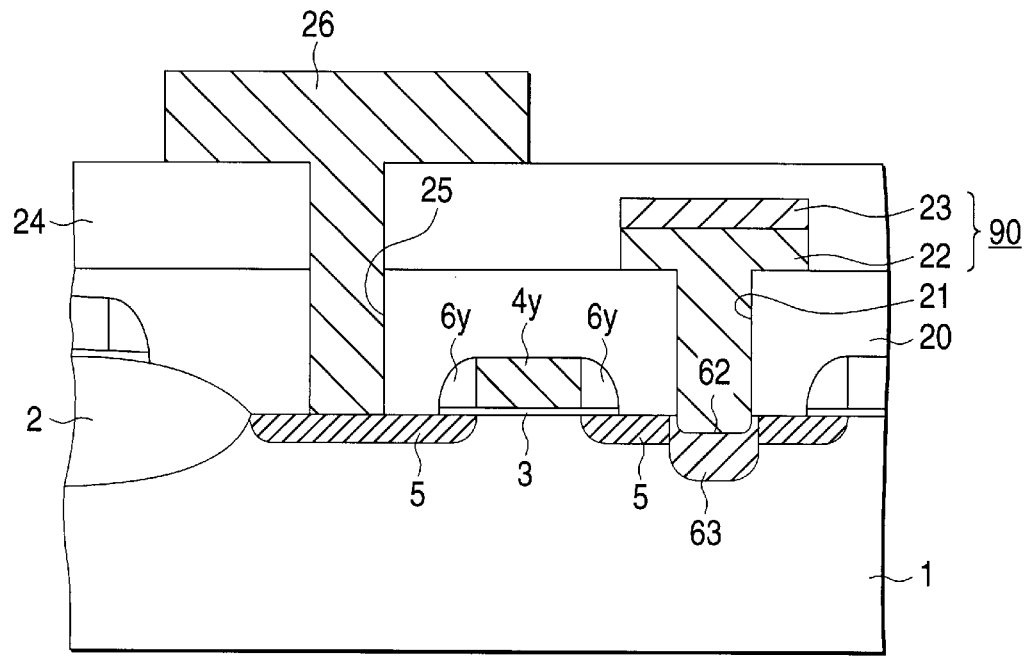
FIG. 44 is a cross-sectional view showing the ninth step of the process for manufacturing the semiconductor device in accordance with the seventh embodiment.

With reference to FIG. 42, the silicon dioxide film 24 is formed to a thickness of about 7000 A on the silicon dioxide film 20 and the bit line 90 by CVD. As shown in FIG. 43, the contact hole 25 is formed in the silicon dioxide films 24 and 20 to such an extent as to reach the source/drain region 5. Subsequently, impurity-containing polysilicon is then deposited on the silicon dioxide film 24 to a thickness of about 8000 A. This substrate is then subjected to photolithography and etching through use of a resist. As shown in FIG. 44, the storage node 26 which is electrically connected to the low impurity-concentration region 10 is formed in the contact hole 25. The silicon oxynitride (SiON) layer 27 which is a dielectric film of the capacitor is formed to a thickness of about 70 A on the storage node 26 by CVD, and the impurity-containing polysilicon layer 28 which is a cell plate is further formed to a thickness of about 500 A on the silicon oxynitride layer 27. In the end, the semiconductor device shown in FIG. 35 is fabricated. It goes without saying that there are further required steps to create inter-layer insulating films, contact holes, and conductor routing in order to fabricate the thus-formed semiconductor device into an LSI element.

As described above, in the semiconductor device and its manufacturing method in accordance with the seventh embodiment, the damaged layer 61 formed on the surface of the source/drain region 5 during the formation of the contact hole 21 is removed by forming the first recess 62 in the area of the source/drain region 5 where the opening of the contact hole 21 to be used as a bit line is formed. As a result, the leakage current developing in a lower part of the bit line in the vicinity of the junction between the silicon substrate 1 and the source/drain region 5 is reduced, so that the superior characteristics of the junction are obtained. The characteristics of the junction between the silicon substrate 1 and the source/drain region 5 which acts as an insulator when reverse bias is applied are improved. In addition, the impurity region 63 that is the same in conductivity type as the source/drain region 5 is formed below the first recess 62, so that an increase in the resistance of the source/drain region 5 which would otherwise be caused by the removal of the damaged layer 61 can be prevented. Therefore, the characteristics of a contact on the bit line can be improved, and DRAM which requires reduced power consumption and operates fast and stable can be achieved.

The characteristics of the junction between the source/drain region 5, the impurity region consisting of the impurity region 63, and the silicon substrate 1, and the electrical resistance of the impurity region are determined by the source/drain region 5 and the impurity region 63. Accordingly, there are prevented variations in the etch rate required for removal of the damaged layer 61 which would otherwise cause variations in the characteristics of the junction between the source/drain region 5 and the silicon substrate 1 or in the electrical resistance of the source/drain region, so a reduction in the manufacturing yield of the semiconductor device can be prevented to a much greater extent.

Although the explanation provided in the seventh embodiment has been given of the case where the first recess 62 is formed at a depth of about 500 A in the area of the source/drain region 5 where the opening of the contact hole 21 to be used as a bit line is formed, the depth ranging from 0.03 μm to 0.1 μm is sufficient for the first recess 62. If this is the case, there are ensured the same driving capability and punch-through withstand voltage as those of the semiconductor device without a recess, and therefore the same effects as those obtained in the previous embodiments will be ensured.

Although the explanation provided in the seventh embodiment has been given of the case where the p-type well and the n-type source/drain region are formed on the silicon substrate, and where the n-type impurity region is formed below the first recess 62, an impurity region of the p-type may be formed below the first recess 62 on the silicon substrate having an n-type well and a p-type source/drain region. Even in this case, the same effects as those obtained in the previous embodiments will be ensured.

Eighth Embodiment

In an eighth embodiment of the present invention, the p-type well was formed as a retrograde type well in the silicon substrate 1 of the seventh embodiment by implanting boron (B) ions into the silicon substrate 1 under the three conditions; namely, at 700 keV with a dose of $1 \times 10^{13}/cm^2$, 100 keV with a dose of $3 \times 10^{12}/cm^2$, and 50 keV with a dose of $5 \times 10^{12}/cm^2$. In other respects, the eighth embodiment is the same in structure and manufacture as the seventh embodiment shown in FIGS. 35 to 44. The source/drain region 5 consisting of an n-type low impurity-concentration region is formed on the surface of the silicon substrate 1 by implanting arsenic (As) ions at 50 keV with a dose of $5 \times 10^{13}/cm^2$. Further, the n-type impurity region 63 is formed below the first recess 62 by implanting phosphorous (P) ions at 150 keV with a dose of $5 \times 10^{13}/cm^2$.

As described above, the semiconductor device and the method of manufacturing it in accordance with the eighth embodiment yield the following effects in addition to the effects obtained in the seventh embodiment. More specifically, as has been described in the sixth embodiment with reference to FIGS. 33 and 34, the concentration of impurities in the p-n junction between the impurity region 63 and the p-type well can be substantially minimized. Therefore, the intensity of the electric field in the p-n junction can be also substantially minimized. As a result, the withstand voltage of the junction can be increased, and the leakage current developing in the junction can be reduced.

Although the explanation provided in the eighth embodiment has been given of the case where the first recess 62 is formed at a depth of about 500 A in the area of the source/drain region 5 where the opening of the contact hole 21 to be used as a bit line is formed, the depth ranging from 0.03 μm to 0.1 μm is sufficient for the first recess 62. If this is the case, there are ensured the same driving capability and punch-through withstand voltage as those of the semiconductor device without a recess, and therefore the same effects as those obtained in the previous embodiments will be ensured.

Although the explanation provided in the eighth embodiment has been given of the case where the p-type well and the n-type source/drain region are formed on the silicon substrate, and where the n-type impurity region is formed below the first recess 62, an impurity region of the p-type may be formed below the first recess 62 on the silicon substrate having an n-type well and a p-type source/drain region. Even in this case, the same effects as those obtained in the previous embodiments will be ensured.

Ninth Embodiment

With reference to FIGS. 45 through 50, a ninth embodiment of the present invention will be described.

Figure 45:
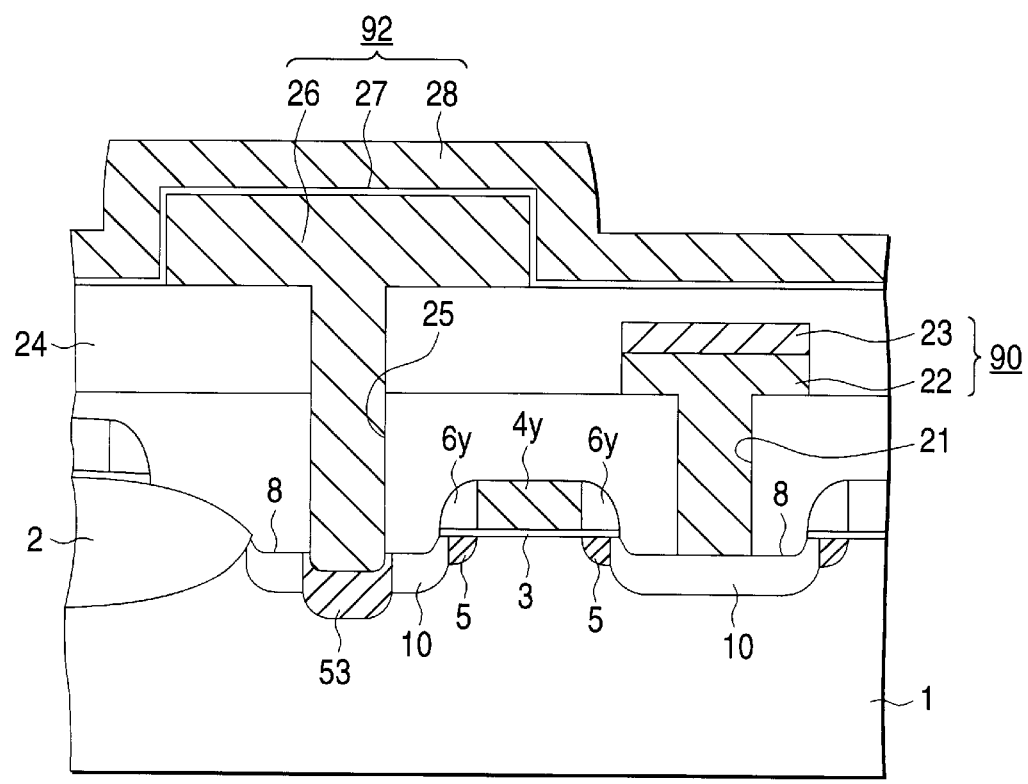
FIG. 45 is a cross-sectional view showing a semiconductor device in accordance with a ninth embodiment of the present invention.

FIG. 45 is a cross-sectional view showing a semiconductor device in accordance with the ninth embodiment of the present invention.

With reference to FIG. 45, reference numeral 1 designates a silicon substrate which is a semiconductor substrate and has a p-type well (not shown) of the first conductivity type; 2 designates an isolation field oxide film formed on the surface of the silicon substrate 1; 3 designates a gate oxide film which is a first insulating layer and is formed on the principal surface of the silicon substrate 1; and 4y designates a gate electrode formed on the gate oxide film 3. Reference numeral 5 designates a first low impurity-concentration region of the n-type (or the second conductivity type) which is formed on the surface of the silicon substrate 1 while a channel region (not shown) sandwiched between them. Side wall insulating material 6y is formed on each side of the gate electrode 4y. A second recess 8 is formed on the first low impurity-concentration region 5 with the exception of the area immediately below the side wall insulating material 6y. A second low impurity-concentration region 10 of the n-type is formed below the second recess 8. The first low impurity-concentration region 5 and the second low impurity-concentration region 10 constitute the source/drain region.

Reference numeral 20 designates a silicon dioxide film which is formed on the silicon substrate 1 and serves as a third insulating layer; and 21 designates a contact hole formed in the silicon dioxide film 20 to such an extent as to reach the low impurity-concentration region 10. A bit line 90 which is a conductor routing and consists of two conductive layers 22 and 23 is formed along the inside of the contact hole 21. Reference numeral 24 designates a silicon dioxide layer which is an insulating layer formed on the third insulating layer 20; and 25 designates a contact hole formed in the insulating layer 24 and the third insulating layer 20 to such an extent as to reach the low impurity-concentration region 10. A first recess 52 is formed in the area of the second low impurity-concentration region 10 where the opening of the contact hole 25 is formed, and an impurity region 53 of the n-type (or the second conductivity type) is formed below the first recess 52. A storage node 26 which is a lower electrode of a capacitor is formed within the contact hole 25 and the first recess 52. A dielectric film 27 of the capacitor is formed on the storage node 26, and a cell plate 28 which is an upper electrode of the capacitor is further formed on the dielectric film 27. A capacitor 92 is formed from the lower electrode 26, the dielectric film 27, and the upper electrode 28.

With reference to FIGS. 46 to 50, a method of manufacturing the semiconductor device mentioned above will be described.

FIGS. 46 through 50 are cross-sectional views showing the first through fifth steps in the process for manufacturing the semiconductor device in FIG. 45.

Figure 46:
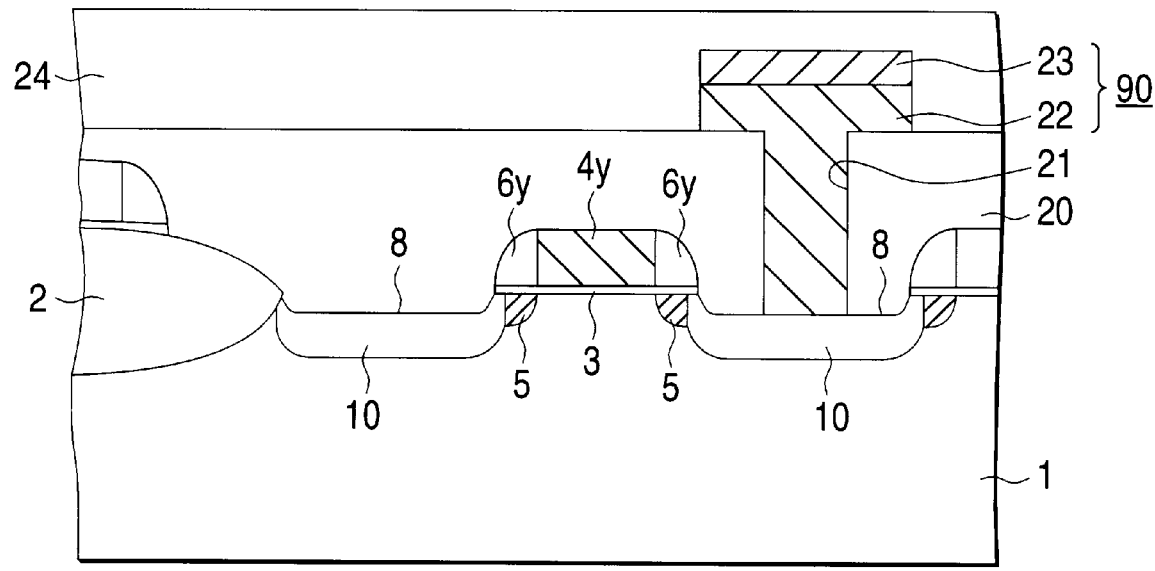
FIG. 46 is a cross-sectional view showing the first step of the process for manufacturing the semiconductor device in accordance with the ninth embodiment.

First, with reference to FIG. 46, the isolation field oxide film 2, an unillustrated well of the p-type (or the first conductivity type), the gate oxide film 3 which serves as the first insulating layer 1, the gate electrode 4y, the first impurity region 5 of the n-type (or the second conductivity type), and the side wall insulating material 6y are formed on the surface of the silicon substrate 1 (which is a semiconductor substrate) through the same steps as those employed in the first embodiment. The second recess 8 is formed on the first low impurity-concentration region 5 with the exception of the area immediately below the side wall insulating material 6y, and the second n-type low impurity-concentration region 10 is formed below the recess 8. A silicon dioxide film 20 is formed over the entire surface of the silicon substrate 1 to a thickness of about 7000 A by CVD. A contact hole 21 is then formed in this silicon dioxide film 20 to such an extent as to reach the second low impurity-concentration region 10. Impurity-containing polysilicon is deposited on the silicon dioxide film 20 to a thickness of about 800 A by CVD, and tungsten silicide (WSi) is deposited on the polysilicon to a thickness of about 700 A by CVD. This substrate is then subjected to photolithography and etching through use of a resist. As a result, the bit line 90 consisting of the impurity-containing polysilicon layer pattern 22 and the tungsten silicide layer pattern 23 is formed in the contact hole 21 so as to be electrically connected to the second low impurity-concentration region 10. A silicon dioxide film 24 is then formed to a thickness of about 7000 A on the silicon dioxide film 20 and the bit line 90 by CVD.

Figure 47:
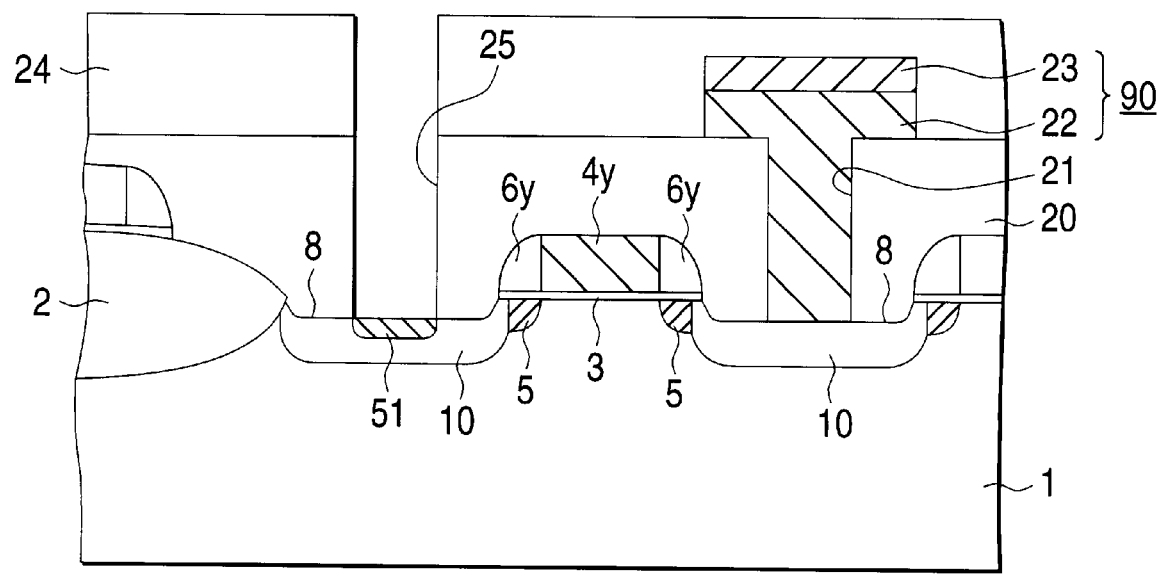
FIG. 47 is a cross-sectional view showing the second step of the process for manufacturing the semiconductor device in accordance with the ninth embodiment.
Figure 48:
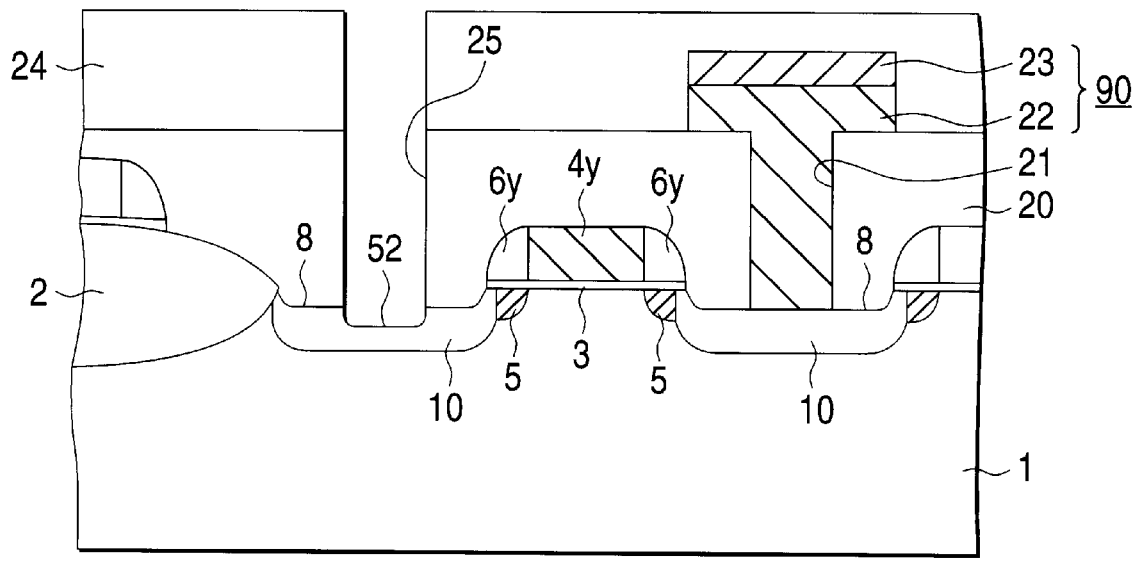
FIG. 48 is a cross-sectional view showing the third step of the process for manufacturing the semiconductor device in accordance with the ninth embodiment.
Figure 49:
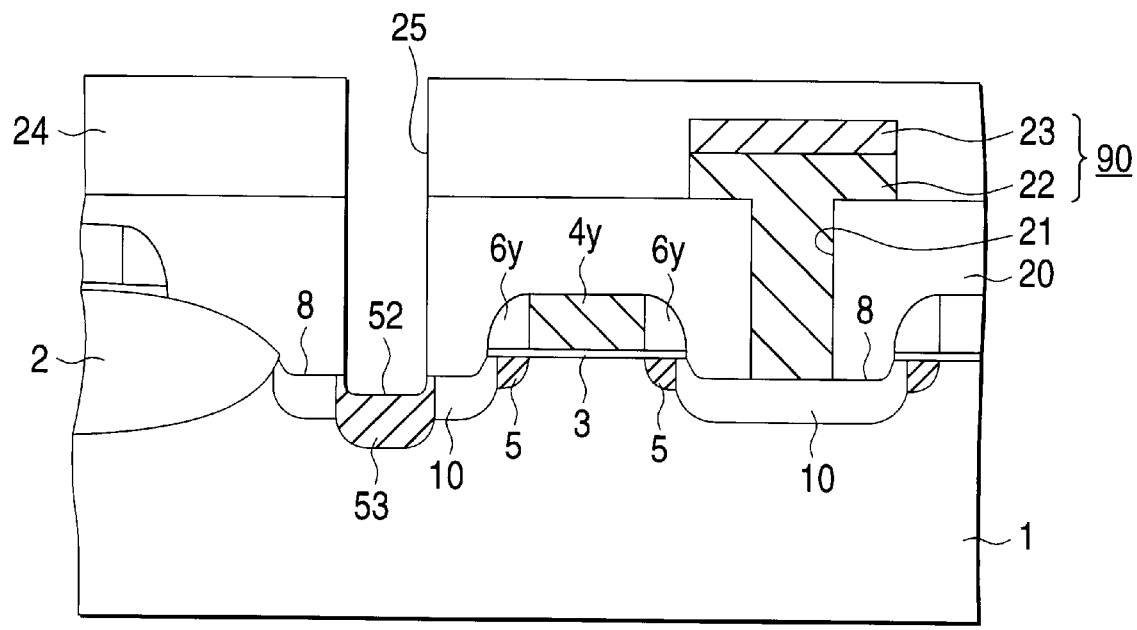
FIG. 49 is a cross-sectional view showing the fourth step of the process for manufacturing the semiconductor device in accordance with the ninth embodiment.

As shown in FIG. 47, the contact hole 25 is formed in the silicon dioxide films 24 and 20 to such an extent as to reach the second low impurity-concentration region 10. If the surface of the silicon substrate 1 is exposed to the etching gas during the course of the formation of the contact hole 25, a damaged layer 51 is formed in the area of the second low impurity-concentration region 10 where the opening of the contact hole 25 is formed. With reference to FIG. 48, this damaged layer 51 is removed by CDE, so that a first recess 52 is formed to have a depth of about 500 A in the area of the second low impurity-concentration region 10 where the opening of the contact hole 25 is formed. Subsequently, as shown in FIG. 49, phosphorous (P) ions are implanted into the first recess 52 at 150 keV with a dose of $5\times10^{13}/\text{cm}^2$ using the silicon dioxide film 24 as a mask, whereby an n-type impurity region 53 is formed below the first recess 52.

Figure 50:
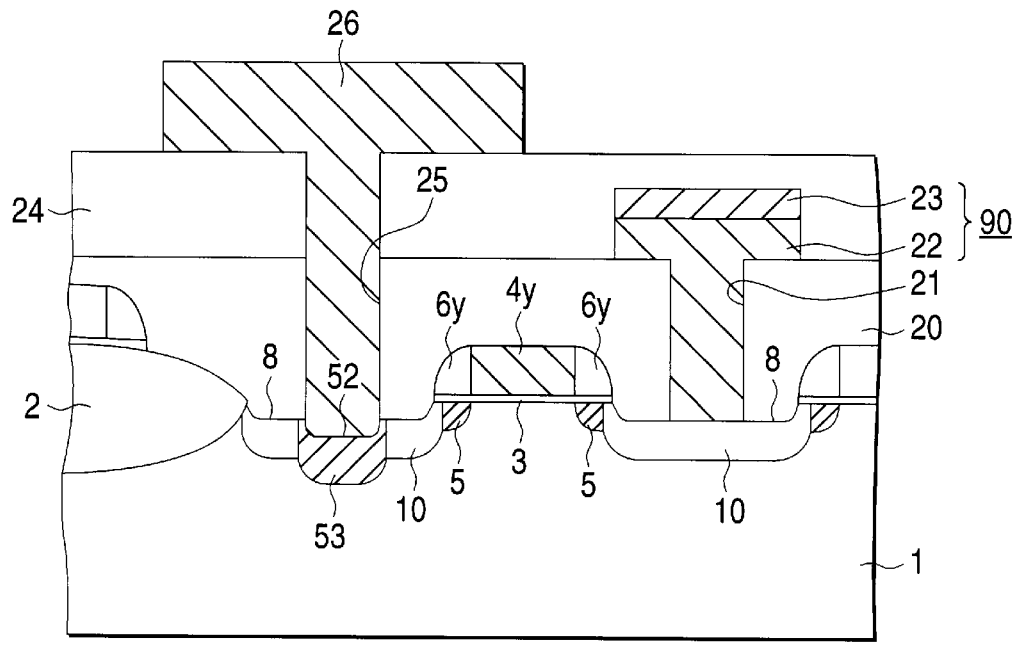
FIG. 50 is a cross-sectional view showing the fifth step of the process for manufacturing the semiconductor device in accordance with the ninth embodiment.

Subsequently, impurity-containing polysilicon is then deposited on the silicon dioxide film 24 to a thickness of about 8000 A. This substrate is then subjected to photolithography and etching through use of a resist. As shown in FIG. 50, the storage node 26 which is electrically connected to the low impurity-concentration region 10 is formed in the contact hole 25 and the first recess 52. The silicon oxynitride (SiON) layer 27 which is a dielectric film of the capacitor is formed to a thickness of about 70 A on the storage node 26 by CVD, and the impurity-containing polysilicon layer 28 which is a cell plate is further formed to a thickness of about 500 A on the silicon oxynitride layer 27. In the end, the semiconductor device shown in FIG. 45 is fabricated. It goes without saying that there are further required steps to create inter-layer insulating films, contact holes, and conductor routing in order to fabricate the thus-formed semiconductor device into an LSI element.

As described above, the semiconductor device and its manufacturing method in accordance with the ninth embodiment yield the following effects in addition to the effects obtained in the third embodiment. More specifically, the damaged layer 51 formed on the surface of the second low impurity-concentration region 10 during the formation of the contact hole 25 is removed by forming the first recess 52 in the area of the second low impurity-concentration region 10 where the opening of the contact hole 25 to be used for a storage node is formed. As a result, the leakage current developing in a lower part of the storage node in the vicinity of the junction between the silicon substrate 1 and the second low impurity-concentration region 10 is reduced, so that the superior characteristics of the junction are obtained. The electric charges stored in the capacitor are not discharged to the outside, and hence the refreshing characteristics of the semiconductor device are improved. Further, the characteristics of the junction between the silicon substrate 1 and the second low impurity-concentration region 10 which acts as an insulator when reverse bias is applied are improved. In addition, the impurity region 53 that is the same in conductivity type as the first low impurity-concentration region 5 is formed below the first recess 52, so that an increase in the resistance of the source/drain region which would otherwise be caused by the removal of the damaged layer 51 can be prevented. Therefore, the characteristics of the contact on the storage node can be improved, and DRAM which requires reduced power consumption and operates fast and stable can be achieved.

The characteristics of the junction between the source/drain region, the impurity region consisting of the impurity region 53, and the silicon substrate 1, and the electrical resistance of the impurity region are determined by second low impurity-concentration region 10 and the impurity region 53. Accordingly, there are prevented variations in the etch rate required for removal of the damaged layers 7 and 51 which would otherwise cause variations in the characteristics of the junction between the source/drain region and the silicon substrate 1 or in the electrical resistance of the source/drain region, so a reduction in the manufacturing yield of the semiconductor device can be prevented to a much greater extent.

Although the explanation provided in the ninth embodiment has been given of the case where the first recess 52 is formed at a depth of about 500 A in the area of the second low impurity-concentration region 10 where the opening of the contact hole 25 to be used for a storage node is formed, the depth ranging from 0.03 μm to 0.1 μm is sufficient for the first recess 52. If this is the case, there are ensured the same driving capability and punch-through withstand voltage as those of the semiconductor device without a recess, and therefore the same effects as those obtained in the previous embodiments will be ensured.

Although the explanation provided in the ninth embodiment has been given of the case where the p-type well and the n-type source/drain region are formed on the silicon substrate, and where the n-type impurity region is formed below the first recess 52 and the second recess 8, an impurity region of the p-type may be formed below the first recess 52 and the second recess 8 on the silicon substrate having an n-type well and a p-type first low impurity-concentration region. Even in this case, the same effects as those obtained in the previous embodiments will be ensured.

Tenth Embodiment

In a tenth embodiment of the present invention, the p-type well was formed as a retrograde type well in the silicon substrate 1 of the ninth embodiment by implanting boron (B) ions into the silicon substrate 1 under the three conditions; namely, at 700 keV with a dose of $1\times10^{13}/cm^2$, 100 keV with a dose of $3\times10^{12}/cm^2$, and 50 keV with a dose of $5\times10^{12}/cm^2$. In other respects, the tenth embodiment is the same in structure and manufacture as the ninth embodiment shown in FIGS. 45 to 50. The second low impurity-concentration region 10 is formed below the second recess 8 by implanting arsenic (As) ions at 50 keV with a dose of $5\times10^{13}/cm^2$. Further, the n-type impurity region 53 is formed below the first recess 52 by implanting phosphorous (P) ions at 150 keV with a dose of $5\times10^{13}/cm^2$.

As described above, the semiconductor device and the method of manufacturing it in accordance with the eighth embodiment yield the following effects in addition to the effects obtained in the ninth embodiment. More specifically, as has been described in the sixth embodiment with reference to FIGS. 33 and 34, the concentration of impurities in the p-n junction between the impurity region 53 and the p-type well can be substantially minimized. Therefore, the intensity of the electric field in the p-n junction can be also substantially minimized. As a result, the withstand voltage of the junction can be increased, and the leakage current developing in the junction can be reduced.

Although the explanation provided in the tenth embodiment has been given of the case where the first recess 52 is formed at a depth of about 500 A in the area of the second low impurity-concentration region 10 where the opening of the contact hole 25 to be used for a storage node is formed, the depth ranging from 0.03 μm to 0.1 μm is sufficient for the first recess 52. If this is the case, there are ensured the same driving capability and punch-through withstand voltage as those of the semiconductor device without a recess, and therefore the same effects as those obtained in the previous embodiments will be ensured.

Although the explanation provided in the tenth embodiment has been given of the case where the p-type well and the n-type source/drain region are formed on the silicon substrate, and where the n-type impurity region is formed below the first recess 52 and the second recess 8, an impurity region of the p-type may be formed below the first recess 52 and the second recess 8 on the silicon substrate having an n-type well and a p-type source/drain region. Even in this case, the same effects as those obtained in the previous embodiments will be ensured.

Eleventh Embodiment

With reference to FIGS. 51 through 60, an eleventh embodiment of the present invention will be described.

Figure 51:
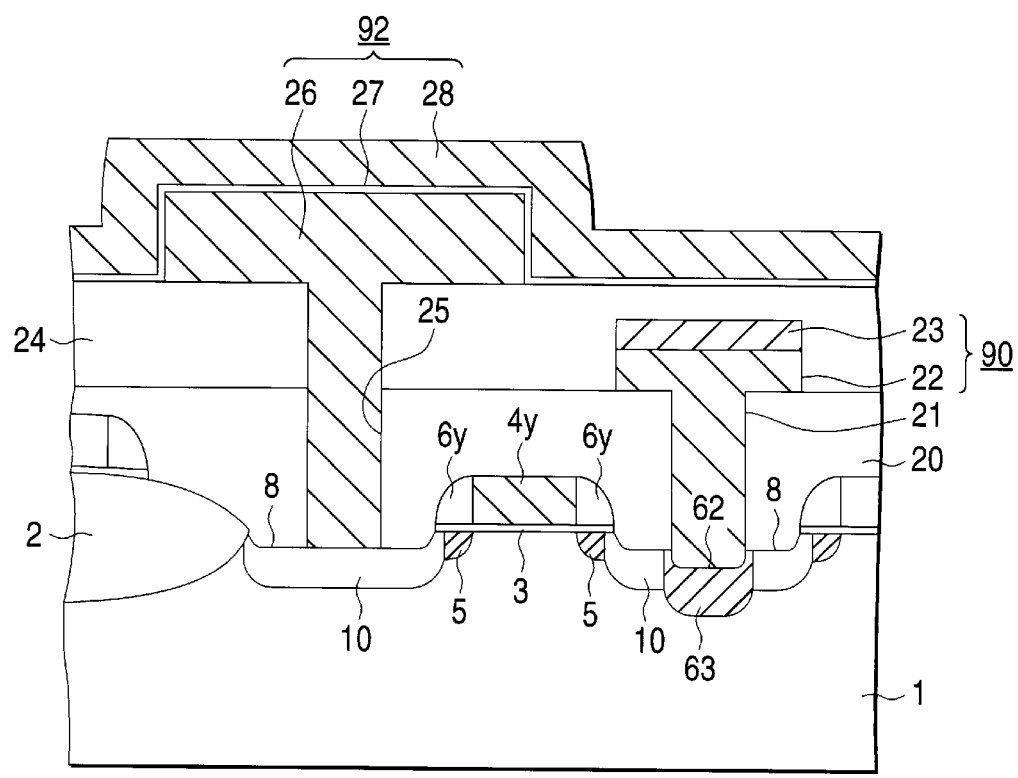
FIG. 51 is a cross-sectional view showing a semiconductor device in accordance with an eleventh embodiment of the present invention.

FIG. 51 is a cross-sectional view showing a semiconductor device in accordance with the eleventh embodiment of the present invention.

With reference to FIG. 51, reference numeral 1 designates a silicon substrate which is a semiconductor substrate and has a p-type well (not shown) of the first conductivity type; 2 designates an isolation field oxide film formed on the surface of the silicon substrate 1; 3 designates a gate oxide film which is a first insulating layer and is formed on the principal surface of the silicon substrate 1; and 4y designates a gate electrode formed on the gate oxide film 3. Reference numeral 5 designates a first low impurity-concentration region of the n-type (or the second conductivity type) which is formed on the surface of the silicon substrate 1 while a channel region (not shown) sandwiched between them. Side wall insulating material 6y is formed on each side of the gate electrode 4y. A second recess 8 is formed on the first low impurity-concentration region 5 with the exception of the area immediately below the side wall insulating material 6y. A second low impurity-concentration region 10 of the n-type is formed below the second recess 8. The first low impurity-concentration region 5 and the second low impurity-concentration region 10 constitute the source/drain region.

Reference numeral 20 designates a silicon dioxide film which is formed on the silicon substrate 1 and serves as a third insulating layer; and 21 designates a contact hole formed in the silicon dioxide film 20 to such an extent as to reach the second low impurity-concentration region 10. A first recess 62 is formed in the area of the second low impurity-concentration region 10 where the opening of the contact hole 21 is formed, and an impurity region 63 of the n-type (or the second conductivity type) is formed below the first recess 62. A bit line 90 which is a conductor routing and consists of two conductive layers 22 and 23 is formed along the inside of the contact hole 21. Reference numeral 24 designates a silicon dioxide layer which is an insulating layer formed on the third insulating layer 20; and 25 designates a contact hole formed in the insulating layer 24 and the third insulating layer 20 to such an extent as to reach the second low impurity-concentration region 10. A storage node 26 which is a lower electrode of a capacitor is formed within the contact hole 25 and the first recess 62. A dielectric film 27 of the capacitor is formed on the storage node 26, and a cell plate 28 which is an upper electrode of the capacitor is further formed on the dielectric film 27. A capacitor 92 is formed from the lower electrode 26, the dielectric film 27, and the upper electrode 28.

With reference to FIGS. 52 to 60, a method of manufacturing the semiconductor device mentioned above will be described.

FIGS. 52 through 60 are cross-sectional views showing the first through ninth steps in the process for manufacturing the semiconductor device in FIG. 51.

Figure 52:
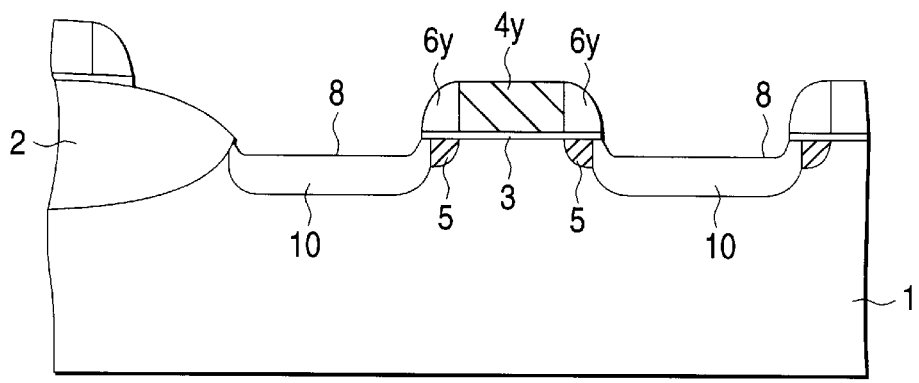
FIG. 52 is a cross-sectional view showing the first step of the process for manufacturing the semiconductor device in accordance with the eleventh embodiment.

First, with reference to FIG. 52, the isolation field oxide film 2, an unillustrated well of the p-type (or the first conductivity type), the gate oxide film 3 which serves as the first insulating layer 1, the gate electrode 4y, the first impurity region 5 of the n-type (or the second conductivity type), and the side wall insulating material 6y are formed on the surface of the silicon substrate 1 (which is a semiconductor substrate) through the same steps as those employed in the first embodiment. The second recess 8 is formed on the first low impurity-concentration region 5 with the exception of the area immediately below the side wall insulating material 6y, and the second n-type low impurity-concentration region 10 is formed below the recess 8.

Figure 53:
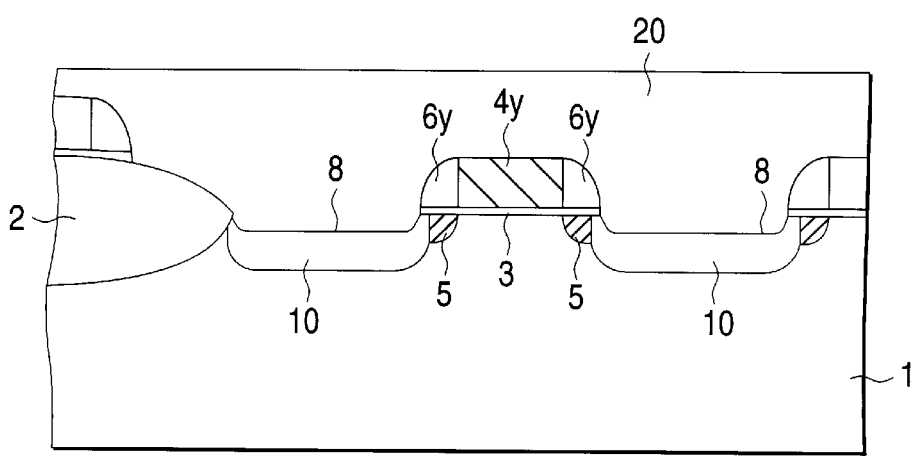
FIG. 53 is a cross-sectional view showing the second step of the process for manufacturing the semiconductor device in accordance with the eleventh embodiment.
Figure 54:
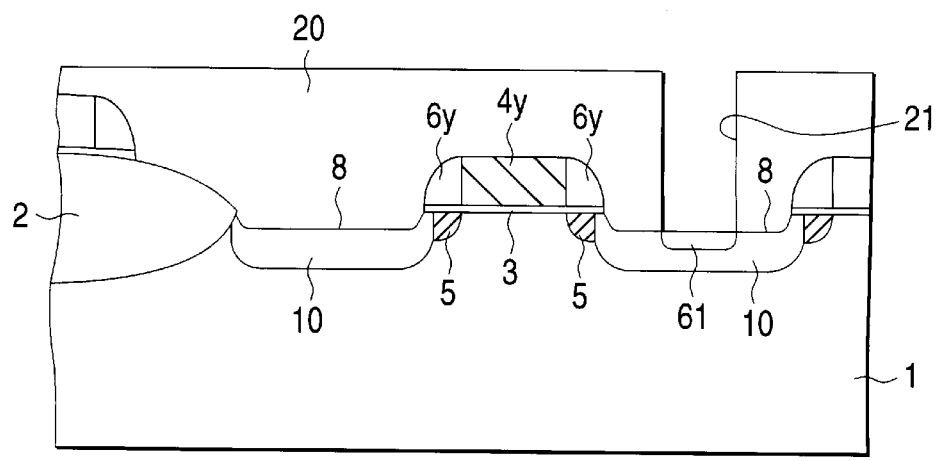
FIG. 54 is a cross-sectional view showing the third step of the process for manufacturing the semiconductor device in accordance with the eleventh embodiment.
Figure 55:
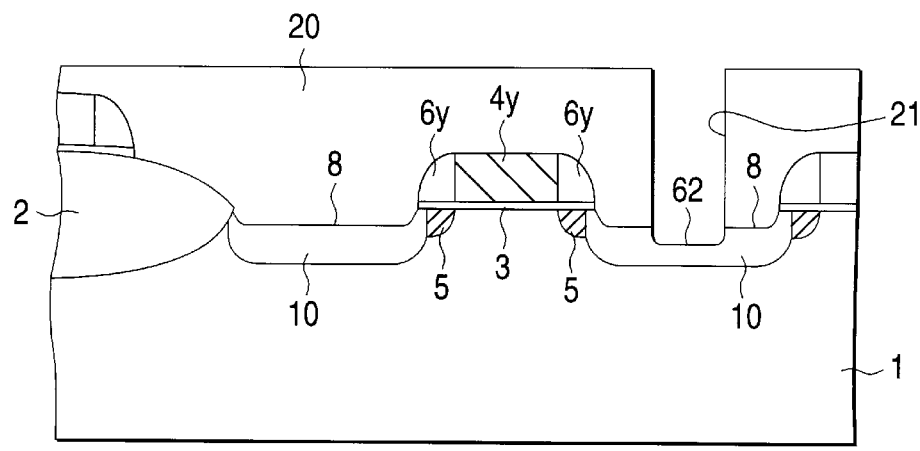
FIG. 55 is a cross-sectional view showing the fourth step of the process for manufacturing the semiconductor device in accordance with the eleventh embodiment.
Figure 56:
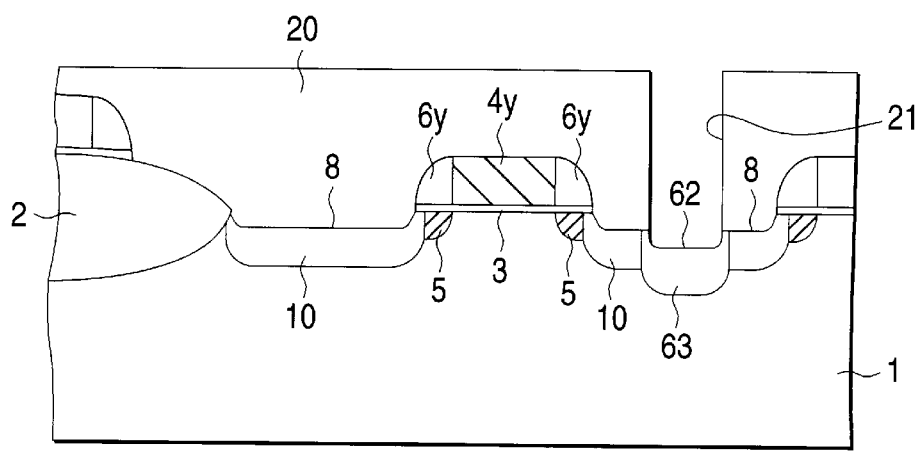
FIG. 56 is a cross-sectional view showing the fifth step of the process for manufacturing the semiconductor device in accordance with the eleventh embodiment.

In reference to FIG. 53, a silicon dioxide film 20 is formed over the entire surface of the silicon substrate 1 to a thickness of about 7000 A by CVD. As shown in FIG. 54, the contact hole 21 is then formed in this silicon dioxide film 20 to such an extent as to reach the second low impurity-concentration region 10. If the surface of the silicon substrate 1 is exposed to the etching gas during the course of the formation of the contact hole 21, a damaged layer 61 is formed in the area of the second low impurity-concentration region 10 where the opening of the contact hole 21 is formed. With reference to FIG. 55, this damaged layer 61 is removed by CDE, so that a first recess 62 is formed to have a depth of about 500 A in the area of the second low impurity-concentration region 10 where the opening of the contact hole 21 is formed. Subsequently, as shown in FIG. 56, phosphorous (P) ions are implanted into the first recess 62 at 150 keV with a dose of $5 \times 10^{13}/cm^2$ using the silicon dioxide film 21 as a mask, whereby an n-type impurity region 63 is formed below the first recess 62.

Figure 57:
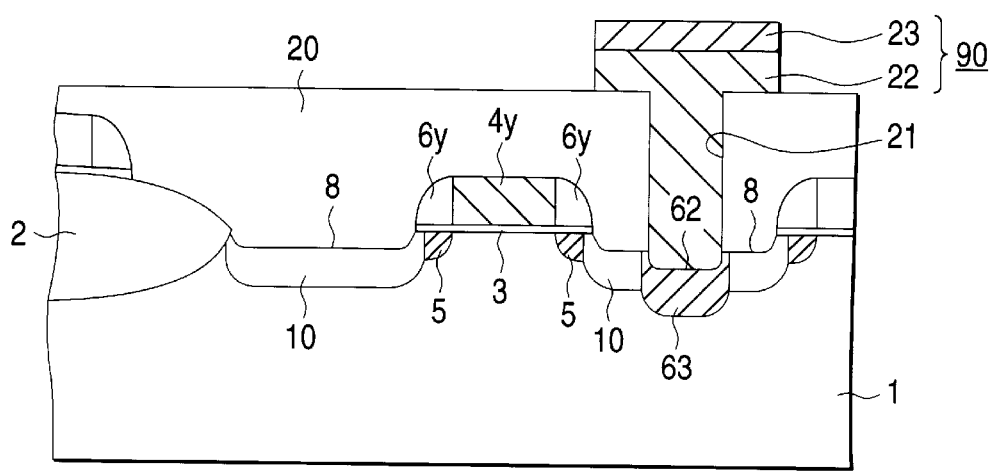
FIG. 57 is a cross-sectional view showing the sixth step of the process for manufacturing the semiconductor device in accordance with the eleventh embodiment.

Impurity-containing polysilicon is deposited on the silicon dioxide film 20 to a thickness of about 800 A by CVD, and tungsten silicide (WSi) is deposited on the polysilicon to a thickness of about 700 A by CVD. This substrate is then subjected to photolithography and etching through use of a resist. As a result, as shown in FIG. 57, the bit line 90 consisting of the impurity-containing polysilicon layer pattern 22 and the tungsten silicide layer pattern 23 is formed in the contact hole 21 so as to be electrically connected to the second low impurity-concentration region 10.

Figure 58:
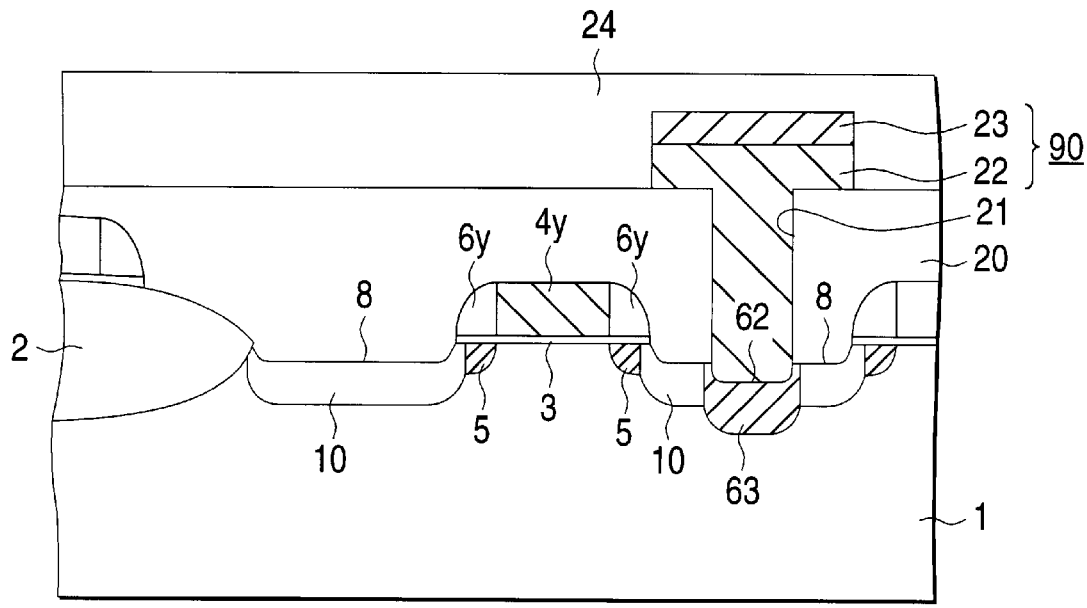
FIG. 58 is a cross-sectional view showing the seventh step of the process for manufacturing the semiconductor device in accordance with the eleventh embodiment.
Figure 59:
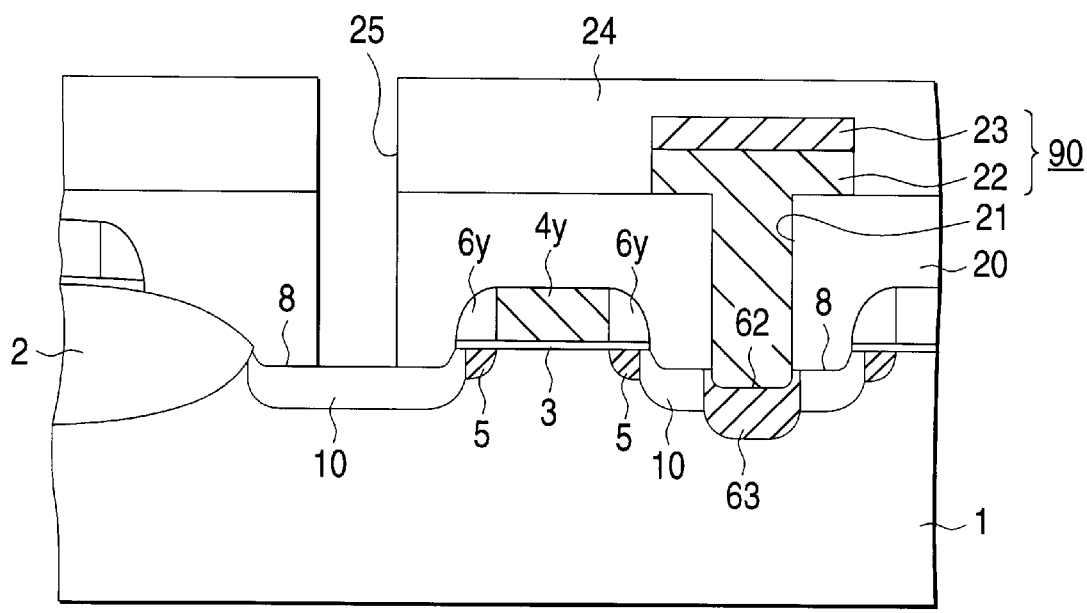
FIG. 59 is a cross-sectional view showing the eighth step of the process for manufacturing the semiconductor device in accordance with the eleventh embodiment.

In reference to FIG. 58, a silicon dioxide film 24 is then formed to a thickness of about 7000 A on the silicon dioxide film 20 and the bit line 90 by CVD. As shown in FIG. 59, the contact hole 25 is formed in the silicon dioxide films 24 and 20 to such an extent as to reach the second low impurity-concentration region 10. Subsequently, impurity-containing polysilicon is then deposited on the silicon dioxide film 24 to a thickness of about 8000 A. This substrate is then subjected to photolithography and etching through use of a resist. As shown in FIG. 60, the storage node 26 which is electrically connected to the second low impurity-concentration region 10 is formed in the contact hole 25. The silicon oxynitride (SiON) layer 27 which is a dielectric film of the capacitor is formed to a thickness of about 70 A on the storage node 26 by CVD, and the impurity-containing polysilicon layer 28 which is a cell plate is further formed to a thickness of about 500 A on the silicon oxynitride layer 27. In the end, the semiconductor device shown in FIG. 51 is fabricated. It goes without saying that there are further required steps to create inter-layer insulating films, contact holes, and conductor routing in order to fabricate the thus-formed semiconductor device into an LSI element.

As described above, the semiconductor device and its manufacturing method in accordance with the eleventh embodiment yield the following effects in addition to the effects obtained in the third embodiment. More specifically, the damaged layer 61 formed on the surface of the second low impurity-concentration region 10 during the formation of the contact hole 21 is removed by forming the first recess 62 in the area of the second low impurity-concentration region 10 where the opening of the contact hole 21 to be used as a bit line is formed. As a result, the leakage current developing in a lower part of the bit line in the vicinity of the junction between the silicon substrate 1 and the second low impurity-concentration region 10 is reduced, so that the superior characteristics of the junction are obtained. Further, the characteristics of the junction between the silicon substrate 1 and the second low impurity-concentration region 10 which acts as an insulator when reverse bias is applied are improved. In addition, the impurity region 63 that is the same in conductivity type as the first low impurity-concentration region 5 is formed below the first recess 62, so that an increase in the resistance of the second low impurity-concentration region 10 which would otherwise be caused by the removal of the damaged layer 61 can be prevented. Therefore, the characteristics of the contact on the bit line can be improved, and DRAM which requires reduced power consumption and operates fast and stable can be achieved.

The characteristics of the junction between the source/drain region, the impurity region consisting of the impurity region 63, and the silicon substrate 1, and the electrical resistance of the impurity region are determined by second low impurity-concentration region 10 and the impurity region 63. Accordingly, there are prevented variations in the etch rate required for removal of the damaged layers 7 and 61 which would otherwise cause variations in the characteristics of the junction between the source/drain region 5 and the silicon substrate 1 or in the electrical resistance of the source/drain region, so a reduction in the manufacturing yield of the semiconductor device can be prevented to a much greater extent.

Although the explanation provided in the eleventh embodiment has been given of the case where the first recess 62 is formed at a depth of about 500 A in the area of the second low impurity-concentration region 10 where the opening of the contact hole 21 to be used as a bit line is formed, the depth ranging from 0.03 μm to 0.1 μm is sufficient for the first recess 62. If this is the case, there are ensured the same driving capability and punch-through withstand voltage as those of the semiconductor device without a recess, and therefore the same effects as those obtained in the previous embodiments will be ensured.

Although the explanation provided in the eleventh embodiment has been given of the case where the p-type well and the n-type source/drain region are formed on the silicon substrate, and where the n-type impurity region is formed below the first recess 62 and the second recess 8, an impurity region of the p-type may be formed below the first recess 62 and the second recess 8 on the silicon substrate having an n-type well and a p-type first low impurity-concentration region. Even in this case, the same effects as those obtained in the previous embodiments will be ensured.

Twelfth Embodiment

In a twelfth embodiment of the present invention, the p-type well was formed as a retrograde type well in the silicon substrate 1 of the eleventh embodiment by implanting boron (B) ions into the silicon substrate 1 under the three conditions; namely, at 700 keV with a dose of $1 \times 10^{13}/cm^2$, 100 keV with a dose of $3 \times 10^{12}/cm^2$, and 50 keV with a dose of $5 \times 10^{12}/cm^2$. In other respects, the twelfth embodiment is the same in structure and manufacture as the eleventh embodiment shown in FIGS. 51 to 60. The second low impurity-concentration region 10 is formed below the second recess 8 by implanting arsenic (As) ions at 50 keV with a dose of $5 \times 10^{13}/cm^2$. Further, the n-type impurity region 63 is formed below the first recess 62 by implanting phosphorous (P) ions at 150 keV with a dose of $5 \times 10^{13}/cm^2$.

As described above, the semiconductor device and the method of manufacturing it in accordance with the twelfth embodiment yield the following effects in addition to the effects obtained in the eleventh embodiment. More specifically, as has been described in the sixth embodiment with reference to FIGS. 33 and 34, the concentration of impurities in the p-n junction between the impurity region 63 and the p-type well can be substantially minimized. Therefore, the intensity of the electric field in the p-n junction can be also substantially minimized. As a result, the withstand voltage of the junction can be increased, and the leakage current developing in the junction can be reduced.

Although the explanation provided in the twelfth embodiment has been given of the case where the first recess 62 is formed at a depth of about 500 A in the area of the second low impurity-concentration region 10 where the opening of the contact hole 21 to be used a bit line is formed, the depth ranging from 0.03 μm to 0.1 μm is sufficient for the first recess 62. If this is the case, there are ensured the same driving capability and punch-through withstand voltage as those of the semiconductor device without a recess, and therefore the same effects as those obtained in the previous embodiments will be ensured.

Although the explanation provided in the twelfth embodiment has been given of the case where the p-type well and the n-type source/drain region are formed on the silicon substrate, and where the n-type impurity region is formed below the first recess 62 and the second recess 8, an impurity region of the p-type may be formed below the first recess 62 and the second recess 8 on the silicon substrate having an n-type well and a p-type first low impurity-concentration region. Even in this case, the same effects as those obtained in the previous embodiments will be ensured.

Thirteenth Embodiment

Although the explanation has been given of the case where the capacitor 92 is formed in the contact hole 25 and on the silicon dioxide film 24 in the third embodiment and in the fifth to twelfth embodiments, the contact hole 25 may be filled with impurity-containing polysilicon, and conductor routing which is electrically connected to the polysilicon layer and consists of aluminum may be laid on the silicon dioxide film 24. In this case, the leakage current developing in the junction between the silicon substrate 1 and the source/drain region is reduced, so that the superior characteristics of the junction are obtained. Further, the characteristics of the junction between the silicon substrate 1 and the source/drain region which acts as an insulator when reverse bias is applied are improved. Consequently, it is possible to accomplish a highly-integrated logic device which reduces power consumption by reducing the leakage current developing in the junction; which prevents an increase in the resistance in the source/drain region; and which stably operates at a high speed.

The semiconductor device and its manufacturing method in accordance with the present invention have the previously-described construction and steps and yield the following effects.

In accordance with the first aspect of the invention, a recess is formed on the first low impurity-concentration region with the exception of the area immediately below the side wall insulating material in order to remove the layer damaged as a result of the formation of the side wall material. Further, the second low impurity-concentration region which is the same in conductivity type as that of the first low impurity-concentration region is formed below the recess. Accordingly, the leakage current developing in the junction between the silicon substrate and the source/drain region is reduced, so that the superior characteristics of the junction are obtained. Consequently, it is possible to accomplish a semiconductor device which prevents an increase in the resistance in the source/drain region, and which stably operates at a high speed. Further, there are prevented variations in the characteristics of the junction between the source/drain region and the silicon substrate or in the electrical resistance of the source/drain region, so that a reduction in the manufacturing yield of the semiconductor device can be prevented.

In accordance with the second to fifth aspect of the invention, it is possible to accomplish a semiconductor device which prevents an increase in the resistance in the source/drain region more effectively. In accordance with sixth and tenth aspect of the invention, the source region or the drain region is free from the layer damaged as a result of formation of the side wall insulating material, and hence the leakage current developing in the junction between the semiconductor substrate and the source/drain region is further reduced, so that the superior characteristics of the junction are obtained. Therefore, a semiconductor device which operates further stapler can be accomplished.

In accordance with the seventh aspect of the invention, since the depth of the recess from the principal surface of the semiconductor substrate is set to the range from 0.03 μm to 0.1 µm, there are ensured the same driving capability and punch-through withstand voltage as those of the semiconductor device without a recess.

In accordance with the eighth, ninth and fourteenth aspect of the invention, a high impurity region which has a higher impurity concentration than that of the first low impurity-concentration region and is the same in conductivity type as that of the first low impurity-concentration region is formed in the source or drain region at a shallow depth close to the principal surface of the semiconductor substrate in comparison with the second low impurity-concentration region. As a result, the leakage current developing in the junction between the semiconductor substrate and the source/drain region is reduced further, so that much superior characteristics of the junction are obtained. Further, it is possible to accomplish a semiconductor device which prevents an increase in the resistance in the source/drain region, and which stably operates at a high speed. There are prevented variations in the characteristics of the junction between the source/drain region and the silicon substrate or in the electrical resistance of the source/drain region, so that a reduction in the manufacturing yield of the semiconductor device can be prevented to a much greater extent. In addition, the concentration of impurities can be gradually reduced from the principal surface of the semiconductor substrate, whereby the electric field in the junction between the silicon substrate and the source/drain region can be mitigated.

In accordance with the eleventh aspect of the present invention, a first recess is formed in the area of the source/drain region where the opening of an electrode or a wiring hole is formed, and an impurity region which is the same in conductivity type as that of the first low impurity-concentration region is formed below the first recess. As a result, the characteristics of the junction between the source/drain region and the semiconductor substrate in the vicinity of a lower part of the electrode or the conductor routing can be improved, and a semiconductor device which operates fast and stably can be implemented.

In accordance with the twelfth and seventeenth aspect of the invention, a second recess is formed on the source or drain region with the exception of the area immediately below the side wall material. A second low impurity-concentration region which is the same in conductivity type as that of the first low impurity-concentration region is formed below the second recess. As a result, the characteristics of the junction between the source/drain region and the semiconductor substrate in the vicinity of a lower part of the electrode or the conductor routing can be improved further, and a semiconductor device which operates faster and stapler can be implemented. There are prevented variations in the characteristics of the junction between the source/drain region and the silicon substrate or in the electrical resistance of the source/drain region, so that a reduction in the manufacturing yield of the semiconductor device can be prevented.

What is claimed is:

1. A semiconductor device comprising:
    a gate electrode which is formed on the principal surface of a semiconductor substrate having a semiconductor region of a first conductivity type on which an insulating layer is formed;
    side wall insulating material formed on the side of the gate electrode;
    first low impurity-concentration regions of a second conductivity type which are formed on the principal surface of the semiconductor substrate to a first depth with a channel region formed between them;
    a recess formed on at least one of the first low impurity-concentration regions with the exception of the area immediately below the side wall insulating material in order to remove a damaged layer formed at the time of formation of the side wall insulating material, the recess having a second depth less than the first depth below the principal surface; and
    a second low impurity-concentration region of the second conductivity type formed below the recess.

2. The semiconductor device as defined in claim 1, wherein the second low impurity-concentration region of the second conductivity type is formed in such a way that the inner edge of the second low impurity-concentration region substantially agrees with the outer edge of the side wall insulating material.

3. The semiconductor device as defined in claim 1, wherein the second low impurity-concentration region of the second conductivity type is formed so as to extend over the whole surface of the recess.

4. The semiconductor device as defined in claim 3, wherein the second low impurity-concentration region of the second conductivity type is formed in such a way that the peak of concentration is formed at a position slightly deeper than the surface of the recess.

5. The semiconductor device as defined in claim 1, wherein the second low impurity-concentration region of the second conductivity type is formed deeper than the first low impurity-concentration region.

6. The semiconductor device as defined in claim 1, wherein the depth of the recess formed on the surface of at least one of the first low impurity-concentration regions is equal to or greater than the depth of the damaged layer formed at the time of formation of the side wall insulating material.

7. The semiconductor device as defined in claim 1, wherein the depth of the recess from the principal surface of the semiconductor substrate should be in the range from 0.03 µm to 0.1 µm.

8. The semiconductor device as defined in claim 1, further comprising a high impurity-concentration region of the second conductivity type having a higher concentration of impurities than that of the first low impurity-concentration regions each of which is formed at a shallow position closer to the principal surface of the semiconductor substrate in comparison with the second low impurity-concentration region.

9. The semiconductor device as defined in claim 8, wherein the high impurity-concentration region should be formed in such a way that the peak of concentration is formed at a position slightly deeper than the surface of the recess.

10. The semiconductor device as defined in claim 1, wherein the semiconductor device is formed in a well of the first conductivity type which is formed such that at least two peaks of impurity concentrations are formed in the depthwise direction, and the bottom of the second low impurity-concentration region is positioned at the valley between the adjacent two peaks.

11. A semiconductor device comprising:
    a gate electrode formed on a part of the principal surface of a semiconductor substrate having a semiconductor region of a first conductivity type on which a first insulating layer is formed;
    side wall insulating material formed from a second insulating layer on the side of the gate electrode;
    first low impurity-concentration regions of a second conductivity type formed on the principal surface of the semiconductor substrate to a first depth with a channel region sandwiched between them;

a third insulating layer formed on at least one of the first low impurity-concentration regions and having a contact hole formed to such an extent as to reach the first low impurity-concentration region;

an electrode or conductor routing formed along the inside of the contact hole formed in the third insulating layer and electrically connected to the first low impurity-concentration region, wherein the first low impurity-concentration region comprises a first recess having a second depth less than the first depth below the principal surface for removing a damaged layer formed at the time of formation of the contact hole, which recess is formed in the area where the first low impurity-concentration region is connected to the electrode or conductor routing; and a second low impurity-concentration region of the second conductivity type formed below the recess.

12. The semiconductor device as defined in claim 11, further comprising:

a second recess formed on the first low impurity-concentration region of the second conductivity type with the exception of the area immediately below the side wall insulating material in order to remove a damaged layer formed at the time of formation of the side wall insulating material; and a third low impurity-concentration region of the second conductivity type formed below the second recess.

13. The semiconductor device as claimed in claim 11, wherein the second low impurity-concentration region of the second conductivity type is formed in such a way that the inner edge of the second low impurity-concentration region substantially agrees with the outer edge of the side wall insulating material.

14. The semiconductor device as claimed in claim 11, wherein the second low impurity-concentration region of the second conductivity type is formed so as to extend over the whole surface of the recess.

15. The semiconductor device as claimed in claim 14, wherein the second low impurity-concentration region of the second conductivity type is formed in such a way that the peak of concentration is formed at a position slightly deeper than the surface of the recess.

16. The semiconductor device as claimed in claim 11, wherein the second low impurity-concentration region of the second conductivity type is formed deeper than the first low impurity-concentration region.

17. The semiconductor device is claimed in claim 11, wherein the depth of the recess formed on the surface of at least one of the first low impurity-concentration regions is equal to or greater than the depth of the damaged layer formed at the time of formation of the side wall insulating material.

18. The semiconductor device as claimed in claim 11, wherein the depth of the recess from the principal surface of the semiconductor substrate is in the range from 0.03 $\mu$m to 0.1 $\mu$m.

19. The semiconductor device as claimed in claim 11, further comprising a high impurity-concentration region of the second conductivity type having a higher concentration of impurities than that of the first low impurity-concentration regions each of which is formed at a shallow position closer to the principal surface of the semiconductor substrate than the second low impurity-concentration region.

20. The semiconductor device as claimed in claim 19, wherein the high impurity-concentration region is formed in such a way that the peak of concentration is formed at a position slightly deeper than the surface of the recess.

* * * * *